United States Patent
Agranov et al.

(10) Patent No.: US 12,185,018 B2
(45) Date of Patent: Dec. 31, 2024

(54) STACKED ELECTROMAGNETIC RADIATION SENSORS FOR VISIBLE IMAGE SENSING AND INFRARED DEPTH SENSING, OR FOR VISIBLE IMAGE SENSING AND INFRARED IMAGE SENSING

(71) Applicant: Apple Inc., Cupertino, CA (US)

(72) Inventors: Gennadiy A. Agranov, San Jose, CA (US); Zachary M. Beiley, Oakland, CA (US); Andras G. Pattantyus-Abraham, Menlo Park, CA (US); Oray O. Cellek, Los Altos, CA (US); Xiaofeng Fan, San Jose, CA (US); Gershon Rosenblum, Fremont, CA (US); Xiangli Li, Palo Alto, CA (US); Emanuele Mandelli, Mountain View, CA (US); Bernhard Buettgen, San Jose, CA (US); Yuchuan Shao, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/912,497

(22) Filed: Jun. 25, 2020

(65) Prior Publication Data
US 2020/0412980 A1 Dec. 31, 2020

Related U.S. Application Data

(60) Provisional application No. 62/868,746, filed on Jun. 28, 2019.

(51) Int. Cl.
*H04N 5/33* (2023.01)
*H01L 27/146* (2006.01)
(Continued)

(52) U.S. Cl.
CPC ......... *H04N 5/33* (2013.01); *H01L 27/14609* (2013.01); *H01L 27/14649* (2013.01)

(58) Field of Classification Search
None
See application file for complete search history.

(56) References Cited

U.S. PATENT DOCUMENTS

| 4,350,886 A | * | 9/1982 | Pommerrenig | ..... H01L 31/0203 257/E31.117 |
| 5,506,429 A | | 4/1996 | Tanaka et al. | |

(Continued)

FOREIGN PATENT DOCUMENTS

| CN | 101637020 | 1/2010 |
| CN | 101998070 | 3/2011 |

(Continued)

OTHER PUBLICATIONS

Huang et al., "Extremely high-performance visible light photodetector in the Sb2SeTe2 nanoflake", Scientific Reports, Mar. 2017, pp. 1-7. (Year: 2017).*

(Continued)

*Primary Examiner* — Hung Q Dang
(74) *Attorney, Agent, or Firm* — Brownstein Hyatt Farber Schreck, LLP

(57) ABSTRACT

A sensor stack is described. The sensor stack includes first and second electromagnetic radiation sensors. The first electromagnetic radiation sensor has a high quantum efficiency for converting a first range of electromagnetic radiation wavelengths into a first set of electrical signals. The second electromagnetic radiation sensor is positioned in a field of view of the first electromagnetic radiation sensor and has a high quantum efficiency for converting a second range of electromagnetic radiation wavelengths into a second set of electrical signals and a low quantum efficiency for converting the first range of electromagnetic radiation wave- (Continued)

lengths into the second set of electrical signals. The first range of wavelengths does not overlap the second range of wavelengths, and the second electromagnetic radiation sensor is at least partially transmissive to the first range of electromagnetic radiation wavelengths.

53 Claims, 46 Drawing Sheets

(51) Int. Cl.
*H04N 23/30* (2023.01)
*H04N 25/131* (2023.01)

(56) References Cited

U.S. PATENT DOCUMENTS

| | | | |
|---|---|---|---|
| 6,198,147 B1* | 3/2001 | Connolly | H01L 27/14652 257/443 |
| 7,153,720 B2 | 12/2006 | Augusto | |
| 7,164,113 B2 | 1/2007 | Inokuma et al. | |
| 7,432,540 B2 | 10/2008 | McKee | |
| 7,443,437 B2 | 10/2008 | Altice, Jr. | |
| 7,542,085 B2 | 6/2009 | Altice, Jr. et al. | |
| 7,551,059 B2 | 6/2009 | Farrier | |
| 7,671,435 B2 | 3/2010 | Ahn | |
| 7,714,917 B2 | 5/2010 | McKee | |
| 7,825,911 B2 | 11/2010 | Sano et al. | |
| 7,858,915 B2 | 12/2010 | McCarten | |
| 7,872,287 B2 | 1/2011 | Masuoka et al. | |
| 7,965,330 B2 | 6/2011 | Panicacci | |
| 8,026,966 B2 | 9/2011 | Altice | |
| 8,049,256 B2 | 11/2011 | Guidash | |
| 8,164,191 B2 | 4/2012 | Nakamura | |
| 8,169,011 B2 | 5/2012 | Oh | |
| 8,184,188 B2 | 5/2012 | Yaghmai | |
| 8,193,023 B2 | 6/2012 | Ahn | |
| 8,193,542 B2 | 6/2012 | Maehara | |
| 8,222,586 B2 | 7/2012 | Lee | |
| 8,310,003 B2 | 11/2012 | Kohyama | |
| 8,324,553 B2 | 12/2012 | Lee | |
| 8,400,625 B1* | 3/2013 | Young | G01B 11/27 356/153 |
| 8,462,249 B2 | 6/2013 | Shinohara | |
| 8,478,123 B2 | 7/2013 | Cao et al. | |
| 8,508,637 B2 | 8/2013 | Han et al. | |
| 8,514,308 B2 | 8/2013 | Itonaga et al. | |
| 8,525,287 B2 | 9/2013 | Tian et al. | |
| 8,530,820 B2 | 9/2013 | Matsunuma | |
| 8,531,567 B2 | 9/2013 | Roy et al. | |
| 8,570,409 B2 | 10/2013 | Choi et al. | |
| 8,637,800 B2 | 1/2014 | Kozlowski | |
| 8,642,306 B2 | 1/2014 | Enomoto et al. | |
| 8,642,374 B2 | 2/2014 | Lyu et al. | |
| 8,669,132 B2 | 3/2014 | Lee | |
| 8,669,963 B2 | 3/2014 | Baker et al. | |
| 8,773,562 B1 | 7/2014 | Fan | |
| 8,792,035 B2 | 7/2014 | Yamada | |
| 8,912,624 B2 | 12/2014 | Kakehata | |
| 8,933,527 B2 | 1/2015 | Chu et al. | |
| 8,946,610 B2 | 2/2015 | Iwabuchi et al. | |
| 9,177,981 B2 | 11/2015 | Nishizawa | |
| 9,200,956 B2 | 12/2015 | Janesick | |
| 9,245,917 B2 | 1/2016 | Fan | |
| 9,348,165 B2 | 5/2016 | KuroKawa et al. | |
| 9,385,166 B2 | 7/2016 | Jung et al. | |
| 9,406,713 B2 | 8/2016 | Fan | |
| 9,451,131 B2 | 9/2016 | Umebayashi et al. | |
| 9,654,714 B2 | 5/2017 | He | |
| 9,741,754 B2 | 8/2017 | Li | |
| 9,888,199 B2 | 2/2018 | Gomi et al. | |
| 9,960,353 B2 | 5/2018 | Liang et al. | |
| 10,003,759 B2 | 6/2018 | Fan | |
| 10,297,703 B2 | 5/2019 | Tian et al. | |
| 10,462,402 B2 | 10/2019 | Fan | |
| 10,466,560 B2 | 11/2019 | Yamazaki et al. | |
| 10,566,373 B2 | 2/2020 | Goto et al. | |
| 10,707,247 B2 | 7/2020 | Tian et al. | |
| 10,847,581 B2 | 11/2020 | Yamaguchi et al. | |
| 2003/0049925 A1 | 3/2003 | Layman et al. | |
| 2004/0125222 A1* | 7/2004 | Bradski | H04N 5/332 257/E27.138 |
| 2007/0019130 A1 | 11/2007 | Kuo | |
| 2007/0272828 A1 | 11/2007 | Xu | |
| 2009/0115878 A1 | 5/2009 | Mauritzson | |
| 2009/0173932 A1* | 7/2009 | Ohta | G01J 5/0859 257/15 |
| 2009/0179241 A1* | 7/2009 | Kawai | H01L 31/103 257/292 |
| 2010/0065744 A1* | 3/2010 | Ouvrier-Buffet | G01J 5/08 250/353 |
| 2011/0042552 A1 | 2/2011 | Furuya et al. | |
| 2011/0242388 A1* | 10/2011 | Watanabe | H01L 27/1463 348/308 |
| 2012/0162484 A1* | 6/2012 | Mo | H04N 5/3575 348/241 |
| 2015/0054962 A1* | 2/2015 | Borthakur | H01L 27/14636 348/164 |
| 2015/0129747 A1* | 5/2015 | Petilli | H01L 27/14621 257/432 |
| 2017/0141146 A1* | 5/2017 | Belsher | H01L 27/14636 |
| 2017/0162733 A1* | 6/2017 | Kinge | H01L 21/02628 |
| 2017/0302866 A1* | 10/2017 | Fu | H04N 5/37455 |
| 2017/0373042 A1* | 12/2017 | Shizukuishi | H01L 25/0657 |
| 2018/0020169 A1* | 1/2018 | Mogi | H04N 9/04557 |
| 2018/0047773 A1* | 2/2018 | Gomi | H04N 23/12 |
| 2018/0076336 A1 | 3/2018 | De Graff et al. | |
| 2018/0145104 A1* | 5/2018 | Kim | H01L 27/1462 |
| 2018/0151619 A1* | 5/2018 | Yamashita | H01L 27/14636 |
| 2018/0166491 A1* | 6/2018 | Nagata | H01L 27/1469 |
| 2018/0358393 A1 | 12/2018 | Sato et al. | |
| 2019/0204844 A1* | 7/2019 | Lau | G05B 15/02 |
| 2019/0245003 A1* | 8/2019 | Eum | H01L 21/6836 |
| 2019/0363269 A1* | 11/2019 | Leem | H01L 27/307 |
| 2020/0152683 A1 | 5/2020 | Akiyama et al. | |
| 2020/0161456 A1* | 5/2020 | Leipold | H01L 29/7613 |

FOREIGN PATENT DOCUMENTS

| | | |
|---|---|---|
| CN | 102110700 | 6/2011 |
| EP | 1562233 | 8/2005 |
| EP | 2879181 | 6/2015 |
| JP | 59115681 | 7/1984 |
| JP | 2007134562 | 5/2007 |
| JP | 2007228460 | 9/2007 |
| JP | 2008010502 | 1/2008 |
| JP | 2009503896 | 1/2009 |
| JP | 2010212668 | 9/2010 |
| JP | 2011049445 | 3/2011 |
| JP | 2012114439 | 6/2012 |
| JP | 20139301 | 1/2013 |
| JP | 2018087969 | 6/2018 |
| WO | WO 09/034623 | 3/2009 |
| WO | WO 11/082126 | 4/2011 |
| WO | WO 13/118646 | 8/2013 |

OTHER PUBLICATIONS

Machida et al., "2.1Mpixel Organic-Film Stacked RGB-IR Image Sensor with Electrically Controllable IR Sensitivity", IEEE International Solid-State Circuits Conference, 2017, pp. 78-80. (Year: 2017).*

Procarione et al., "The optical properties of Sb2Se3—Sb2Te3," Phys. Stat. Sol., Department of Physics, Northern Illinois University, DeKalb, Illinois, vol. 42, No. 2, Jan. 1, 1970, pp. 871-878.

* cited by examiner

STACKED ELECTROMAGNETIC RADIATION SENSORS FOR VISIBLE IMAGE SENSING AND INFRARED DEPTH SENSING, OR FOR VISIBLE IMAGE SENSING AND INFRARED IMAGE SENSING

CROSS-REFERENCE TO RELATED APPLICATION

This application is a nonprovisional of and claims the benefit under 35 U.S.C. 119(e) of U.S. Provisional Patent Application No. 62/868,746, filed Jun. 28, 2019, the contents of which are incorporated herein by reference as if fully disclosed herein.

FIELD

The described embodiments relate generally to devices having a first electromagnetic radiation sensor (e.g., a visible light sensor) stacked on a second electromagnetic radiation sensor (e.g., an infrared (IR) sensor, such as an IR depth sensor or an IR image sensor). Described embodiments also relate generally to electromagnetic radiation sensors having a photosensitive material that is separate from a semiconductor substrate that includes pixel circuitry for an array of pixels defined by the semiconductor substrate and, in some respects, the photosensitive material.

BACKGROUND

A device such as a camera (e.g., a digital camera) may at times include more than one image sensor (or more generally, more than one electromagnetic radiation sensor). For example, a device may include a visible light sensor and an IR sensor. In some examples, the IR sensor may be used to acquire an IR image, and the IR image may be used, for example, to adjust the colors or chrominance of a visible light image acquired by the visible light sensor (e.g., for color processing). An IR image may also be used as an input to adjust the focus of the visible light image; to boost low light sensitivity; to identify sources of heat that may affect the visible light image; to provide night vision; or for other purposes.

In some cases, visible light and IR sensors have been integrated on a single silicon substrate. For example, a red-green-blue (RGB) light sensor and an IR sensor have been integrated on a single silicon substrate, with RGB and IR pixels sharing the same silicon-based photosensitive layer. Separation between the RGB and IR pixels has been provided in a two-dimensional (2D) spatial domain, with the IR pixels replacing selected RGB pixels (e.g., with IR pixels replacing certain green pixels), and with the IR pixels typically employing a black color filter that transmits IR radiation and blocks visible light.

SUMMARY

Embodiments of the systems, devices, methods, and apparatus described in the present disclosure are directed to stacked electromagnetic radiation sensors. Also described are systems, devices, methods, and apparatus directed to electromagnetic radiation sensors having a photosensitive material that is separate from a semiconductor substrate that includes pixel circuitry for an array of pixels defined by the semiconductor substrate and, in some respects, the photosensitive material.

In a first aspect, the present disclosure describes a sensor stack. The sensor stack may include first and second electromagnetic radiation sensors. The first electromagnetic radiation sensor may have a high quantum efficiency (QE) for converting a first range of electromagnetic radiation wavelengths into a first set of electrical signals. The second electromagnetic radiation sensor may be positioned in a field of view (FoV) of the first electromagnetic radiation sensor. The second electromagnetic radiation sensor may have a high quantum efficiency for converting a second range of electromagnetic radiation wavelengths into a second set of electrical signals, and may have a low quantum efficiency for converting the first range of electromagnetic radiation wavelengths into the second set of electrical signals: The first range of electromagnetic radiation wavelengths does not overlap the second range of electromagnetic radiation wavelengths, and the second electromagnetic radiation sensor is at least partially transmissive to the first range of electromagnetic radiation wavelengths.

In another aspect, the present disclosure describes an electromagnetic radiation sensor. The electromagnetic radiation sensor may include a semiconductor substrate and a photosensitive material deposited on the semiconductor substrate. The semiconductor substrate may include pixel circuitry for an array of pixels. An array of electrical connections may connect the pixel circuitry for the array of pixels and the photosensitive material. An electrical connection in the array of electrical connections may include a heterojunction photodiode formed between the semiconductor substrate and the photosensitive material.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
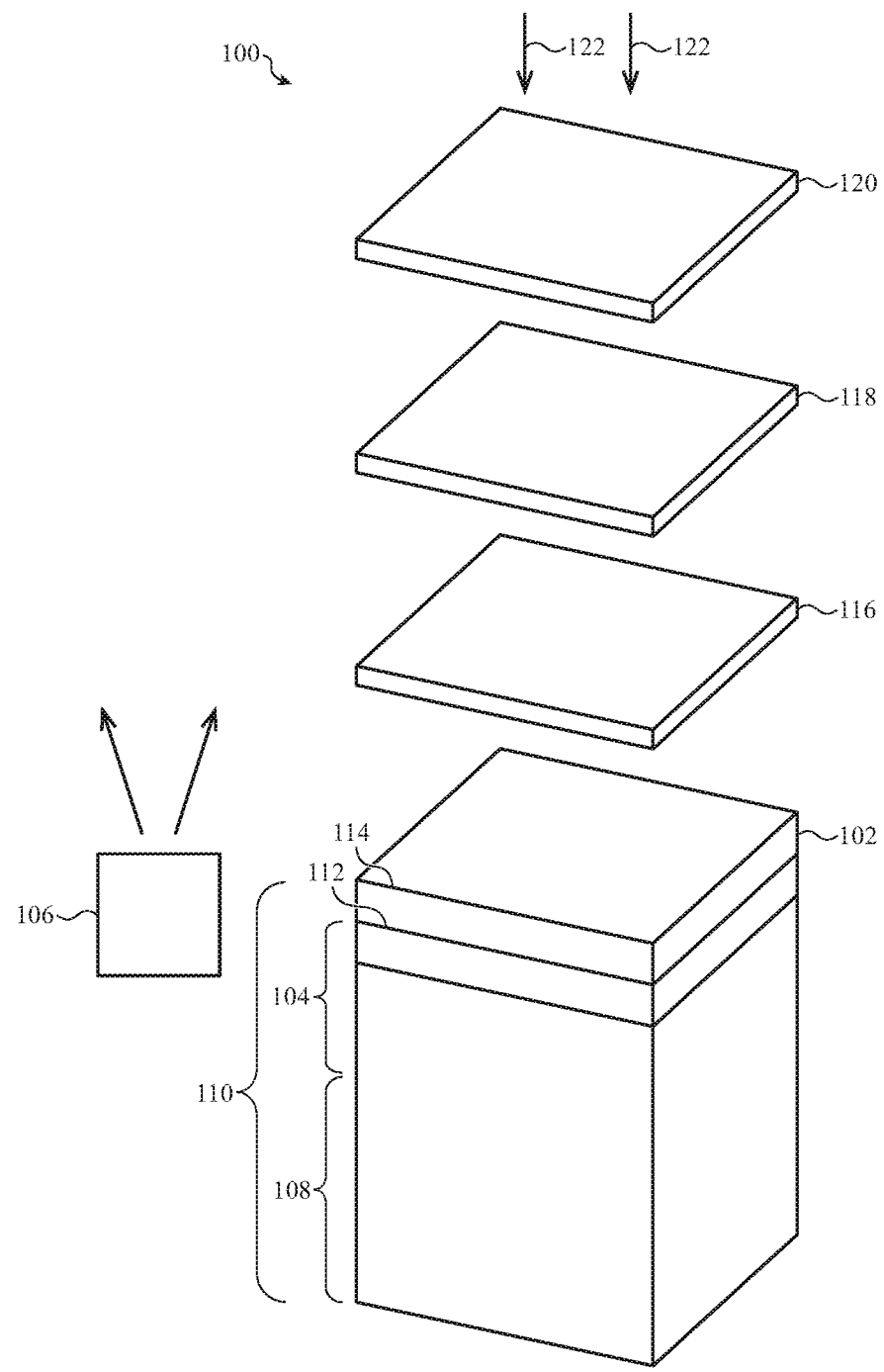
FIG. 1 shows an example of a camera including a stacked electromagnetic radiation sensor (or stacked electromagnetic radiation imager, or sensor stack), in which a first electromagnetic radiation sensor is stacked on (e.g., directly on, over, or above) an electromagnetic radiation-receiving surface of a second electromagnetic radiation sensor'

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented between them, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

As previously mentioned, a device may include a visible light sensor and an IR sensor integrated on a single silicon substrate. However, integration of such sensors into a single pixel array may provide sub-par performance for a variety of reasons. For example, given the sensitivity of the silicon-based photosensitive layer to a wide range of electromagnetic radiation wavelengths, including both visible light and IR radiation, a visible light image acquired by the visible light sensor may be contaminated by electromagnetic radiation outside the visible light spectral range. To mitigate this, a dual-band spectral filter that passes only visible light and a desired range of IR wavelengths may be placed over the integrated visible light and IR sensor. However, the IR radiation that is allowed to pass through the dual-band spectral filter (e.g., through an IR notch defined by the dual-band spectral filter) may still contaminate the visible light pixels given the sensitivity of the silicon-based photosensitive layer (even in the absence of active IR illumination). This can result in a significant reduction of the signal-to-noise ratio (SNR) of the visible light image—especially at low light, and for a scene with rich IR content (e.g., incandescent lighting, a sunset, illumination from candles, illumination from an infrared illumination source on a device, and so on). Although IR radiation blocking filters may be deployed at the pixel level (e.g., over visible light pixels), such filters can be limited in how much they increase the SNR of the visible light image, and can still reduce the quality (e.g., color quality) of the visible light image.

Integration of visible light and IR pixels into a single pixel array also impacts IR sensing. For example, given the sensitivity of the silicon-based photosensitive layer to a wide range of electromagnetic radiation wavelengths, including both visible light and IR radiation, an IR image acquired by the IR sensor may be contaminated by electromagnetic radiation outside the IR spectral range. This can result in a significant reduction of the SNR of the IR image—especially when acquiring an IR image outdoors (e.g., in sunlight), or under bright lighting conditions, or in a scenario where there are high levels of background light.

Integration of visible light and IR pixels into a single pixel array may also reduce the spatial resolution of both the visible light sensor and the IR sensor, in that some of the pixels in the visible light sensor's pixel array may be allocated for IR sensing, and some of the pixels in the IR sensor's pixel array may be allocated for visible light sensing. This fundamentally degrades the quality and/or resolution of both the visible light image and the IR image (or IR depth information).

Described herein are stacked electromagnetic radiation sensors—i.e., sensor stacks in which a first electromagnetic radiation sensor is stacked on a second electromagnetic radiation sensor. For purposes of this description, labels such as "first" and "second" are used for ease of reference when referring to different instances of the same or similar components. A component introduced as a "first" component with reference to one figure may be introduced as a "first," "second," or other instance of the component with reference to another figure or a claim.

The first electromagnetic radiation sensor may be positioned such that electromagnetic radiation incident to an electromagnetic radiation-receiving surface of the stacked electromagnetic radiation sensor is generally received by the first electromagnetic radiation sensor before being received by the second electromagnetic radiation sensor. Stated differently, the first electromagnetic radiation sensor may be positioned in a FoV of the second electromagnetic radiation sensor.

The first electromagnetic radiation sensor may have a high QE for converting a first range of electromagnetic radiation wavelengths (e.g., visible light) into a first set of electrical signals. The first electromagnetic radiation sensor may also have a low QE for converting a second range of electromagnetic radiation wavelengths (e.g., a range of IR radiation wavelengths) into the first set of electrical signals. For purposes of this description, a high QE for converting electromagnetic radiation wavelengths into a set of signals means that at least 40% of the photons within the range of electromagnetic radiation wavelengths are converted into a set of electrical signals, and preferably more than 50%, more than 60%, more than 70%, more than 80%, or more than 90%. A low QE for converting electromagnetic radiation wavelengths into a set of signals means that less than 15% of the photons with the range of electromagnetic radiation wavelengths are converted into a set of electrical signals, and preferably less than 10%, or less than 5%. Additionally or alternatively, a high QE may be distinguished from a low QE by virtue of the high QE having a numerical value that is at least 30 points greater than the numerical value of the low QE, and preferably at least 40 points, at least 50 points, at least 60 point %, or at least 70 points greater. For example, a high QE may convert 40% of photons and a low QE may convert 10% of photons (i.e., a 30 point difference in numerical value). Generally, a high QE is associated with a high sensitivity to, and high absorption of, a range of electromagnetic radiation wavelengths. Conversely, a low QE is generally associated with low sensitivity to, and low absorption of, a range of electromagnetic radiation wavelengths. In some cases, an electromagnetic radiation sensor may have a higher QE for portions of its high QE range (e.g., a higher QE for green light than red light).

The first electromagnetic radiation sensor may also be at least partially transmissive to a second range of electromagnetic radiation wavelengths, and in some cases may be highly transmissive to the second range of electromagnetic radiation wavelengths (e.g., a range of IR radiation wavelengths). For purposes of this description, the first electromagnetic radiation sensor may transmit 10% or less of the second range of electromagnetic radiation wavelengths, but may also transmit up to 90% or more of the second range of electromagnetic radiation wavelengths.

The second electromagnetic radiation sensor may have a high QE for converting the second range of electromagnetic radiation wavelengths into a second set of electrical signals.

The first and second ranges of electromagnetic radiation wavelengths may be non-overlapping, to mitigate the potential for optical contamination between the first and second electromagnetic radiation sensors.

To configure the first and second electromagnetic radiation sensors to have high QEs in different, non-overlapping ranges of electromagnetic radiation wavelengths, and low QEs outside their respective ranges of electromagnetic radiation wavelengths, it can be useful to configure one or both of the electromagnetic radiation sensors as a sensor including 1) a semiconductor substrate (e.g., a silicon substrate) including pixel circuitry for an array of pixels, in combination with 2) a photosensitive material (e.g., a quantum dot film (QF), organic material, or material with high alpha, good mobility, and low temperature integration with silicon, such as $Sb_2Se_{(3-x)}Te_{(x)}$, where x=0 has a direct bandgap of ~1.2 eV and x>0 tunes the bandgap to lower energies) that is deposited on the semiconductor substrate. The photosensitive material may provide more flexibility in tuning the range of electromagnetic radiation wavelengths for which an electromagnetic radiation sensor has a high QE (or similarly, tuning the range of wavelengths for which the electromagnetic radiation has a low QE). In some cases, an array of electrical connections between the pixel circuitry for the array of pixels and the photosensitive material may include one or more electrical connections including a heterojunction photodiode. The heterojunction photodiode may be formed between the semiconductor substrate and the photosensitive material. In some embodiments, the array of electrical connections may be at least partially transmissive to the second range of electromagnetic radiation wavelengths.

In some embodiments, an electromagnetic radiation sensor that is not stacked may benefit from being implemented using a photosensitive material deposited on a semiconductor substrate.

These and other embodiments are discussed below with reference to FIGS. 1-21. However, those skilled in the art will readily appreciate that the detailed description given herein with respect to these figures is for explanatory purposes only and should not be construed as limiting.

Directional terminology, such as "top", "bottom", "upper", "lower", "above", "below", "beneath", "front", "back", "over", "under", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways.

FIG. 1 shows an example of a camera 100 including a stacked electromagnetic radiation sensor 110 (or stacked electromagnetic radiation imager, or sensor stack), in which a first electromagnetic radiation sensor 102 is stacked on (e.g., directly on, over, or above) an electromagnetic radiation-receiving surface 112 of a second electromagnetic radiation sensor 104. For purposes of this description, an element or component that is stacked on another element or component is positioned in the FoV of the other element or component, such that electromagnetic radiation would tend to pass through the upper element or component in the stack before passing through the lower element or component in the stack. An element or component that is stacked on another element or component is also connected to the other component element or component—either directly (e.g., "on" the other element or component) or indirectly (e.g., connected to the other element or component via one or more other elements or components in the stack).

Electromagnetic radiation 122 may be received into the stacked electromagnetic radiation sensor 110 via the first electromagnetic radiation sensor 102, and a portion of the electromagnetic radiation 122 may pass through the first electromagnetic radiation sensor 102 to the second electromagnetic radiation sensor 104. The first electromagnetic radiation sensor 102 may have a high QE for converting a first range of electromagnetic radiation wavelengths (or a first electromagnetic radiation wavelength) into a first set of electrical signals. The first electromagnetic radiation sensor 102 may also be at least partially transmissive to (or have a low QE for converting, or low or no absorption rate within) a second range of electromagnetic radiation wavelengths (or a second electromagnetic radiation wavelength). The second electromagnetic radiation sensor 104 may be have a high QE for converting the second range of electromagnetic radiation wavelengths (or the second electromagnetic radiation wavelength) into a second set of electrical signals.

In some embodiments, the first electromagnetic radiation sensor 102 may be a visible light sensor, such as an RGB light sensor. In some cases, the RGB light sensor may include a Bayer pattern color filter. Alternatively, the visible light sensor may take other forms, such as a yellow-cyan-magenta (YCM) light sensor, a yellow-cyan-magenta-white (YCMW) light sensor, a red-blue-green-white (RBGW) light sensor, or the like.

In some embodiments, the second electromagnetic radiation sensor 104 may be an IR sensor. When the second electromagnetic radiation sensor 104 is an IR sensor, and in some examples, the IR sensor may be tuned to detect a narrow range of electromagnetic radiation wavelengths (e.g., the IR sensor may have a narrow spectral sensitivity, of 40-50 nm or less) around 940 nm, 1125 nm, 1370 nm, or 1550 nm. In other examples, the IR sensor may be tuned to detect a wide range of electromagnetic radiation wavelengths (i.e., have a wide spectral sensitivity). A similar narrow or wide passband may be defined for the IR sensor in a dual-band spectral filter 116 of the camera 100 that includes the stacked electromagnetic radiation sensor 110.

When the second electromagnetic radiation sensor 104 is an IR sensor, the IR sensor may be configured in various ways for various purposes. For example, in some cases the IR sensor may be configured as an image sensor (i.e., a 2D sensor). When configured as an image sensor, the IR sensor may be configured similarly to a typical visible light sensor, but may be sensitive to IR radiation instead of visible light. For example, the IR sensor may be configured to determine how much IR radiation is absorbed by each pixel of the IR sensor over a certain window of time (e.g., using a global shutter or rolling shutter approach). Additionally or alternatively, the IR sensor may be configured as a depth sensor which, depending on its implementation, may be considered a 2D sensor or a 3D sensor. When configured as a depth sensor, the IR sensor may be configured to measure the times at which particular photons are incident on the IR sensor (e.g., the IR sensor may include an array of single-photon avalanche diodes (SPADs) that may be configured to acquire direct time-of-flight (dToF) measurements, or the IR sensor may include an array of sensor elements (e.g., gate lock-in pixels (or simply lock-in pixels)) that are configured to acquire indirect time of flight measurements (e.g., where integration times of the sensor elements are gated or modulated in synchronization with modulation of an illumination source)). In some cases, an IR sensor that is configured as an image sensor may also be configured as a depth sensor. For example, an IR sensor that is configured as an image sensor may sense IR radiation emitted by a structured illumination source, and may provide an output that is usable to derive depth information. Thus, such an IR sensor can be considered both an image sensor and a depth sensor.

When the second electromagnetic radiation sensor is an IR sensor, an optional IR illuminator 106 (or multiple IR illuminators) may illuminate an object or FoV of the IR sensor with IR radiation. The IR radiation may include a wavelength (or wavelengths) of IR radiation that are detected by the IR sensor. The IR illuminator 106 may include one or more electromagnetic radiation sources (e.g., one or more light-emitting diodes (LEDs) or lasers) that are configured to emit IR radiation. The type of IR illuminator 106 (or IR illuminators) used may depend on the type of IR sensor used, but may generally illuminate an entire FoV of the IR sensor (e.g., with flood illumination) or illuminate select portions of the FoV of the IR sensor (e.g., with patterned, structured light, or spot/dot illumination). The IR illuminator 106 may provide fixed or constant illumination, or the IR illuminator 106 may be configured to adjust the spatial positioning (e.g., line scan or dot scan) or intensity of the IR radiation over time. In some cases, the IR illuminator 106 may provide illumination that is one or more of temporally, spatially, or intensity modulated. As one example of the IR illuminator 106, in a system that includes an IR depth sensor, the IR illuminator 106 may provide structured light illumination and project one or more known illumination patterns into the FoV of the IR depth sensor. As another example, in a system that includes an IR depth sensor configured to acquire dToF measurements, the IR illuminator 106 may project a fixed pattern of illumination into the FoV of the IR depth sensor, or may scan an illumination pattern (e.g., a line or set of dots) across the FoV. As yet another example, in a system that includes an IR depth sensor configured to acquire indirect ToF (iToF) measurements, the IR illuminator 106 may be configured to project flood illumination into the FoV of the IR depth sensor and vary the intensity of the flood illumination over time. As a further example, in a system that includes an IR image sensor or IR depth sensor, the IR illuminator 106 may in some cases be used as a "flash" during image acquisition.

The first and/or second electromagnetic radiation sensor 102, 104 may be optionally coupled to a pixel processing chip 108 (or main pixel processing chip) that includes analog and/or digital circuitry (e.g., analog-to-digital converters (ADCs)) for processing signals generated by both the first electromagnetic radiation sensor 102 and the second electromagnetic radiation sensor 104. In some cases, the pixel processing chip 108 may be formed on a semiconductor substrate shared by the second electromagnetic radiation sensor 104. The first electromagnetic radiation sensor 102 may be electrically connected to the pixel processing chip 108 by conductors routed through or around the second electromagnetic radiation sensor 104.

In some embodiments, the stacked electromagnetic radiation sensor 110 (and more particularly, the electromagnetic radiation-receiving surface 114 of the first electromagnetic radiation sensor 102) may be disposed behind an optional dual-band spectral filter 116 of the camera 100. The dual-band spectral filter 116 may pass only a range of visible light wavelengths and a range of IR radiation wavelengths. The first electromagnetic radiation sensor 102 may have a high QE for converting some or all of the range of visible light wavelengths into a first set of electrical signals, and may have a low QE for converting some or all of the range of IR radiation wavelengths into the first set of electrical signals. The second electromagnetic radiation sensor 104 may have a high QE for converting some or all of the range of IR radiation wavelengths into a second set of electrical signals. When the first electromagnetic radiation sensor 102 has a high QE for converting the visible light wavelengths into the first set of electrical signals, the dual-band spectral filter 116, in combination with the first electromagnetic radiation sensor 102, may help reduce contamination of the second electromagnetic radiation sensor 104 by visible light and/or electromagnetic radiation having wavelengths outside an intended high QE range of the second electromagnetic radiation sensor 104.

In some embodiments, an optional autofocus (AF) mechanism 118 of the camera 100 may also or alternatively be disposed over the electromagnetic radiation-receiving surface 114 of the first electromagnetic radiation sensor 102 (e.g., with the dual-band spectral filter 116 positioned between the AF mechanism 118 and the first electromagnetic radiation sensor 102). In some cases, the AF mechanism 118 may be a phase detect autofocus (PDAF) mechanism including metal shields, microlenses, or the like. In some cases, the AF mechanism 118 may be positioned elsewhere in the stacked electromagnetic radiation sensor 110, or may include elements distributed in different layers of the stacked electromagnetic radiation sensor 110. In some cases, the AF mechanism 118 may help to focus electromagnetic radiation received from within a FoV onto the stacked electromagnetic radiation sensor 110, and may be positioned partly or wholly outside the path through which electromagnetic radiation propagates into or through the stacked electromagnetic radiation sensor 110.

In some embodiments, an optional lens, or lens system (e.g., a lens stack), or outer lens 120 of the camera 100 may be disposed over the electromagnetic radiation-receiving surface 114 of the first electromagnetic radiation sensor 102 (e.g., with the dual-band spectral filter 116 and AF mechanism 118 positioned between the lens 120 and the first electromagnetic radiation sensor 102). The lens 120 may aid in image formation of a desired quality on the first and second electromagnetic radiation sensors 102, 104.

In some embodiments, other components may be disposed above, below, or between the components shown in FIG. 1. For example, various lenses, filters, or other optical components may be positioned above the electromagnetic radiation-receiving surface 114 of the first electromagnetic radiation sensor 102, and/or between the first electromagnetic radiation sensor 102 and the second electromagnetic radiation sensor 104.

The stacked electromagnetic radiation sensor 110 may be variously configured as a visible image sensor and IR depth sensor (e.g., an RGB image sensor and IR depth sensor), a visible image sensor and IR image sensor (e.g., an RGB image sensor and IR image sensor), and so on.

Figure 2:
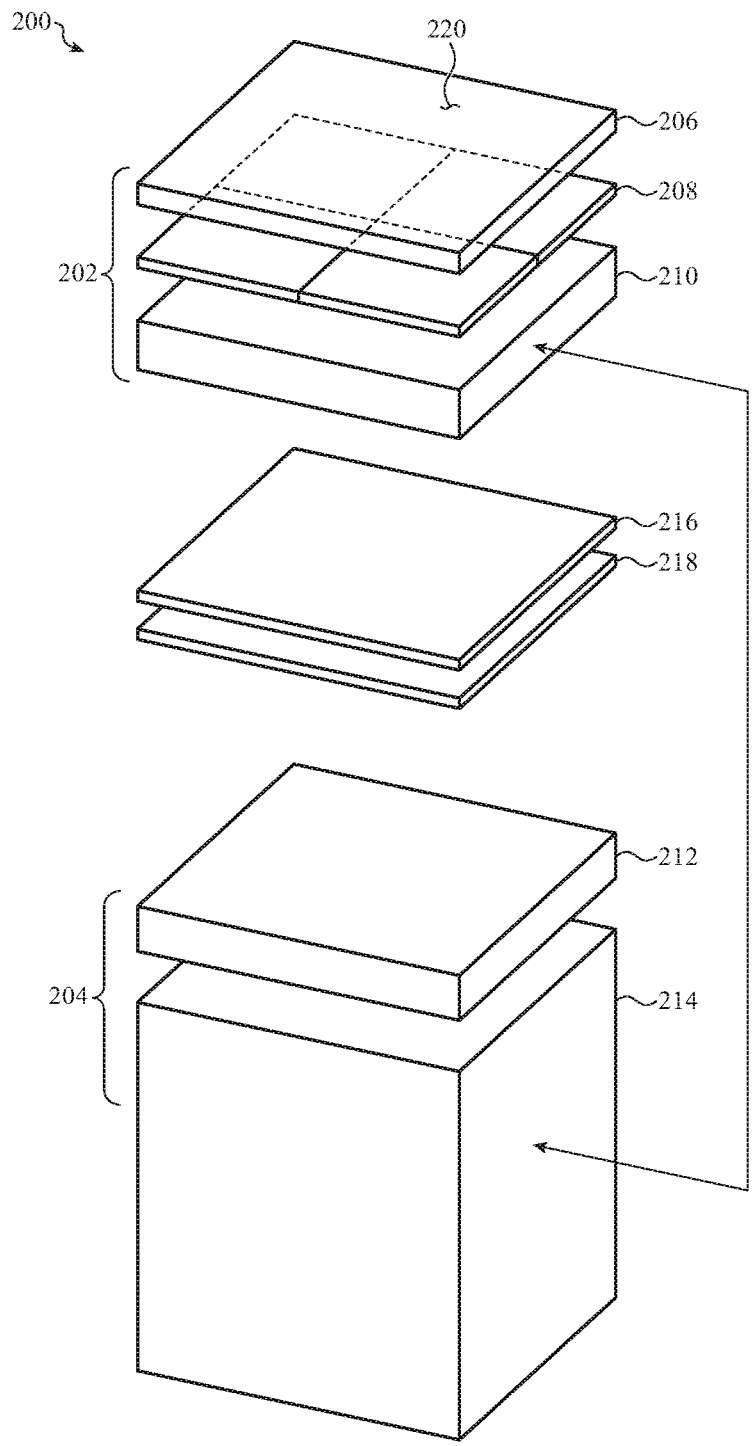
FIG. 2 shows an example exploded view of a stacked electromagnetic radiation sensor.

FIG. 2 shows an example exploded view of a stacked electromagnetic radiation sensor 200. Similarly to the stacked electromagnetic radiation sensor described with reference to FIG. 1, the stacked electromagnetic radiation sensor 200 may include a first electromagnetic radiation sensor stacked on a second electromagnetic radiation sensor. The stacked electromagnetic radiation sensor 200 may therefore incorporate some or all aspects of the stacked electromagnetic radiation sensor described with reference to FIG. 1.

By way of example, and for purposes of description, the first electromagnetic radiation sensor may be an RGB light sensor 202, and the second electromagnetic radiation sensor may be an IR sensor 204. However, each of the first and second electromagnetic radiation sensors may take other forms, as described with reference to FIG. 1.

As shown in FIG. 2, the RGB light sensor 202 may include, from the electromagnetic radiation-receiving side (or illumination side 220) of the stacked electromagnetic radiation sensor 200, a lens array 206, a color filter array 208, and a photodetector array 210 including pixel circuitry. In some embodiments, the lens array 206 may include a microlens array. The microlens array may include a separate microlens positioned over each color pixel defined by the color filter array 208. In some embodiments, the color filter array 208 may include a Bayer pattern color filter, though the color filter array 208 could alternatively include a different type of color filter. By way of example, the color filter array 208 is shown to define four pixels. In a practical embodiment, the color filter array 208 may define thousands or millions of pixels.

The IR sensor 204 may be a stacked backside illumination (BSI) silicon-based sensor. In some embodiments, the stacked BSI sensor may include two silicon layers: a BSI layer 212 including a BSI pixel array, which BSI pixel layer absorbs IR radiation within an IR notch spectral band (or at a particular IR radiation wavelength); and a pixel processing chip 214 on which the BSI layer 212 is stacked. The pixel processing chip 214 may include analog and digital circuitry for the IR sensor 204. In an alternative embodiment, the IR sensor 204 may be a stacked front side illumination (FSI) sensor or other type of IR sensor 204. In some embodiments, the IR sensor 204 may include an array of SPADs or array of gate lock-in pixels, providing, e.g., dToF or iToF measurements usable for the generation of a depth information.

In some embodiments, the BSI layer 212 may be stacked on, and electrically connected to, the pixel processing chip 214 using a hybrid copper-to-copper stacking technique. The RGB light sensor 202 may also be stacked on the IR sensor 204 using a wafer-to-wafer stacking technique or wafer transfer process, examples of which are described with reference to FIGS. 14A-15B. Connections between the pixel processing chip 214 and the RGB light sensor 202 may be provided using through silicon vias (TSVs) and/or other electrical connections.

The pixel processing chip 214 may be connected to the pixel circuitry/arrays of both the RGB light sensor 202 and the IR sensor 204 (e.g., to the pixel circuitry of the photodetector array 210, and to the BSI pixel array of the BSI layer 212. The pixel processing chip 214 may include digital and/or analog readout circuitry for both the RGB light sensor 202 and the IR sensor 204.

Visible light received by the stacked electromagnetic radiation sensor 200 may be focused by the lens array 206 (e.g., a microlens array), color-separated with absorptive color filters of the color filter array 208 (e.g., red, green, and blue color filters of a Bayer pattern color filter), and absorbed by the photodetectors of the photodetector array 210. At least some IR radiation may pass through the layers of the RGB light sensor 202 to the IR sensor 204. In some embodiments, the stacked electromagnetic radiation sensor 200 may include one or both of two additional layers—focusing elements 216 (e.g., diffraction microlenses, or any other type of focusing elements) and a visible light blocking filter 218. The focusing elements 216 and visible light blocking filter 218 may be disposed between the RGB light sensor 202 and IR sensor 204 to focus IR radiation on the sensitive part(s) of one or more IR pixels, and to block any residual visible light that may pass through the RGB light sensor 202.

To achieve a high level of performance, the photodetector array 210 may be configured to have a high QE for converting visible light into electrical signals; the components of the RGB light sensor 202 may be configured to have a low QE for converting a range of IR radiation wavelengths into the electrical signals (and in some cases may absorb no (or insignificant amounts of) IR radiation in the IR notch spectral band of the IR sensor 204 and/or dual-band spectral filter of a camera including the stacked electromagnetic radiation sensor (e.g., as described with reference to FIG. 1); and all of the components above the BSI layer 212 (including TSVs and routing components in some cases) may provide a high transmittance of IR radiation in the IR notch spectral band of the IR sensor 204 and/or dual-band spectral filter of a camera including the stacked electromagnetic radiation sensor 200. When these conditions are met, signals generated by the RGB light sensor 202 are not contaminated (or may be minimally contaminated) by IR radiation, improving the SNR and image quality of the RGB light sensor output. This can be especially useful when imaging a low light scene with high IR content. Also, signals generated by the IR sensor 204 are not contaminated (or may be minimally contaminated) by visible light. In other words, the IR sensor 204 is shielded from visible light by the high QE (or absorption) of visible light by the photodetector array 210, and by the visible light blocking filter 218 (in embodiments that include the filter 218).

Also when the above conditions are met, both the RGB light sensor 202 and the IR sensor 204 may have full resolutions in their given optical formats; the pixel size, pixel architecture, and mode of operation for the RGB light sensor 202 and IR sensor 204 can be chosen independently, providing great flexibility in the designs and architectures of the RGB light sensor 202 and IR sensor 204; and the RGB light sensor 202 may have a different or smaller pixel size than the IR sensor 204. In some embodiments, the RGB light sensor 202 may be configured to operate in either a rolling shutter mode or a global shutter mode.

Also when the above conditions are met, the stacked electromagnetic radiation sensor 200 may be used to generate IR image information (e.g., a heat map, or chrominance information that may be used to adjust a visible image) or IR depth information (e.g., a depth map). The IR sensors 204 may include rolling shutter or global shutter pixels, or dToF or iToF pixels (i.e., pixels used to acquire dToF or iToF measurements), having the same or different resolution as their corresponding visible light pixels in the RGB light sensors 202. For example, the IR pixels may have a size that is an integer (or non-integer) multiple (or subdivision) of the RGB pixels. For the convenience of commonly used readout circuitry, the pixel size of the IR sensor 204 can be a multiple of the pixel size of the RGB light sensor 202. However, this is not a necessary condition. As an example, the IR sensor 204 may have a pixel size (or resolution) of 4 µm×4 µm, and a pixel array size of 1 Megapixels, but the RGB light sensor 202 may have a pixel size (or resolution) of 1 µm×1 µm, and a pixel array size of 16 Megapixels. Both pixel arrays may be used within the same optical format (e.g., 1/2.8 inch, with an aspect ratio of 4:3).

For optimum performance, the IR notch spectral band of the IR sensor 204 should be chosen to have good separation from the visible spectrum to which the RGB light sensor 202 is sensitive, so that the sensitivity of the RGB light sensor 202 has no, or minimal, overlap with the IR notch spectral band. Additionally or alternatively, the photosensitive materials and designs of both the RGB light sensor 202 and IR sensor 204 may be chosen to provide no, or minimal, overlap between their respective electromagnetic radiation sensitivities. In practice, the IR notch spectral band may be dictated by imaging system requirements, thus defining the choice of photosensitive materials and designs for the RGB light sensor 202 and IR sensor 204.

Figure 3A:
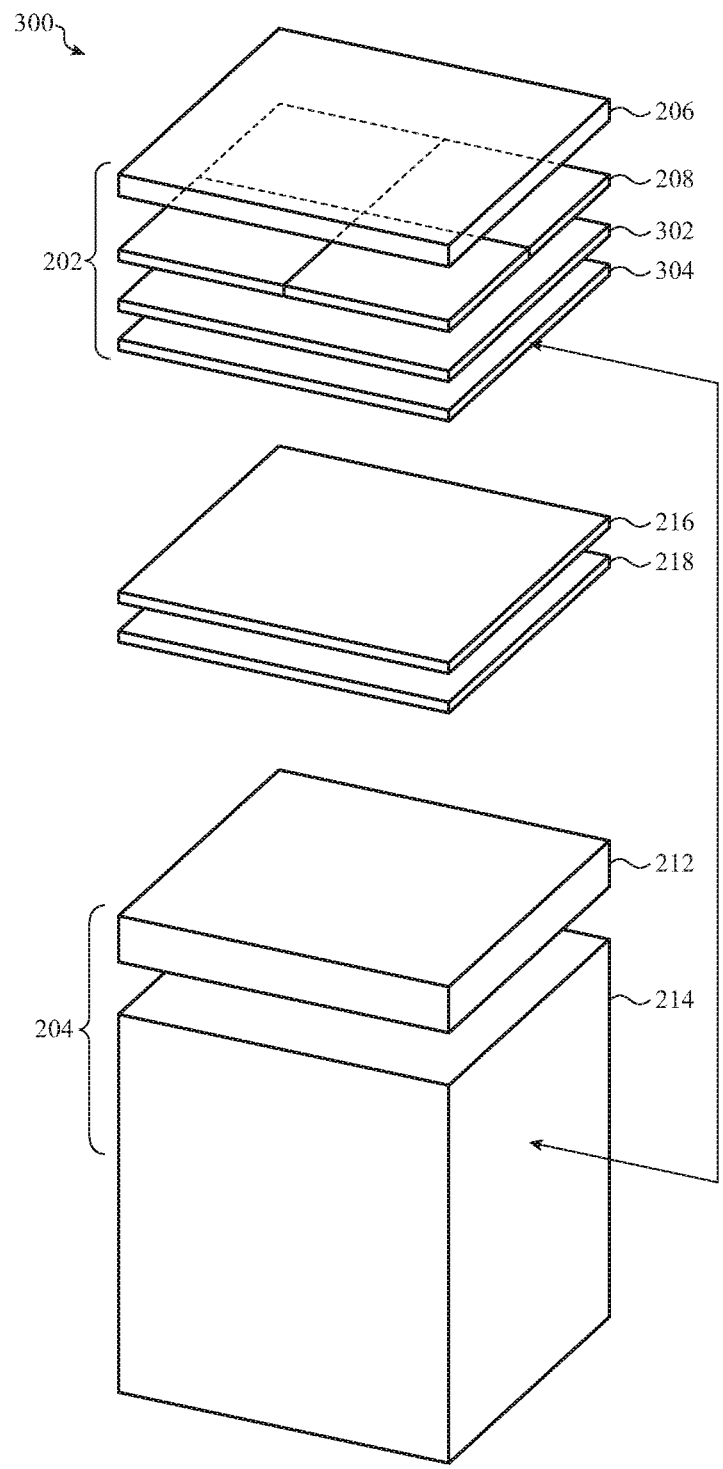
FIG. 3A shows another example exploded view of a stacked electromagnetic radiation sensor.

FIG. 3A shows another example exploded view of a stacked electromagnetic radiation sensor 300. The stacked electromagnetic radiation sensor 300 is similar to the stacked electromagnetic radiation sensor described with reference to FIG. 2, but with the photodetector array 210 of FIG. 2 implemented using a hybrid design—e.g., a photosensitive material 302 (or other panchromatic photosensitive layer) in combination with a semiconductor substrate (e.g., a silicon substrate) 304. The semiconductor substrate 304 may include pixel circuitry for the photosensitive material 302. The photosensitive material 302 (or panchromatic photosensitive layer) may in some cases include a quantum dot (QD) film, an organic material, and so on.

In some embodiments, the photosensitive material 302 may be non-silicon-based, which may make it transmissive to more electromagnetic radiation than a silicon-based photodetector array. This may improve operation of the IR sensor 204. For example, consider the case of a stacked RGB-IR sensor having an IR sensor 204 with an IR notch spectral band around 940 nm. The width of the IR notch spectral band may be defined by the system's lensing and other optical parameters, and could be on the order of 40-50 nm. To satisfy the conditions for high performance described with reference to FIG. 2, the RGB light sensor 202 should have no, or minimal, sensitivity to (i.e., a low QE for) electromagnetic radiation wavelengths above ~900 nm. The IR sensor 204 may be constructed with this assumption, and may use silicon for its photosensitive layer. In some cases, the IR sensor 204 may have a BSI stacked silicon sensor design or an FSI stacked silicon sensor design. Use of a photosensitive material 302 in the RGB light sensor 202 may enable the RGB light sensor 202 to confine its sensitivity (or high QE range) to electromagnetic radiation wavelengths below ~900 nm.

Figure 3B:
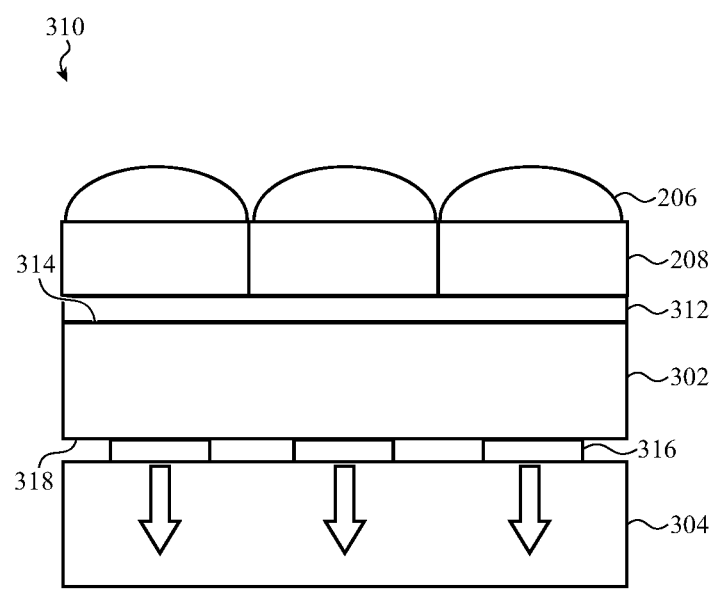
FIG. 3B shows an elevation of the RGB light sensor described with reference to FIG. 3A, in combination with components that are not specifically illustrated in FIG. 3A.

FIG. 3B shows an elevation 310 of the RGB light sensor 202 described with reference to FIG. 3A, in combination with components that are not specifically illustrated in FIG. 3A.

As shown in FIG. 3B, a common electrode 312 for the photosensitive material 302 (i.e., an electrode for the entire photosensitive material 302) may be positioned on, and in electrical contact with, an electromagnetic radiation-receiving surface 314 of the photosensitive material 302. Separate electrical contacts 316 (e.g., pixel contacts) may be disposed on the electromagnetic radiation emission surface 318 of the photosensitive material 302, with each separate electrical contact 316 providing electrical contact between a portion of the photosensitive material 302 and the pixel circuitry of a respective pixel. The pixel circuitry may be included in the semiconductor substrate 304, and may provide control and signal processing for the photosensitive material 302, including charge acquisition, kTC noise cancellation, and so on. In some embodiments, the thickness of the silicon layer (with pixel circuitry) may be fairly small—on the order of a single micron (e.g., one micron±10% or ±1%)—to provide high transmittance of IR radiation to the IR sensor 204. Elements of the pixel circuitry, contacts to the photosensitive material 302, and conductive traces that provide signal routing may be made from transparent materials that provide high transmittance of IR radiation. Examples of such transparent materials include indium-tin-oxide (ITO), polysilicon, and so on.

As previously mentioned, the photosensitive material 302 may include a QD film (QF) or organic material. When the photosensitive material 302 includes a QF, a panchromatic photosensitive layer may be formed by a film including an array of semiconductor quantum dots. The exciton of each quantum dot may be quantum-confined to a volume smaller than the bulk semiconductor exciton Bohr radius. The quantum dot size shifts the exciton energy, thereby providing for tuning of the optical absorption onset to a desired higher energy. The composition of the photosensitive material may be chosen to obtain a desired combination of quantum dot size, size distribution width, optical absorption onset, valence band energy, and conduction band energy.

Advantages of a QF-based panchromatic photosensitive layer include high absorption of electromagnetic radiation in the target spectral range, high quantum efficiency (QE) in the target spectral range, high uniformity and low crosstalk between pixels, low dark current, flexibility in spectral response tuning, a low operating voltage, and compatibility with complimentary metal-oxide semiconductor (CMOS) imaging processes. In some cases, a QF's onset of optical absorption may be tuned to shorter or longer wavelengths by changing the QD size.

Alternatively, the photosensitive material 302 may be implemented using an organic material. An active layer of organic material may include, for example, a single type of polymer molecules, or a bulk heterojunction of different polymer molecules (or of a polymer and non-polymeric organic molecules). The pixel architecture and readout circuitry for a photosensitive material 302 based on an organic-based light absorbing material may be similar to the pixel architecture and readout circuitry of a photosensitive material 302 based on a QF.

A photosensitive material 302 (or panchromatic photosensitive layer) may be deposited using various methods, including spin coating, slot-die coating, inkjet printing from solution, or vacuum deposition.

As another option, the photosensitive material 302 and semiconductor substrate 304 may be replaced by a silicon BSI layer including a BSI pixel array. However, a silicon BSI layer may be sensitive to (or have a high QE for) IR radiation, and this IR sensitivity can contaminate a visible light image with IR radiation and reduce SNR—especially at low light and in the presence of rich IR content. In some cases, the effect of IR contamination of the visible light image, from the standpoint color accuracy and/or white balance, may be mitigated by measuring the IR content using the IR sensor 204, and using the output of the IR sensor 204 as an input to a color processor (or color processing algorithm). Alternatively, in applications where color accuracy is less important, the output of the IR sensor 204 can be used to boost luminance sensitivity at very low light conditions.

Figure 4A:
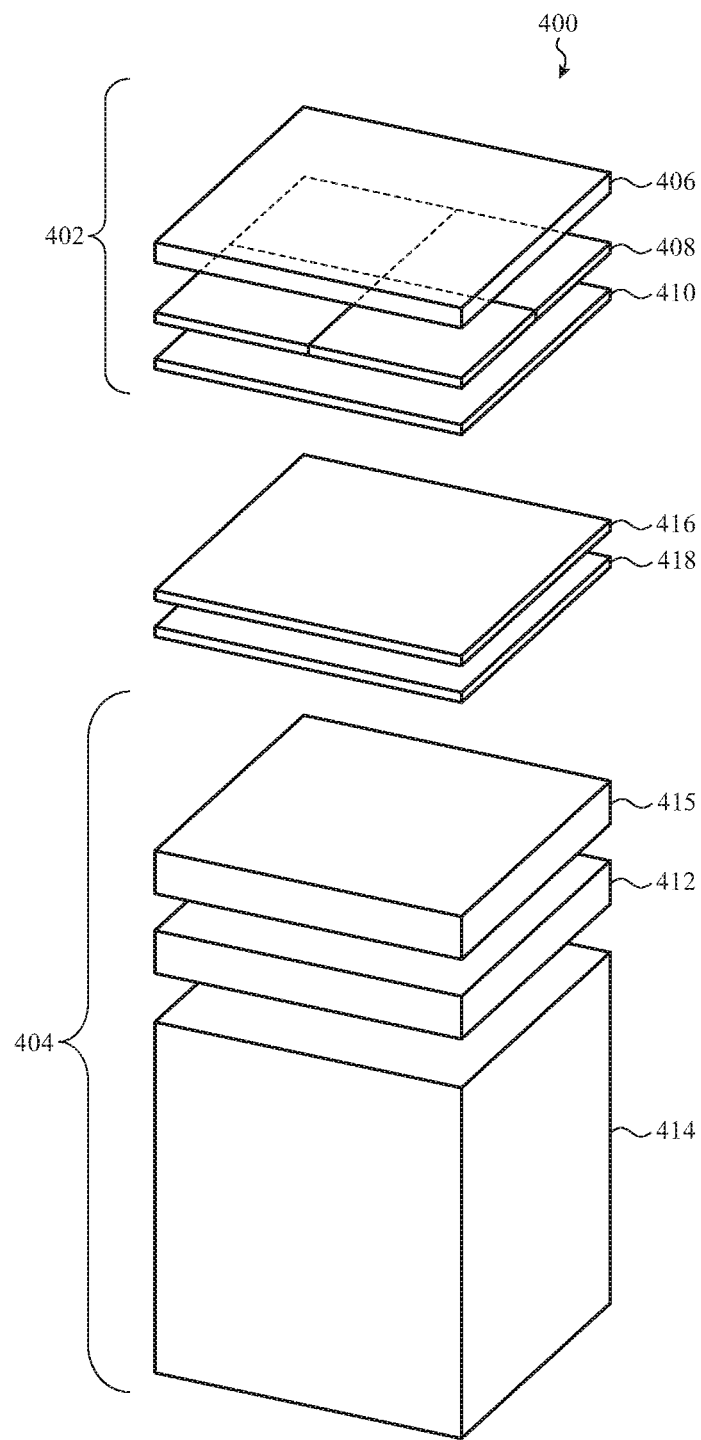
FIGS. 4A-4C and 5A-5B illustrate various exploded view examples of stacked electromagnetic radiation sensors.

FIG. 4A shows yet another example exploded view of a stacked electromagnetic radiation sensor 400. Similarly to the stacked electromagnetic radiation sensors described with reference to FIGS. 1-3A, the stacked electromagnetic radiation sensor 400 may include a first electromagnetic radiation sensor stacked on a second electromagnetic radiation sensor. The stacked electromagnetic radiation sensor 400 may therefore incorporate some or all aspects of the stacked electromagnetic radiation sensors described with reference to FIGS. 1-3A.

As previously discussed, and in some examples, the first electromagnetic radiation sensor may be a visible light sensor, such as an RGB light sensor 402, and the second electromagnetic radiation sensor may be an IR sensor 404. However, each of the first and second electromagnetic radiation sensors may take other forms, as described with reference to FIGS. 1-3B, and as will be described in further detail herein. As illustrated in FIG. 4A, the RGB light sensor 402 may be formed as a semiconductor-based (or silicon-based) pixel array that is stacked on a QF IR ToF sensor (or other QF IR sensor).

In FIG. 4A, the RGB light sensor 402 may be a silicon-based RGB sensor and may include, from the electromagnetic radiation-receiving side (or illumination side) of the stacked electromagnetic radiation sensor 400, a lens array 406, a color filter array 408, and a photodetector array 410 which may include pixel circuitry. In some embodiments, the lens array 406 may include a microlens array. The microlens array may include a separate microlens positioned over each color pixel defined by the color filter array 408. In some examples, the photodetector array 410 may be implemented using a hybrid design, and may include a photosensitive material (or other panchromatic photosensitive layer) in combination with a semiconductor substrate. The semiconductor substrate may include pixel circuitry for the photosensitive material. The photosensitive material (or panchromatic photosensitive layer) may in some cases be implemented using a QF, an organic material, and so on, as will be discussed in further detail herein.

The IR sensor 404 may be implemented utilizing a separate photosensitive material (e.g., a QF 415), which may form a QF/silicon heterojunction at and/or around the interface between the two materials. Additionally, in some examples, the IR sensor 404 may include a pixel processing chip 414. The pixel processing chip 414 may include analog and/or digital circuitry for the IR sensor 404. The QF/silicon heterojunction may enable high speed operation of the IR sensor 404, which may be desirable for depth sensing, or combining depth sensing with RGB light sensing, and/or other applications. Further, the QF/silicon heterojunction may be implemented as a tunable bandgap device, which may be used, e.g., for dToF and/or iToF depth map acquisition. By tuning the band gap of the QF, the IR sensor 404 may be made sensitive to (or tuned to have a high QE for) electromagnetic radiation beyond the band gap of silicon. In the example of FIG. 4A, the bandgap of the QF may be narrower or smaller than silicon, and in some cases may be less than approximately 1.1 eV.

In some examples, a QF-based image sensor that is sensitive to electromagnetic radiation beyond the bandgap of the material used for RGB imaging may allow the RGB light sensor 402 to be stacked directly on the QF. Further, the RGB light sensor 402 may be stacked on top of the IR sensor 404 such that the illumination path may pass through the RGB light sensor 402 first, and then may be received by the IR sensor 404. Even though the RGB light sensor 402 may be directly on the IR sensor 404, contamination of the RGB light sensor pixels, by IR illumination, may be mitigated or avoided. Thus, using a QF as a photosensitive material may use less space in the stacked electromagnetic radiation sensor 400, thus allowing more space within the semiconductor substrate for additional circuitry, or allowing for a greater full well capacity within the semiconductor substrate.

In some examples, the QF/silicon heterojunction may reduce undesirable capacitance (e.g., capacitance that may slow operation of the IR sensor 404). In some examples, the QF may be in contact with the pixel transistors via an indium-tin-oxide/titanium nitride bottom contact and a copper plug or line. This indium-tin-oxide/titanium nitride and copper plug may cause undesirable capacitance and slower operation of the IR sensor 404, thus rendering the device too slow for depth sensing applications. By using a QF/silicon heterojunction in the IR sensor 404, the capacitance may be sufficiently reduced to enable the higher operating speeds used for depth sensing applications. The heterojunction is discussed in further detail herein.

The selection of the QF bandgap may be based on various considerations. In some examples, the QF bandgap may be selected so that laser and/or diode light sources (e.g., an IR illuminator) may operate in compliance with safety requirements, which may further result in higher illumination power and a better SNR ratio. Another consideration for improving the SNR may be to choose the bandgap of the QF to be as wide as possible. In doing so, the dark current may be reduced, which may improve the SNR.

As previously discussed, the IR sensor 404 of FIG. 4A may be used for ToF depth sensing. In order to achieve a fast operating speed for the IR sensor 404, multiple factors may be taken into consideration. One such consideration may be the QF response time. The QF response time may depend on any individual and/or combination of factors, such as mobility of the material used for the QF, the thickness of the QF, and the bias voltage that may be applied to the QF.

The sensor 400 may be used in various settings, including inside of buildings or outside on a sunny day. For exterior settings where sunlight may be present, the electromagnetic radiation or solar spectrum of the sunlight may at least partially contaminate the IR sensor 404. In this example, the bandgap of the QF used in the IR sensor 404 may be chosen to have a high absorption coefficient at a wavelength where the solar spectrum is at a minimum. The wavelengths for minimizing the absorption of the solar spectrum may include wavelengths of approximately: at or around 940 nm, at or around 1125 nm, at or around 1370 nm, and/or at or around 1550 nm. In FIG. 4A, the QF of the IR sensor 404 may be sensitive to an approximate wavelength or approximate range of wavelengths greater than 1100 nm, which may assist in minimizing the solar background illumination that the IR sensor 404 absorbs. Additionally, wavelengths greater than approximately 940 nm may have lower irradiance limitations for laser compliance standards, which may allow for stronger or higher power emitters.

Due to the nature of the high speed operations used for ToF sensing, multiple material properties of the QF may be considered. In some examples, higher external quantum efficiency may be achieved by maximizing the light absorption of the QF. In these cases, the fraction of incident light absorbed may be calculated in a single pass approximation as:

$$\% A = 1 - \exp(-\alpha d)$$

where A is the fraction of incident light absorbed, $\alpha$ is the film absorption coefficient at the wavelength of operation, and d is the QF thickness. In some examples, sufficient absorbers may have an $\alpha$ in the approximate range of 10,000 cm$^{-1}$ to 20,000 cm$^{-1}$. The QF operating speed may be affected by the photo generated charge transit time in the QF, $t_{tr}$. The transit time may be expressed as:

$$t_{tr} = d^2 / \mu V$$

where d is the QF thickness, $\mu$ is the charge mobility, and V is the applied bias. Generally, $\mu$ may be in the approximate range of 0.01 cm$^2$V$^{-1}$s$^{-1}$ to 1 cm$^2$V$^{-1}$s$^{-1}$ for QFs. In some examples, to achieve a desired transit time and quantum efficiency, a corresponding minimum mobility and QF thickness may be determined.

Figure 4B:
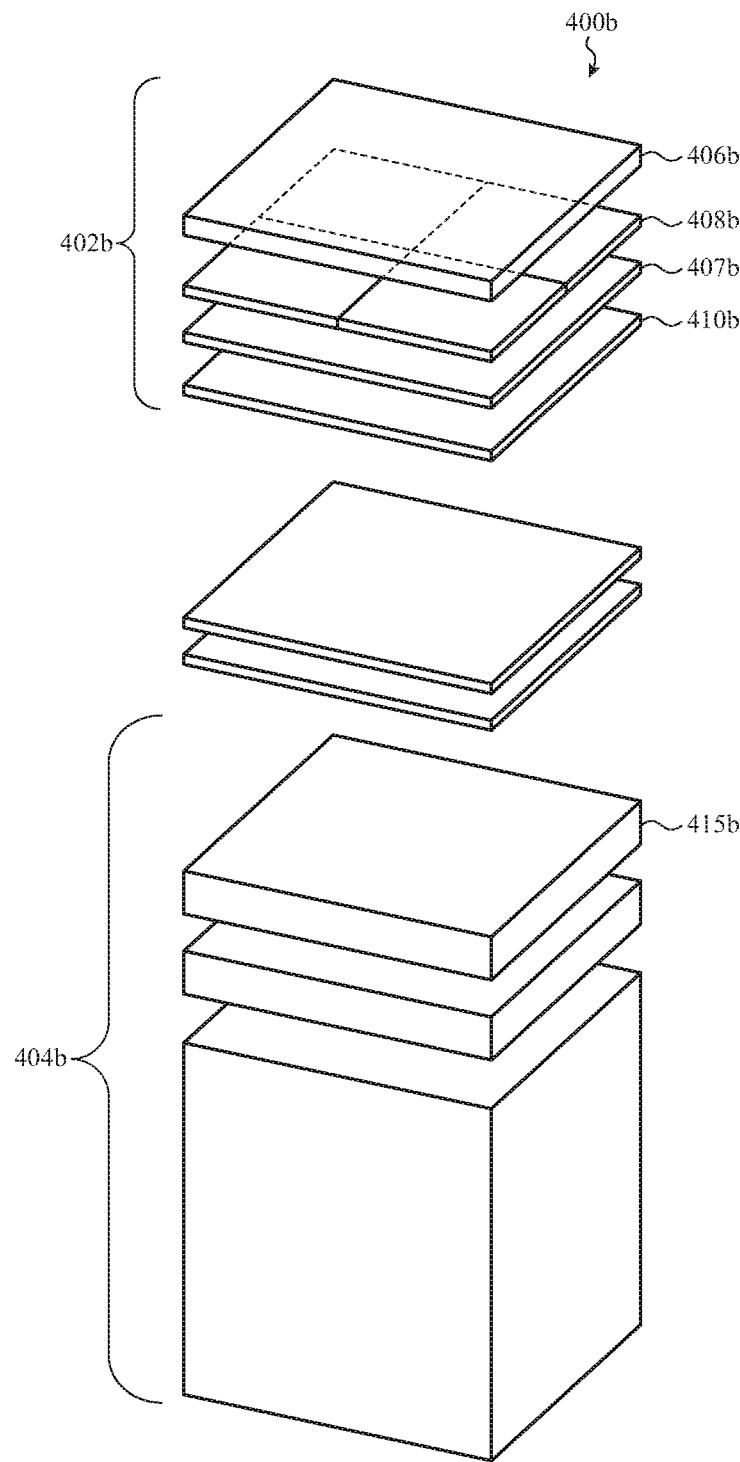

FIG. 4B shows another example exploded view of a stacked electromagnetic radiation sensor 400b. Similarly to the stacked electromagnetic radiation sensor described with reference to FIGS. 1-4A, the stacked electromagnetic radiation sensor 400b may include a first electromagnetic radiation sensor stacked on a second electromagnetic radiation sensor. The stacked electromagnetic radiation sensor 400b may therefore incorporate some or all aspects of the stacked electromagnetic radiation sensors described with reference to FIGS. 1-4A.

As previously discussed, and in some examples, the first electromagnetic radiation sensor may be a visible light sensor, such as an RGB light sensor 402b, and the second electromagnetic radiation sensor may be an IR sensor 404b. Each of the first and second electromagnetic radiation sensors may take other forms, as described with reference to FIGS. 1-4A, and as will be described in further detail herein. As illustrated in FIG. 4B, a QF RGB light sensor may be stacked on a QF IR ToF sensor (or other QF IR sensor).

The bandgap of the IR-absorbing QF may be chosen to have a high absorption coefficient at a wavelength where the solar spectrum is at a minimum. The wavelengths for minimizing the absorption of the solar spectrum may include wavelengths approximately at or around 940 nm, at or around 1125 nm, at or around 1370 nm, and/or at or around 1550 nm. In FIG. 4B, the QF IR ToF sensor may absorb an approximate wavelength or approximate range of wavelengths greater than 940 nm, which may assist in minimizing the solar background illumination that is absorbed by the IR sensor 404b.

FIG. 4B may include an RGB light sensor 402b, but instead of a silicon-based RGB light sensor as depicted in FIG. 4A, FIG. 4B may include an RGB light sensor 402 having a separate photosensitive material (e.g., a QF 407b). In FIG. 4B, the bandgap of the top RGB QF 407b may be selected to be narrow enough to absorb the visible color spectrum up to approximately 700 nm, but may be wider than the bandgap of the bottom IR-absorbing photosensitive material (e.g., another QF). The bandgap may be selected in such a way that electromagnetic radiation sensed for ToF measurements may not be absorbed by the QF-based RGB light sensor 402.

Additionally, FIG. 4B may include elements similar to those discussed with reference to FIG. 4A, such as, from the electromagnetic radiation-receiving side (or illumination side) of the stacked electromagnetic radiation sensor 400b, a lens array 406b, a color filter array 408b, and pixel circuitry 410b for the QF 407b. In some embodiments, the lens array 406b may include a microlens array. The microlens array may include a separate microlens positioned over each color pixel defined by the color filter array 408b. FIG. 4B may also incorporate other elements, as discussed with respect to FIG. 4A. Moreover, similarly numbered elements depicted in FIGS. 4A and 4B may share similar properties in some examples.

The IR sensor 404b may include a QF 415b, which may form a QF/silicon heterojunction at and/or around the interface between the two materials. The QF/silicon heterojunction may enable high speed operation of the IR sensor 404b, which may be desirable for depth sensing, or combining depth sensing with RGB light sensing, and/or other applications. Further, the QF/silicon heterojunction may be implemented as a tunable bandgap device, which may be useful for ToF (e.g., dToF and/or iToF) depth measurements. In the example of FIG. 4B, the bandgap of the QF-based IR sensor 404 may be narrower or smaller than that of silicon, and in some cases may be less than approximately 1.1 eV.

Figure 4C:
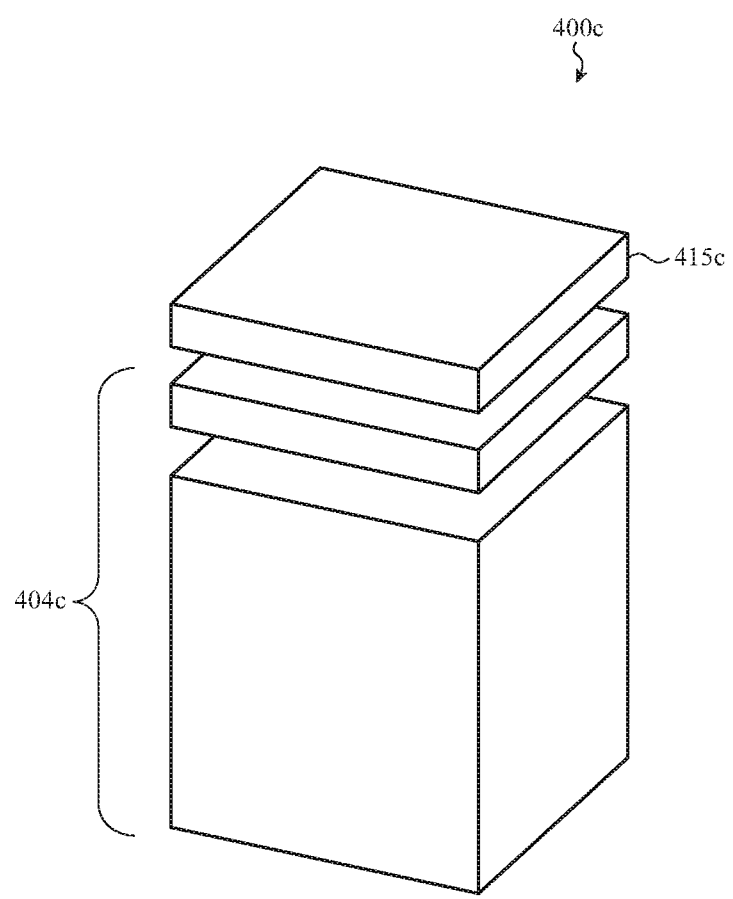

FIG. 4C shows another example exploded view of a stacked electromagnetic radiation sensor 400c. The stacked electromagnetic radiation sensor 400c may sense or detect IR radiation, similar to the IR sensors described with reference to FIGS. 1-4B. The stacked electromagnetic radiation sensor 400c may therefore incorporate some or all aspects of the IR sensors described with reference to FIGS. 1-4B.

The IR sensor 404c may include a photosensitive material (e.g., a QF 415c), which may form a QF/silicon heterojunction at and/or around the interface between the two materials. The QF/silicon heterojunction may enable high speed operation of the IR sensor 404c, which may be desirable for depth sensing, or combining depth sensing with RGB light sensing, and/or other applications. Further, the QF/silicon heterojunction may be implemented as a tunable bandgap device, which may be used for ToF (e.g., dToF and/or iToF) depth measurements. In FIG. 4C, the QF-based IR ToF sensor may absorb an approximate wavelength or approximate range of wavelengths at, around, or greater than 940 nm.

In the example of FIG. 4C, the bandgap of the QF 415c may be narrower or smaller than that of silicon, and in some embodiments may be around or less than approximately 1.1 eV. By choosing a QF bandgap that is less than that of silicon, parasitic light sensitivity in the silicon circuitry may be reduced (and in some cases eliminated). Additionally, the bandgap of the QF may be selected to be in the range of IR radiation, so that illumination provided by an associated IR illuminator may not be visible to the human eye.

Figure 5A:
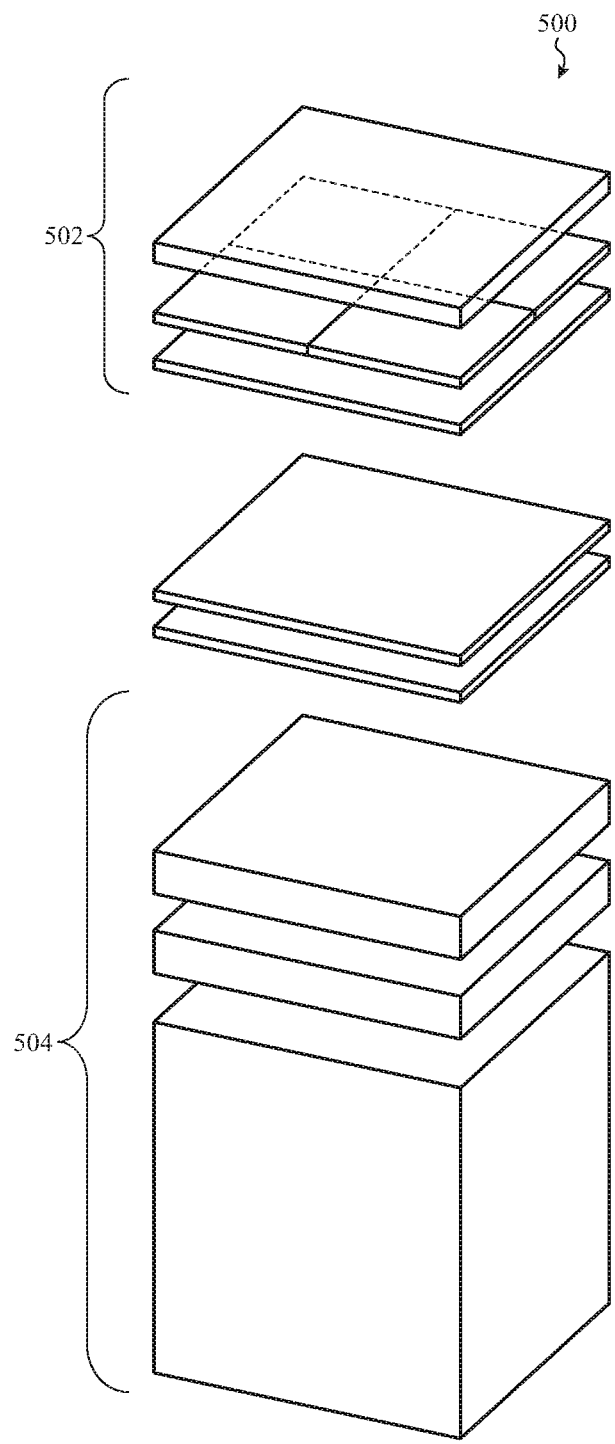

FIG. 5A illustrates another exploded view example of a stacked electromagnetic radiation sensor 500. Similar to the stacked electromagnetic radiation sensors described with reference to FIGS. 1-4C, the stacked electromagnetic radiation sensor 500 may include a first electromagnetic radiation sensor stacked on a second electromagnetic radiation sensor. The stacked electromagnetic radiation sensor 500 may therefore incorporate some or all aspects of the stacked electromagnetic radiation sensors described with reference to FIGS. 1-4C.

As previously discussed, and in some examples, the first electromagnetic radiation sensor may be a visible light sensor, such as an RGB light sensor 502, and the second electromagnetic radiation sensor may be an IR sensor 504. However, each of the first and second electromagnetic radiation sensors may take other forms, as described with reference to FIGS. 1-4C, and as will be described in further detail herein. As illustrated in FIG. 5A, the RGB light sensor 502 may be a silicon-based sensor stacked on a QF IR image sensor.

Similar to FIG. 4A, the RGB light sensor 502 may be a silicon-based RGB light sensor, and may include similar elements as discussed with respect to at least FIG. 4A. The stacked electromagnetic radiation sensor 500 may also include an IR sensor 504, which may include a photosensitive material (e.g., a QF), which may form a QF/silicon heterojunction at and/or around the interface between the QF and a semiconductor substrate (e.g., a silicon substrate) including pixel circuitry for the QF. The QF/silicon heterojunction may be included in an image sensor, and in the example of FIG. 5A may produce a higher quality RGB signal and a higher quality IR signal than an image sensor that employs a Bayer arrangement of color sensors that intersperse RGB and IR filters. The stacked electromagnetic radiation sensor 500 structure may be useful, in some embodiments, for face identification applications. In some examples, face identification may be based on information from an IR image, and depth information which may be generated from machine learning, or information obtained from any other type of depth sensor.

Additionally, the stacked structure of the electromagnetic radiation sensor 500 may assist in controlling flood illumination. The IR flood illumination which may be used for the IR image may be selected to avoid contamination of the silicon RGB pixels. Also, the flood illumination may be in a region of minimal ambient background illumination around approximately 1125 nm and/or 1370 nm. In some examples of stacked structures, the silicon-based RGB sensor may be transmissive to IR radiation. Further, the RGB sensor may be stacked on top of the IR sensor such that the illumination path may pass through the RGB sensor first and then may be received by the IR sensor. Even though the RGB sensor may be adjacent to the IR QF sensor, the contamination of the RGB sensor pixels by the IR illumination, may be reduced or avoided.

Similar to other examples discussed herein, the selection of the QF bandgap may be based on various considerations. In some examples, the QF bandgap may be selected so that the laser and/or diode light sources may operate in compliance with safety requirements, which may further result in higher illumination power and a better signal to noise (SNR) ratio. Another consideration for improving the SNR ratio may be to choose the bandgap of the IR-absorbing QF to be as big or wide as possible. In doing so, the dark current may be reduced which may improve the SNR ratio. In some examples, the QF bandgap may be narrower or smaller than silicon and may be around or smaller than approximately 1.1 eV. Additionally, the QF IR radiation absorber may use less space in the image sensing device, thus allowing more space within the silicon layer for additional circuitry or greater full well capacity within the silicon layer.

The image sensing device of FIG. 5A may be used in various settings including inside of buildings or outside on a sunny day. For exterior settings where sunlight may be present, the electromagnetic radiation or solar spectrum of the sunlight may at least partially contaminate the IR sensor. In this example, the IR-absorbing QF bandgap may be chosen to have a high absorption coefficient at a wavelength where the solar spectrum is at a minimum. The wavelengths for minimizing the absorption of the solar spectrum may include wavelengths approximately at or around 940 nm, 1125 nm, 1370 nm, and/or 1550 nm. In FIG. 5A, the QF IR sensor may utilize an approximate wavelength or approximate range of wavelengths greater than 1100 nm which may assist in minimizing the solar background illumination that reaches the IR sensor. Additionally, wavelengths greater than approximately 940 nm may have lower irradiance limitations for laser compliance standards which may allow for stronger or higher power emitters. Further, using longer wavelengths may minimize skin reflectance as compared to using shorter wavelength absorbing quantum dot films.

Figure 5B:
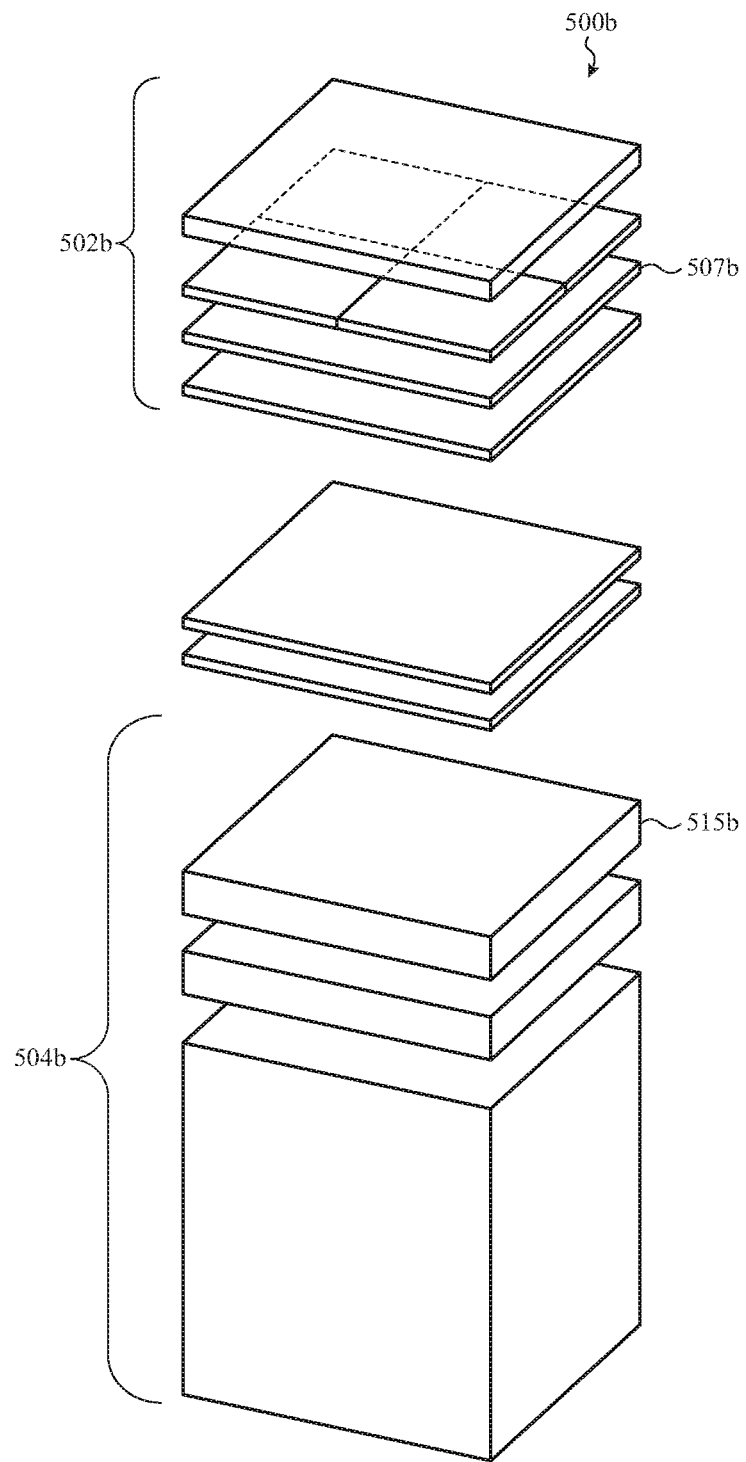

FIG. 5B illustrates yet another exploded view example of a stacked electromagnetic radiation sensor 500b. Similar to the electromagnetic radiation sensor described with reference to FIGS. 1-5A, the electromagnetic radiation sensor 500b may include a first electromagnetic radiation sensor stacked on a second electromagnetic radiation sensor. The stacked electromagnetic radiation sensor 500b may therefore incorporate some or all aspects of the stacked electromagnetic radiation sensors described with reference to FIGS. 1-5A.

As previously discussed and in some examples, the first electromagnetic radiation sensor may be a visible light sensor, such as an RGB light sensor 502b, and the second electromagnetic radiation sensor may be an IR sensor 504b. Each of the first and second electromagnetic radiation sensors may take other forms, as described with reference to FIGS. 1-5A and as will be described in further detail herein. As illustrated in FIG. 5B, a QF RGB sensor may be stacked on a QF IR sensor. In FIG. 5B, the QF IR sensor may utilize an approximate wavelength or approximate range of wavelengths greater than 940 nm which may assist in minimizing the solar background illumination which may reach the IR sensor.

The IR-absorbing QF bandgap of FIG. 5B may be chosen to have a high absorption coefficient at a wavelength where the solar spectrum is at a minimum. The wavelengths for minimizing the absorption of the solar spectrum may include wavelengths approximately at or around 940 nm, 1125 nm, 1370 nm, and/or 1550 nm. In FIG. 5B, the QF IR image sensor may utilize an approximate wavelength or approximate range of wavelengths greater than 940 nm which may assist in minimizing the solar background illumination that reaches the IR sensor.

FIG. 5B may include an RGB light sensor 502b, but instead of a silicon-based RGB sensor as depicted in FIG. 5A, FIG. 5B may include a QF 507b RGB sensor. In FIG. 5B, the bandgap of the top RGB QF layer may be selected to be small or narrow enough to absorb the visible color spectrum up to approximately 700 nm, but may be wider than the bandgap of the bottom IR-absorbing QF layer. The bandgap may be selected in such a way so that electromagnetic radiation or light which may be used in the IR image acquisition may not be absorbed by the RGB QF sensor. Additionally, FIG. 5B may include similar elements to FIGS. 4A-5A, and similarly numbered elements depicted in FIGS. 4A-5A may share similar properties in some examples.

The IR sensor 504b may include a QF 515b, which may form a QF/silicon heterojunction at and/or around the interface between the two materials. Further, the QF/silicon heterojunction may be implemented as a tunable bandgap device which may be used for IR image acquisition. In the example of FIG. 5B, the bandgap of the QF IR sensor layer may be narrower or smaller than silicon and may be less than approximately 1.1 eV. The QF bandgap of less than approximately 1.1 eV may reduce and/or eliminate parasitic light sensitivity in the silicon circuitry.

Implementing a photodetector array using a photosensitive material (or panchromatic photosensitive layer) that is separate from its supporting pixel circuitry, as shown in FIGS. 3A-3B, 4A-4C, and 5A and 5B, may interfere with the inherent capability of a silicon-based photodetector array to cancel (or reduce) kTC noise during charge (photo charge) readout. For example, movement of a photodiode from a silicon semiconductor containing pixel circuitry (e.g., charge accumulation and readout circuitry, or "readout" circuitry), to a separate semiconductor, may interfere with the reduction of kTC noise based on correlated double sampling (CDS).

Contrary to the requirements of typical stacked BSI image sensors, the semiconductor substrate that includes pixel circuitry for a separate photosensitive material may include both p-channel metal-oxide semiconductor (PMOS) and n-channel metal-oxide semiconductor (NMOS) transistors without particular degradation of photodetector performance, because photo-conversion happens in the separate material. As mentioned earlier, pixelation of a material may be determined by the distribution of electrical contacts on its electromagnetic radiation emission surface. In some examples, each pixel may have one such electrical contact, which may be electrically connected to a silicon diffusion node (or sense node (SN)) in the pixel's pixel circuitry (or readout circuitry) through one or more (e.g., a stack of) metal interconnections. Charges generated in the photosensitive material may be accumulated on the capacitance formed by the electrical contact defining the pixel, a metal stacked via connected to the electrical contact, and the SN and any parasitic capacitance coupled to these structures. Ideally, for efficient collection and before the start of charge integration, the SN needs to be reset to a high potential (for collecting electrons) or a low potential (for collecting holes). However, a drawback of the above-described charge accumulation structure is that the presence of a metal in direct contact with the charge integration node precludes this potential well from being fully depleted of charges when reset happens. As a consequence, the classic operation of CDS and reset, which is widely used for kTC noise reduction in 4 T silicon rolling shutter image sensors, cannot be performed.

Figure 6A:
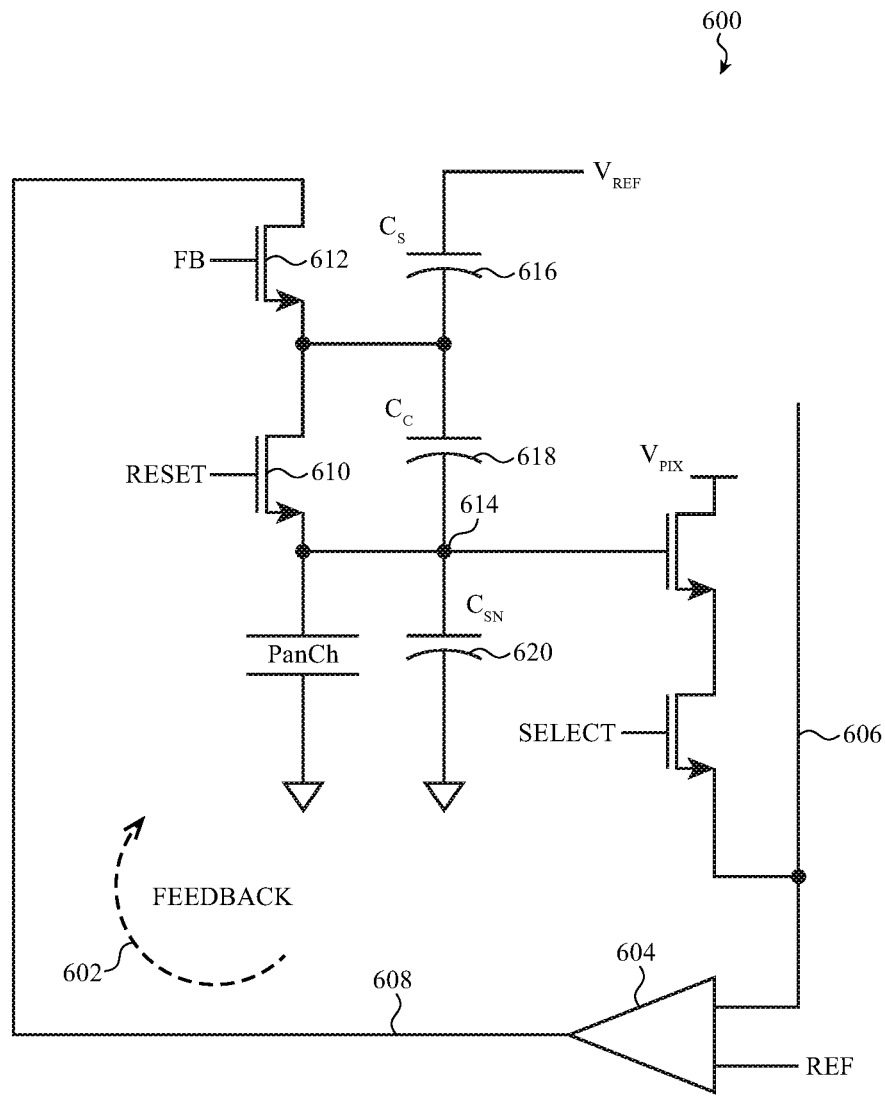
FIGS. 6A-6C show various options for reducing kTC noise when implementing a photodetector array using a photosensitive material (or panchromatic photosensitive layer) that is separate from a semiconductor substrate including its supporting pixel circuitry.
Figure 6B:
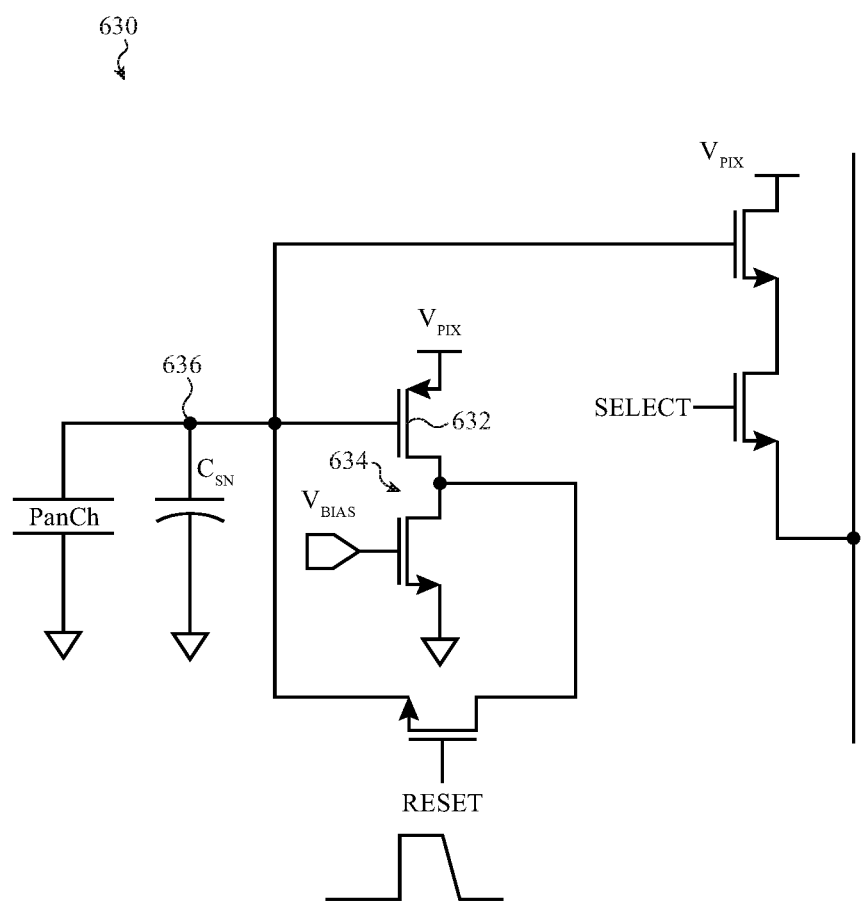
Figure 6C:
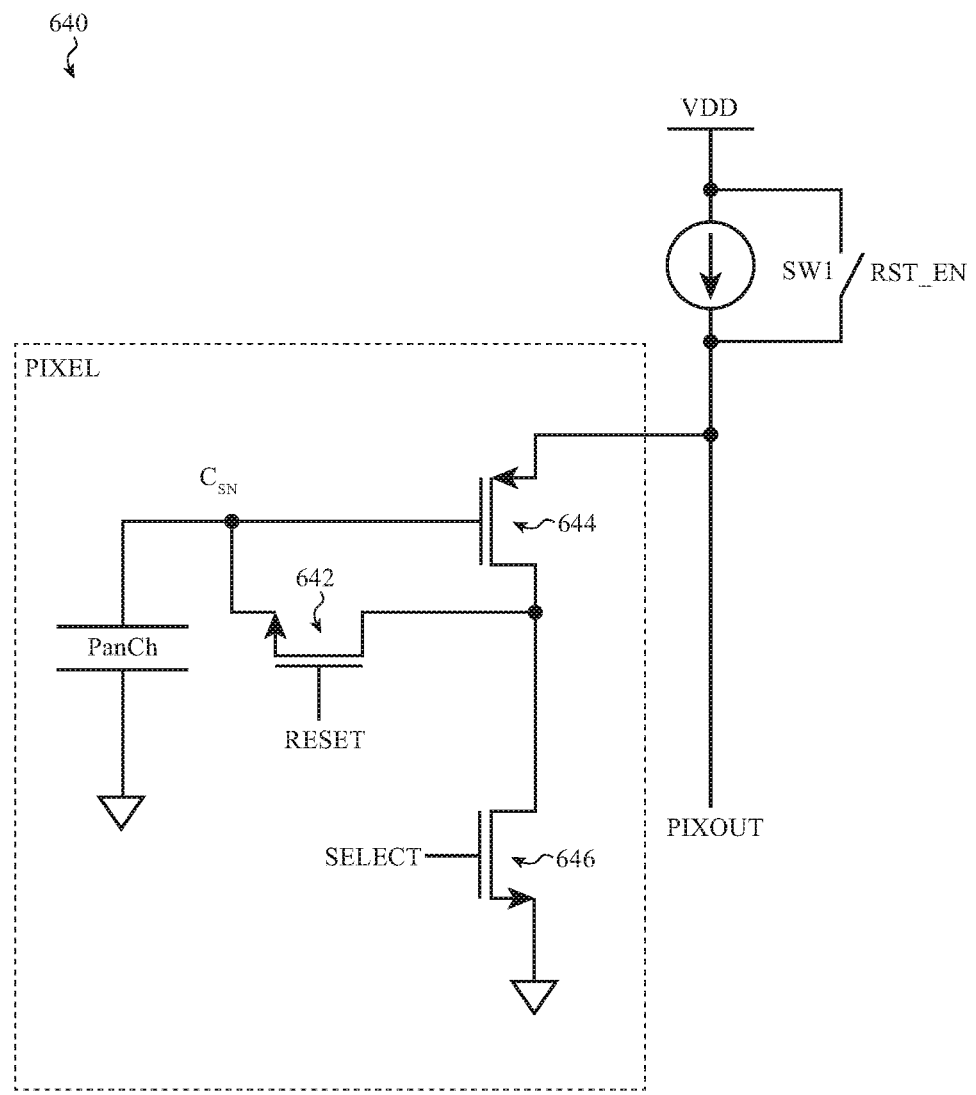

FIGS. 6A-6C show various options for reducing kTC noise when implementing a photodetector array using a photosensitive material (or panchromatic photosensitive layer (PanCh)) that is separate from a semiconductor substrate including its supporting pixel circuitry. The noise reduction circuits described with reference to FIGS. 6A-6C may be included as part of the pixel circuitry in the semiconductor substrate. The noise reduction circuits may be used, for example, in visible light sensors or IR sensors, and when used in a visible light sensor or other sensor stacked on an IR sensor may (in some embodiments) include components that are transmissive to IR radiation or other types of electromagnetic radiation.

FIG. 6A shows an example of an in-column noise reduction circuit 600 (i.e., a noise reduction circuit that may be used to provide noise reduction for the pixels in a column (or row) of a pixel array). In the circuit 600, a feedback loop 602 in which a column amplifier 604 has inputs connected to a column readout line 606 and a reference voltage (REF), and an output 608 that provides a voltage to a reset transistor 610 under control of a feedback transistor 612, is used to regulate the voltage of the integrating node 614 during reset. Two capacitors 616, 618 per pixel are needed to reduce actual reset noise. The attenuation of the reset noise is a function of the loop gain A and the value of the two capacitors ($C_S$ 616 and $C_C$ 618), and is equal to $1/\mathrm{sqrt}(A*C_S/C_C)$ and to $1/(A*C_C/C_{SN})$. To obtain good noise reduction, the size of the capacitors $C_S$ 616 and $C_C$ 618 should be of the order of 10× $C_{SN}$ 620, so typically on the order of 10-50 fF. Although this solution can provide very good noise reduction performance, it may not always provide enough IR transparency, because implementing larger IR-transparent capacitors either in metal (with metal-insulator-metal (MiM) or 3D structures) or in silicon (with trench capacitors) without blocking IR radiation is challenging and may in some cases require pixels to be larger than desired.

FIG. 6B shows an example of an in-pixel noise reduction circuit 630. The circuit 630 can provide good kTC noise reduction with relatively few devices (e.g., relatively few transistors) per pixel, and enables pixels in multiple rows to be reset at the same time. However, the circuit 600 may require a larger and higher power PMOS transistor 632 (in addition to smaller and lower power NMOS transistors) to reduce pixel readout time.

Leveraging the fact that both NMOS and PMOS can exist in the readout circuitry of a semiconductor substrate that supports a photosensitive material, the amplifier 634 for the feedback circuit is moved from the column to the pixel in the circuit 630. Each pixel has a dedicated CMOS amplifier 634 which can be used during reset to regulate the voltage at the integrating node 636. Also in the circuit 630, the in-pixel capacitors shown in FIG. 6A can be dropped, because of the locality of the feedback, but at the expense of possibly lower noise reduction. The implementation of the CMOS amplifier 634 uses a per-pixel n-well. This can limit the minimum pixel size, depending on the implementation technology. However, the locality of the feedback can provide fast reset times, as the bandwidth of the reset loop is not limited by the long column lines of the circuit shown in FIG. 6A.

FIG. 6C shows an example pixel-column noise reduction circuit 640. The circuit 640 can provide good kTC noise reduction, and may be implemented using fewer components than the circuits described with reference to FIGS. 6A and 6B (e.g., only three transistors 642, 644, 646 per pixel). The circuit 640 may also enable smaller pixel sizes than the circuits described with reference to FIGS. 6A and 6B.

By leveraging the column readout transistors, the pixel source follower and select transistors 644, 646 can be reconfigured to act as a common source amplifier. The trade-off for a smaller pixel, however, may be a more complex read circuit and the inability to reset multiple pixels on the same read bus at the same time. If this trade-off is acceptable, the circuit 640 offers noise reduction with a minimum number of transistors and no capacitors, which can maximize the IR radiation transmissivity for even small pixels.

As an alternative to the kTC noise reduction circuits described with reference to FIGS. 6A-6C, kTC noise reduction that does not impact in-pixel circuitry at all, but is instead implemented on the system side, may be used. One option is digital CDS. In this mode, all pixels are reset in a rolling shutter fashion, and the reset levels are converted by the ADCs at the edge of the array and stored in a frame of memory somewhere in an image sensor or image signal processor (ISP). After a programmable time, controlled by the exposure control, all pixels may be readout in a rolling shutter fashion, and each reset level may be digitally subtracted on-chip or in the ISP. This technique completely removes kTC noise contributions, in exchange for higher implementation area and power consumption to operate the frame of memory. However, kTC noise reduction on the system side provides the best IR radiation transparency within the pixel circuitry.

Figure 7A:
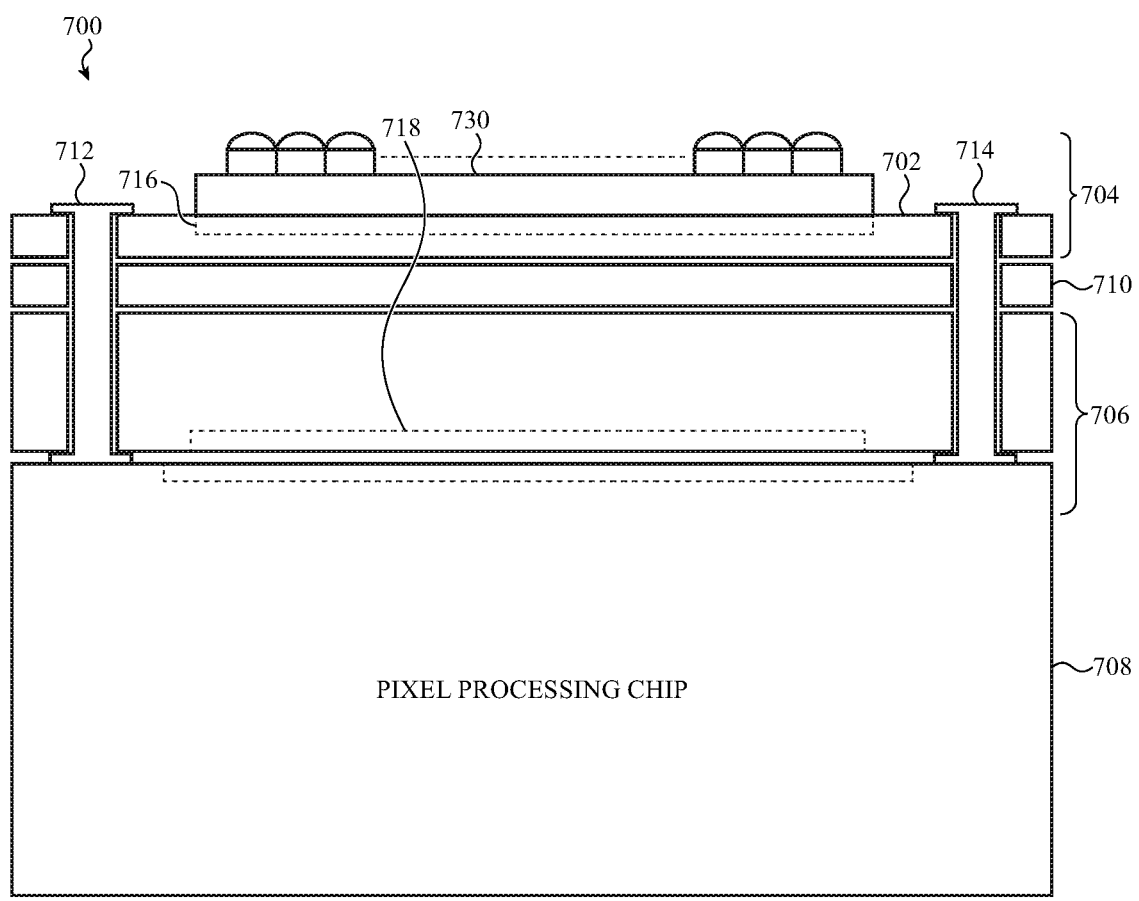
FIGS. 7A and 7B show example elevations of a stacked electromagnetic radiation sensor, and more particularly, show examples of interconnections between the pixel circuitry of an RGB light sensor (or other visible light sensor) stacked on an IR sensor and a pixel processing chip.
Figure 7B:
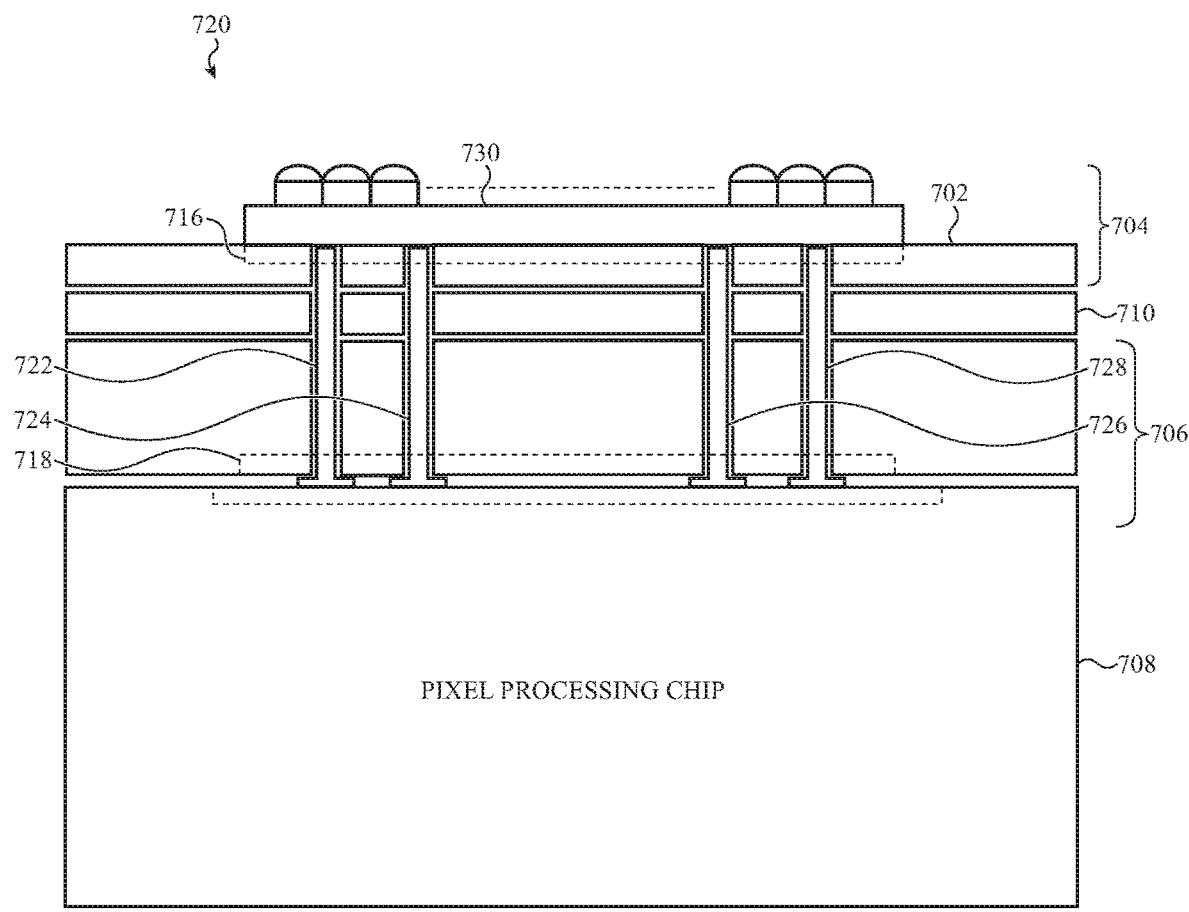

FIGS. 7A and 7B show example elevations of a stacked electromagnetic radiation sensor 700 (FIG. 7A) or 720 (FIG. 7B), and more particularly, show examples of interconnections between the pixel circuitry 702 of an RGB light sensor 704 (or other visible light sensor) stacked on an IR sensor 706 and a pixel processing chip 708. As shown, components of the IR sensor 706, and optionally other components 710 (e.g., focusing elements and/or a visible light blocking filter), may be disposed between the pixel circuitry 702 and the pixel processing chip 708. The RGB light sensor 704 may or may not have a photosensitive material (e.g., layer 730) that is separate from a semiconductor substrate including pixel circuitry. Similarly, the IR sensor 706 may or may not have a photosensitive material (not shown) that is separate from a semiconductor substrate including pixel circuitry.

In FIG. 7A, the pixel circuitry 702 of the RGB light sensor 704 may be electrically connected to circuitry in the pixel processing chip 708 using TSVs (including TSVs 712 and 714) routed through the components/layers disposed between the pixel circuitry 702 and the pixel processing chip 708. The TSVs 712, 714 may be located outside of the pixel arrays 716, 718 for the RGB light sensor 704 and IR sensor 706, and disposed about the periphery of the pixel circuitry 702. In some embodiments, this architecture may be implemented with coordinate addressing of the pixels in the pixel circuitry 702. Connections between the transistors of individual pixels and shared TSVs 712, 714 may be made using horizontal and vertical buses, which buses may be transparent to IR radiation. Examples of materials that can be used for the horizontal and vertical buses include ITO, polysilicon, and so on. Similar materials can be used for local connections between the transistors and/or other components of individual pixels.

In FIG. 7B, the pixel circuitry 702 of the RGB light sensor 704 is also electrically connected to circuitry in the pixel processing chip 708 using TSVs 722, 724, 726, 728 routed through the components/layers disposed between the pixel circuitry 702 and the pixel processing chip 708. However, in FIG. 7B, the TSVs 722, 724, 726, 728 connect the pixel circuitry of individual pixels in the RGB light sensor 704, or groups of pixels in the RGB light sensor 704 702, to the pixel processing chip 708. In this case, the TSVs 722, 724, 726, 728 may be located within the pixel arrays 716, 71 of the RGB light sensor 704 and IR sensor 706. Local connections between the transistors and/or other components of individual pixels may be are made using materials that are transparent to IR radiation.

When the pixels in the IR sensor 706 have a size that is an integer multiple of the pixels in the RGB light sensor 704, the TSVs 722, 724, 726, 728 may be positioned along the boundaries of the pixels in the IR sensor 706, to minimize any tendency the TSVs 722, 724, 726, 728 have to block IR radiation. Alternatively, the TSVs may be positioned in other ways.

In some embodiments, the interconnect option shown in FIG. 7A may be implemented with coordinate addressing of the RGB light sensor's pixels, and may need low resistance buses to achieve high frame rate operation of the RGB light sensor 704 (or the RGB light sensor may need to achieve high frame rate operation for other reasons). The interconnection approach shown in FIG. 8A may be used in combination with the interconnect option shown in FIG. 7A, providing a combination of low resistance (and possibly non-transparent) metal buses for groups of pixels in the RGB light sensor 704, and transparent local connections within a groups of pixels in the RGB light sensor 704. Alternatively, all signal routes between pixels and TSVs may be formed using transparent materials.

Figure 8A:
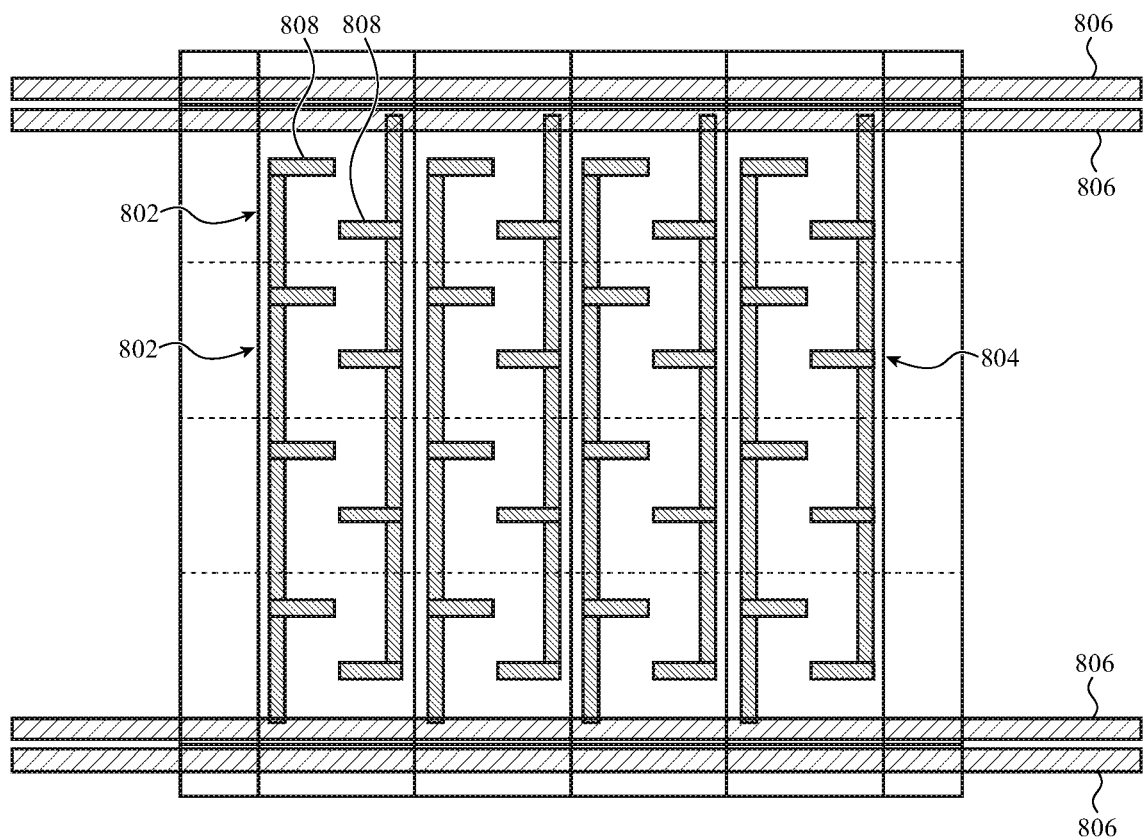
FIG. 8A shows an interconnection approach that may be used in combination with the interconnect option shown in FIG. 7A, providing a combination of low resistance metal buses for groups of pixels in the RGB light sensor, and transparent local connections within a groups of pixels in the RGB light sensor.

As shown in FIG. 8A, a pixel 802 of the RGB light sensor 704 may be smaller than a pixel 804 of the IR sensor 706. A ratio of 4-1, 16-1 (as shown), or other ratio of RGB-IR pixels may be useful, and may be especially useful when the IR sensor 706 is a ToF sensor.

Low-resistance buses 806 for providing coordinate addressing for a cluster of RGB pixels 802 (e.g., metal buses) may be located at the periphery of an IR pixel 804. Placing low-resistances buses 806, which are typically metal and non-transparent, on the periphery of an IR pixel 804 may not significantly affect the amount of IR radiation received by the IR pixel 804, because the periphery of the IR pixel 804 is not typically an IR-sensitive area of IR pixel 804.

Although only a few horizontal low-resistance buses 806 are shown in FIG. 8A, a full-size RGB pixel array may have many more buses, including both horizontal and vertical buses, that connect to all of the pixels within a pixel array, and in some cases run the entire length or width of the pixel array. The low-resistance buses 806 may be used to connect individual pixels 802 to respective TSVs disposed around the periphery of the RGB pixel array.

Transparent buses 808 may locally connect RGB pixels 802 within a group of RGB pixels 802. The lengths of the transparent buses 808 may be small in comparison to the lengths of the low-resistance buses 806, and thus forming the transparent buses 808 using higher resistance materials (e.g., ITO, polysilicon, and so on) may have a relatively small impact on signal settling times and pixel readout times.

Figure 8B:
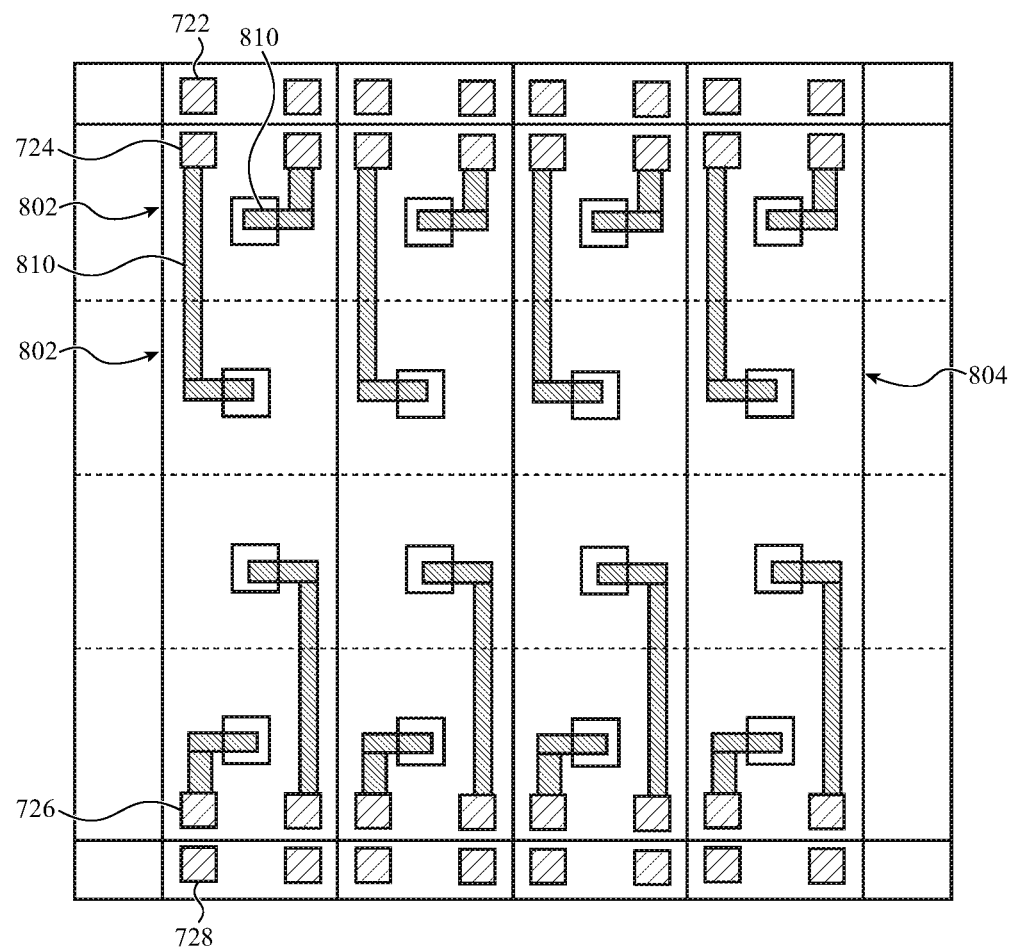
FIG. 8B shows the arrangement of RGB pixels and IR pixel shown in FIG. 8A, but with TSVs routed around the IR pixel, within the pixel array of the IR sensor.

FIG. 8B shows the arrangement of RGB pixels 802 and IR pixel 804 shown in FIG. 8A, but with TSVs 722, 724, 726, 728 routed around the IR pixel 804, within the pixel array of the IR sensor, as described with reference to FIG. 7B. The interconnect shown in FIG. 8B combines low-resistance TSVs 722, 724, 726, 728 at the periphery of the IR pixel 804, with transparent buses 810 that locally interconnect the TSVs 722, 724, 726, 728 and the pixel circuitry of the RGB pixels 802.

Figure 9A:
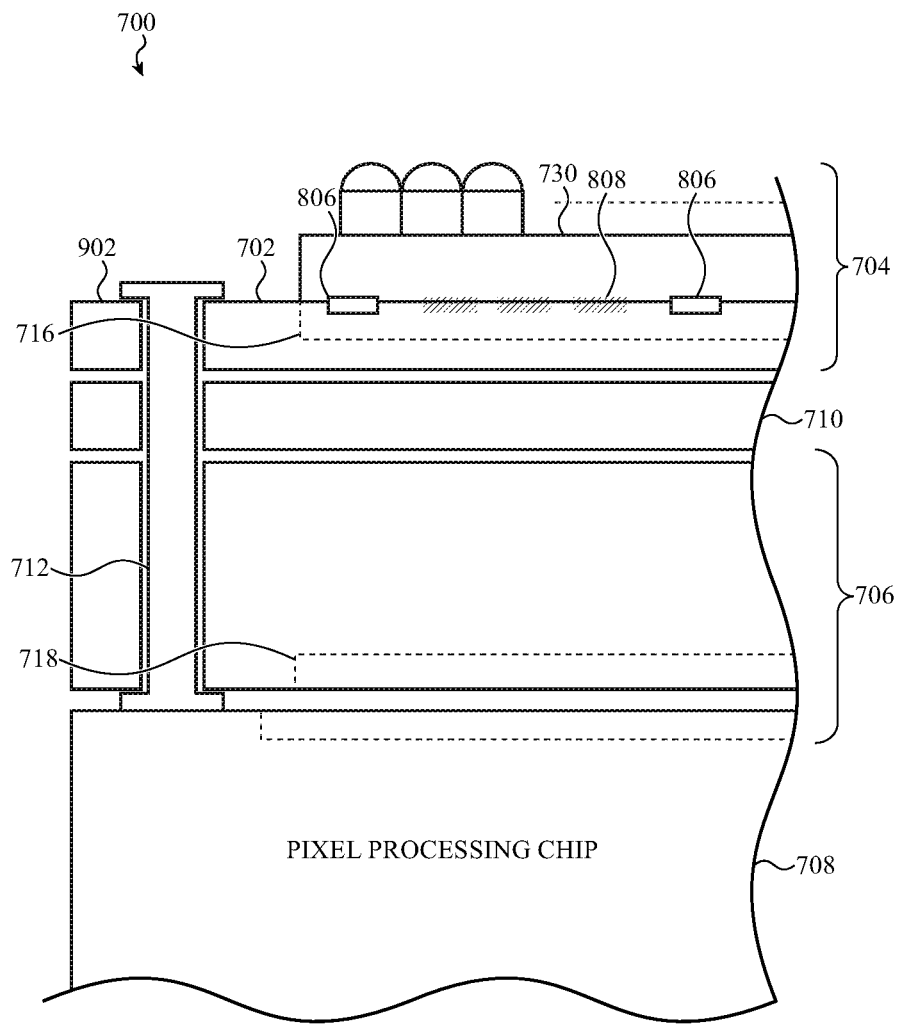
FIGS. 9A-9C show a portion of the stacked electromagnetic radiation sensor shown in FIG. 7A, with additional interconnect options for routing signals to/from the RGB pixels of the pixel circuitry in the RGB light sensor.
Figure 9B:
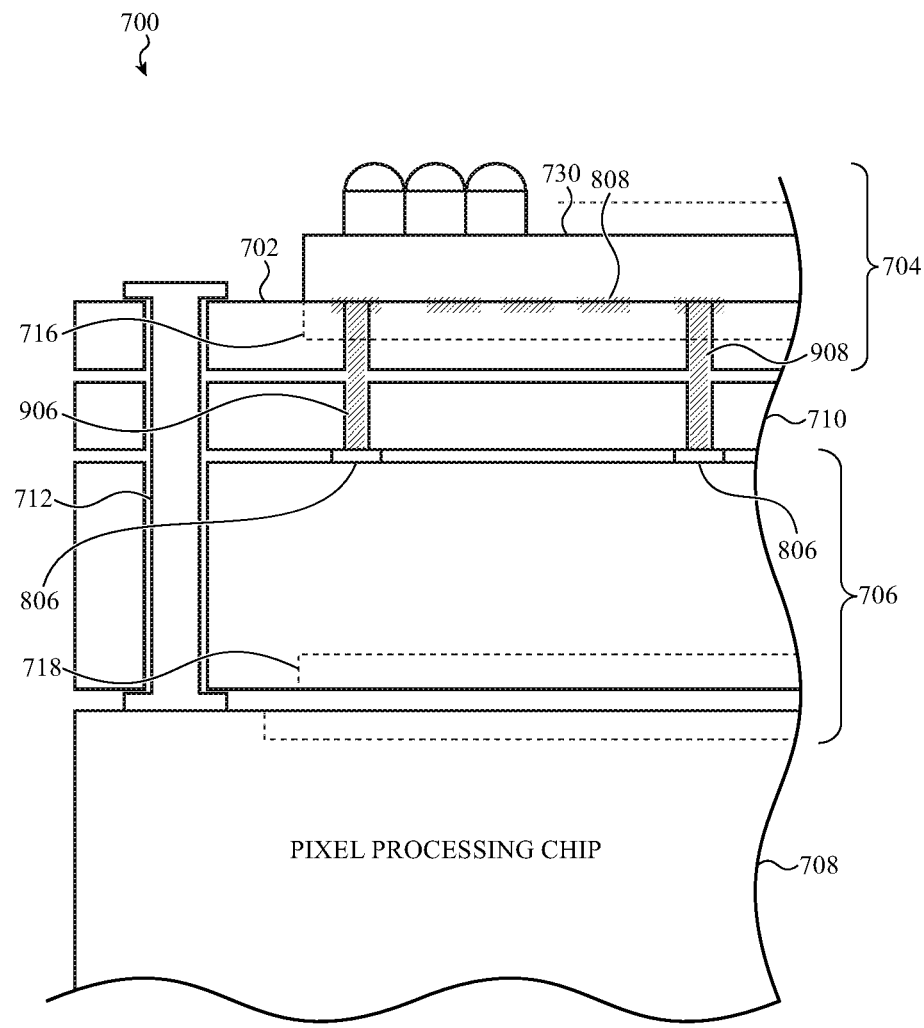
Figure 9C:
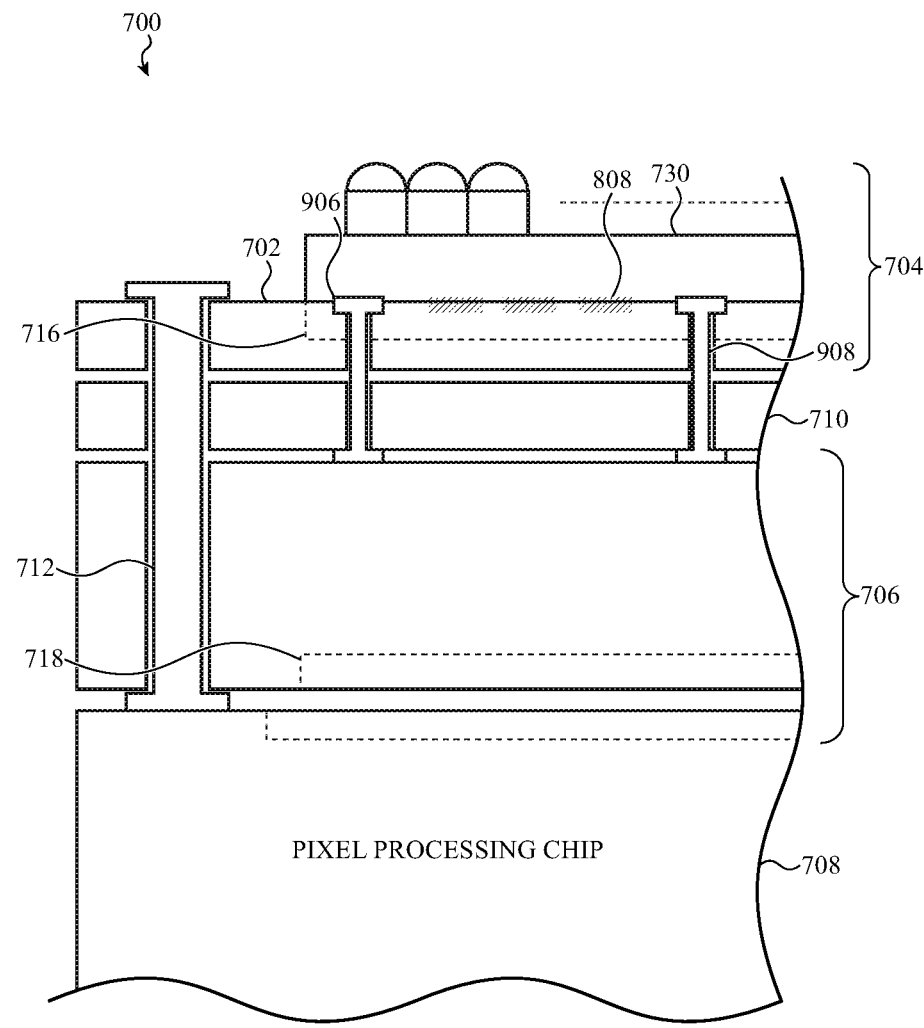

Each of FIGS. 9A-9C show a portion of the stacked electromagnetic radiation sensor 700 shown in FIG. 7A, with additional interconnect options for routing signals to/from the RGB pixels of the pixel circuitry 702 in the RGB light sensor 704. FIG. 9A shows an example interconnect option in which the low-resistance buses 806 and transparent buses 808 of FIG. 8A are both disposed on an electromagnetic radiation-receiving surface 902 of the pixel circuitry 702 of the RGB light sensor 704.

FIG. 9B shows an example interconnect option in which the transparent buses 808 are disposed on the electromagnetic radiation-receiving surface 902 of the pixel circuitry 702, and the low-resistance buses 806 are disposed on an electromagnetic radiation-receiving surface 904 of the pixel circuitry of the IR sensor 706 (e.g., on an electromagnetic radiation-receiving surface of a BSI layer). In this example, the transparent buses 808 may be electrically coupled to the low-resistance buses 806 by TSVs 906, 908 extending through the RGB pixel circuitry 702 and other components 710 disposed between the RGB light sensor 704 and IR sensor 706. The TSVs 906, 908 may be formed of a transparent or at least partially transmissive material (e.g., ITO or polysilicon). Moving the low-resistance buses 806 closer to the IR sensor 706 and forming the TSVs of a transparent material may in some cases enable more IR radiation to reach the IR sensor 706. The low-resistance buses 806 may be electrically coupled to the TSVs 712, 714 around the periphery of the pixel circuitry 702 by low-resistance conductive traces (e.g., metal traces). When all of the electrical connections between the pixel circuitry 702 and TSVs 712, 714 are provided on the surface 904 of the pixel circuitry 702, the TSVs 712, 714 may in some cases only extend between the pixel processing chip 708 and the surface 904.

FIG. 9C shows an example interconnect option that is similar to the interconnect option shown in FIG. 9B. However, the TSVs 906, 908 coupling the transparent buses 808 to the low-resistance buses 806 are formed of a non-transparent material (e.g., metal). Moving the low-resistance buses 806 closer to the IR sensor 706 and forming the TSVs of a non-transparent material may in some cases help to mitigate optical crosstalk between IR pixels as IR radiation is scattered while passing through the RGB light sensor 704.

FIGS. 10-13L illustrate various configurations for the electrical contacts that connect pixel circuitry in a semiconductor substrate (e.g., a silicon substrate) to a separate photosensitive material (or other panchromatic photosensitive layer). The electrical contacts between pixel circuitry and a photosensitive material (e.g., contacts between the pixel circuitry and photosensitive material shown in any of the electromagnetic radiation sensors described with reference to any of FIG. 3A-3B, 4A-4C, 5A-5B, 7A-7B, or 9A-9C) may in some cases be configured such that they provide carrier-selective Ohmic contact to the photosensitive material (or panchromatic photosensitive layer). In the case of a visible light sensor stacked on an IR sensor, the electrical contacts may also be highly transparent to the IR radiation (e.g., near infrared (NIR) radiation) sensed by the IR sensor. The electrical contacts may be either e− selective (ETL) or h+ selective (HTL), depending on the availability of suitable materials and the design of the pixel circuitry. Whichever type of electrical contact is chosen for connecting the pixel circuitry to the photosensitive material, the opposite type of electrical contact may be used for the common electrode (e.g., the common electrode 312 described with reference to FIG. 3B) connected to the electromagnetic radiation-receiving surface of the photosensitive material. In the case of a visible light sensor (or electromagnetic radiation sensor on top of a stack), the electrical contacts or electrodes connected to both surfaces of the photosensitive material should have high transparency to the IR radiation sensed by the IR sensor stacked below the visible light sensor (or electromagnetic radiation sensor on the bottom of the stack), and the electrical contact or electrode connected to the electromagnetic radiation-receiving surface of the photosensitive material should also have a high transparency to visible (e.g., RGB) light.

Figure 10:
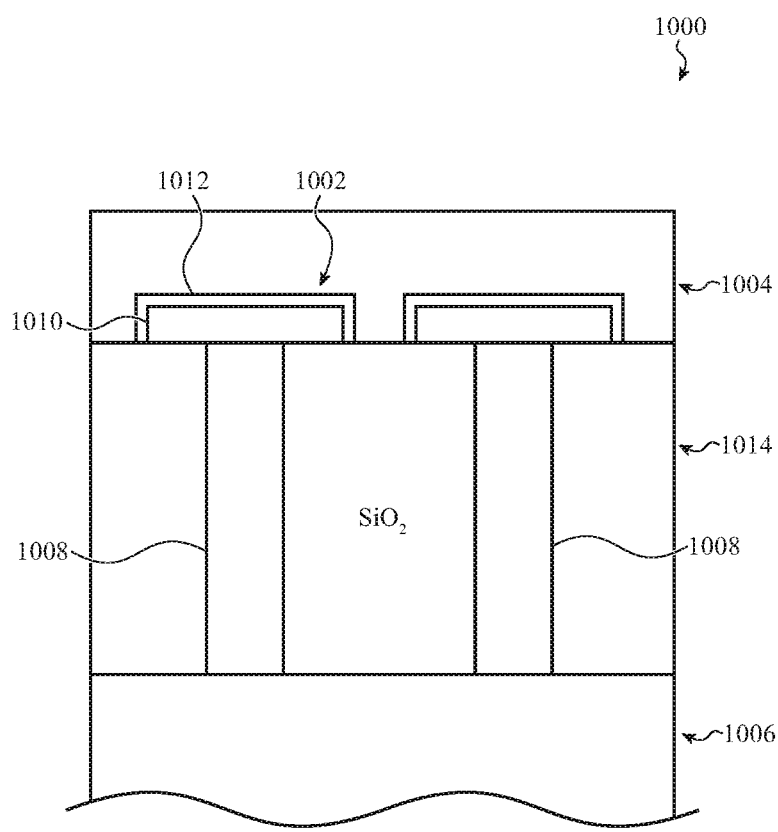
FIG. 10 shows a first example configuration of an electrical contact for connecting a photosensitive material (or other panchromatic photosensitive layer) to pixel circuitry.

FIG. 10 shows a first example configuration 1000 of an electrical contact 1002 for connecting a photosensitive material (or other panchromatic photosensitive layer) 1004 to pixel circuitry 1006. Vias 1008 may be formed in a silicon dioxide ($SiO_2$) layer 1014 and electrically connect the electrical contacts 1002 to metallization (e.g., conductors) of the pixel circuitry 1006. The vias 1008 may be formed in the $SiO_2$ layer 1014 using an IR-transparent material, such as an IR-transparent amorphous silicon (a-Si).

The electrical contact 1002 may be a multi-layer electrical contact, and may include a first layer 1010 of ITO or aluminum-doped-zinc-oxide (AZO), capped with a second layer 1012 configured as an e− transport layer (ETL) or h+ transport layer (HTL) to make Ohmic and carrier-selective contact to the photosensitive material 1004.

When the second layer 1012 is an ETL, such that the electrical contact 1002 is configured to collect electrons (e−), the first layer 1010 may be either a deep work function transparent metal, including ITO, or a shallow work function transparent metal, including AZO. Note that a shallow work function material like AZO may be more favorable for Ohmic contact, though a deep work function metal like ITO may be used if the ETL second layer 1012 is sufficiently doped so that the barrier formed at the ETL/ITO interface is thin enough for carrier tunneling.

When the second layer 1012 is an HTL, such that the electrical contact 1002 is configured to collect holes (h+), the first layer 1010 may again be either a deep or shallow work function transparent metal.

Figure 11:
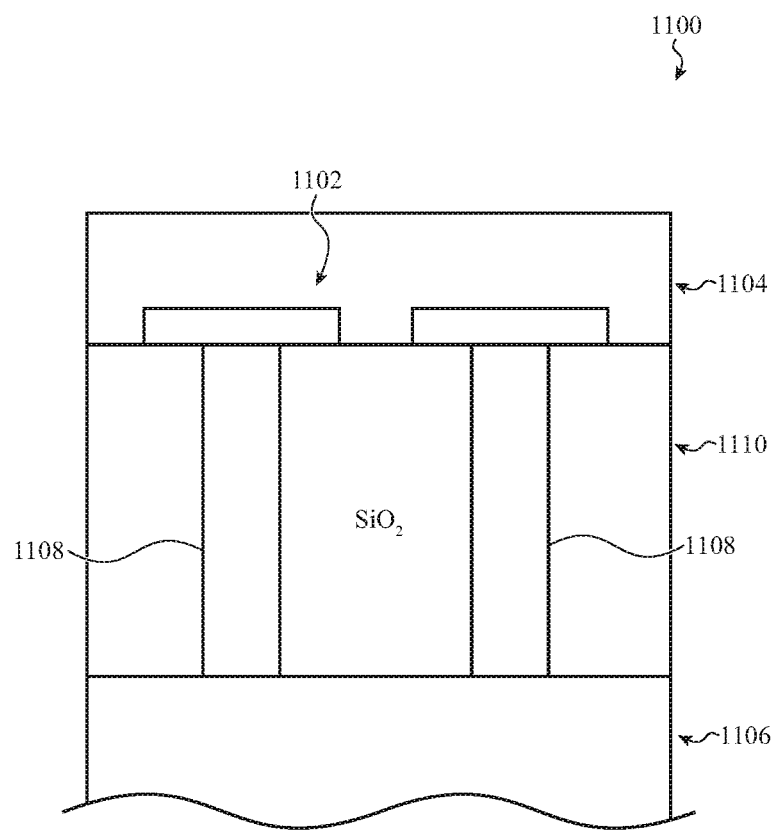
FIG. 11 shows a second example configuration of an electrical contact for connecting a photosensitive material (or other panchromatic photosensitive layer) to pixel circuitry.

FIG. 11 shows a second example configuration 1100 of an electrical contact 1102 for connecting a photosensitive material (or other panchromatic photosensitive layer) 1104 to pixel circuitry 1106. Vias 1108 may be formed in a SiO2 layer 1110 and electrically connect the electrical contacts 1102 to metallization (e.g., conductors) of the pixel circuitry 1106. The vias 1108 may be formed in the SiO$_2$ layer 1110 using an IR-transparent material, such as an IR-transparent amorphous silicon (a-Si).

The electrical contact 1102 may be a single-layer electrical contact, and may formed using AZO, which may provide an e− transport layer (ETL) to make Ohmic and carrier-selective contact to the photosensitive material 1104.

Figure 12:
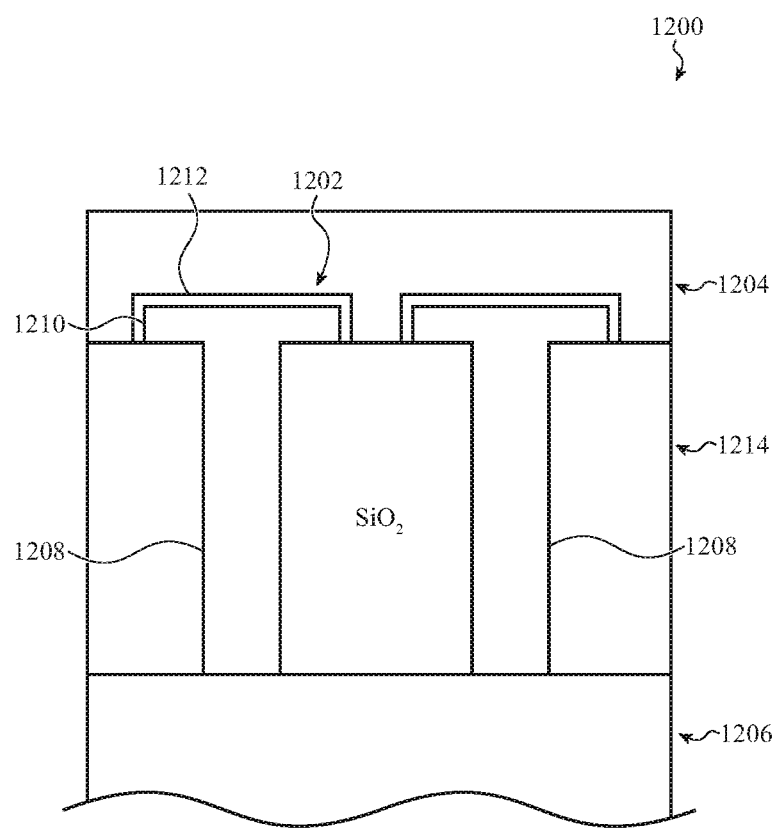
FIG. 12 shows a third example configuration of an electrical contact for connecting a photosensitive material (or other panchromatic photosensitive material) to pixel circuitry.

FIG. 12 shows a third example configuration 1200 of an electrical contact 1202 for connecting a photosensitive material (or other panchromatic photosensitive material) 1204 to pixel circuitry 1206. Vias 1208 may be formed in a SiO$_2$ layer 1214 and electrically connect the electrical contacts 1202 to metallization (e.g., conductors) of the pixel circuitry 1206. The vias 1208 may be formed in the SiO$_2$ layer 1214 using an IR-transparent material, such as an IR-transparent amorphous silicon (a-Si).

The electrical contact 1202 may be a multi-layer electrical contact, and may include a first layer 1210 of the same IR-transparent amorphous silicon used to form the vias 1208, capped with a second layer 1212 configured as an e− transport layer (ETL) or h+ transport layer (HTL) to make Ohmic and carrier-selective contact to the photosensitive material 1204. In this configuration, the a-Si may be selected to minimize any Ohmic voltage loss across the dimensions of the electrical contact 1202.

When the second layer 1212 is an ETL, such that the electrical contact 1202 is configured to collect electrons (e−), the first layer 1210 may be an n-doped a-Si. In an alternative embodiment, an n-doped a-Si with an energy level aligned to the photosensitive material 1204 may be used without the second layer 1212 (and may function as an ETL itself).

When the second layer 1212 is an HTL, such that the electrical contact 1202 is configured to collect holes (h+), the first layer 1210 may be a p-doped a-Si. In an alternative embodiment, a p-doped a-Si with an energy level aligned to the photosensitive material 1204 may be used without the second layer 1212 (and may function as an HTL itself).

In the interconnect configurations shown in FIGS. 10-12, suitable ETL materials include zinc oxide (ZnO), titanium dioxide (TiO$_2$), niobium-doped titanium oxide (Nb:TiO2), tin(IV) oxide (SnO$_2$), tin-doped titanium dioxide (Sn:TiO$_2$), or aluminum-doped zinc oxide (Al:ZnO, or AZO). Also in the interconnect configurations shown in FIGS. 10-12, suitable HTL materials include molybdenum trioxide (MoO$_3$), tungsten trioxide (WO$_3$), vanadium pentoxide (V$_2$O$_5$), nickel(II) oxide (NiO), copper thiocyanate (CuSCN), copper(II) oxide (CuO), or tin-doped indium oxide (Sn:In$_2$O$_3$, or ITO).

Also in the interconnect configurations shown in FIGS. 10-12, the vias that connect to electrical contacts on the bottom surface of a photosensitive material in a visible light sensor (or electromagnetic radiation sensor on top of a stack), and extend through a semiconductor substrate of the visible light sensor, may be formed using amorphous silicon and/or other conductive materials that have high transparency to the IR radiation (e.g., NIR radiation) sensed by an IR sensor stacked below the visible light sensor. Amorphous silicon can be a suitable option because it has a wider band gap than crystalline silicon, and it has good transparency in the NIR wavelength range. It can also be doped heavily as either or both of an n-type or p-type material, to provide high conductivity, and there are well-developed processes for filling high aspect ratio vias formed of amorphous silicon in conventional CMOS processing.

Figure 13A:
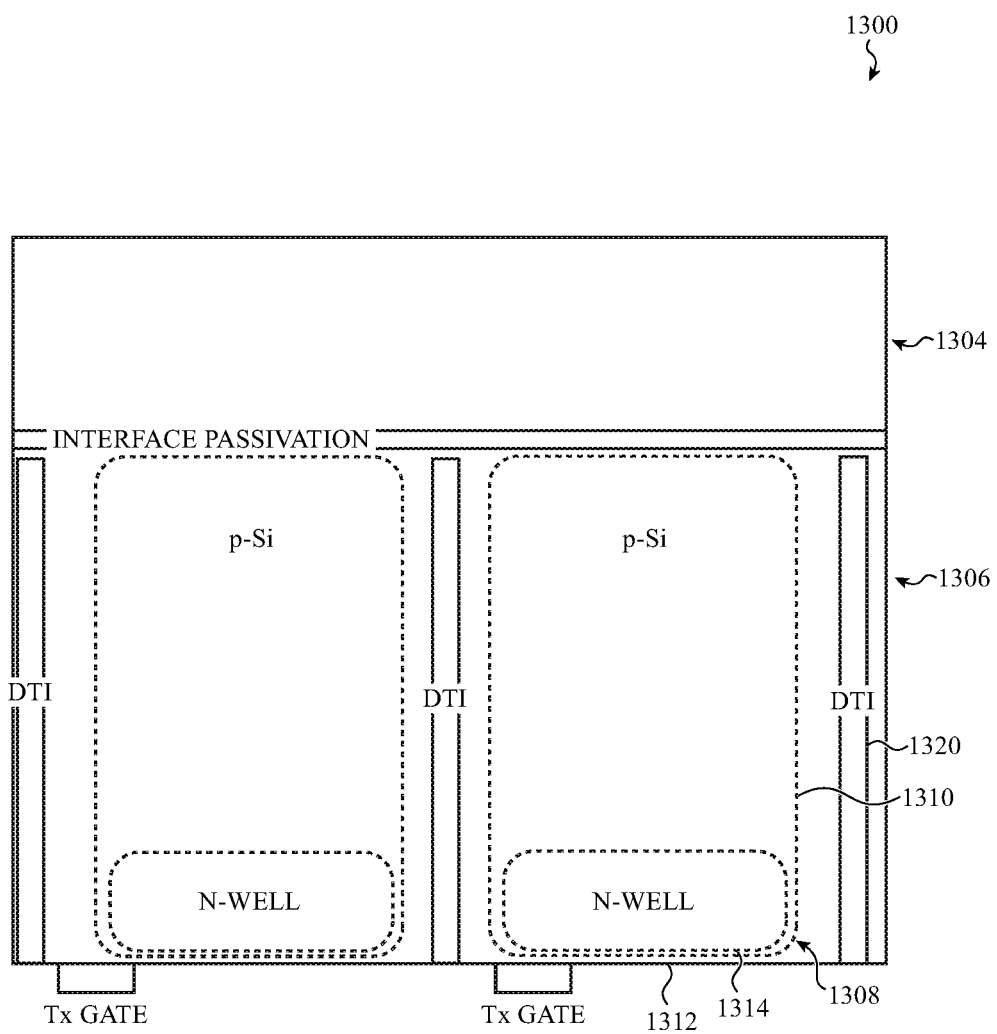
FIG. 13A shows a fourth example configuration for connecting a photosensitive material (or other panchromatic photosensitive material) to pixel circuitry.

FIG. 13A shows a fourth example configuration 1300 for connecting a photosensitive material (or other panchromatic photosensitive material) 1304 to pixel circuitry 1306. In this configuration, the photosensitive material 1304 is deposited directly on a depleted silicon diode 1308 to form a panchromatic-silicon heterojunction photodiode. The heterojunction may be fully depleted to allow for zero kTC noise. The depleted silicon diode 1308 may be integrated with a transfer (Tx) gate to allow for filling/emptying the panchromatic-silicon heterojunction photodiode.

As further shown in FIG. 13A, and in some embodiments, the photosensitive material 1304 may be a lightly doped n-type photosensitive material 1304, and may be in direct contact with a lightly doped and depleted p-type silicon layer or region (p-Si) 1310. The backside 1312 of the p-type silicon layer may include an n-type implant 1314 (an n-well), which completes the silicon diode 1308 and allows for complete depletion of the lightly doped p-type silicon region (or layer) 1310. In an alternative embodiment, the photosensitive material 1304 may be a lightly doped p-type photosensitive material 1304, and the n-type implant 1314 may fully deplete both the lightly doped p-type silicon region 1310 and the lightly doped p-type photosensitive material 1304.

The depleted silicon diodes 1308 connected to different pixels may be separated from each other, or from other pixel circuitry, by walls of deep trench isolation (DTI) 1320.

Figure 13B:
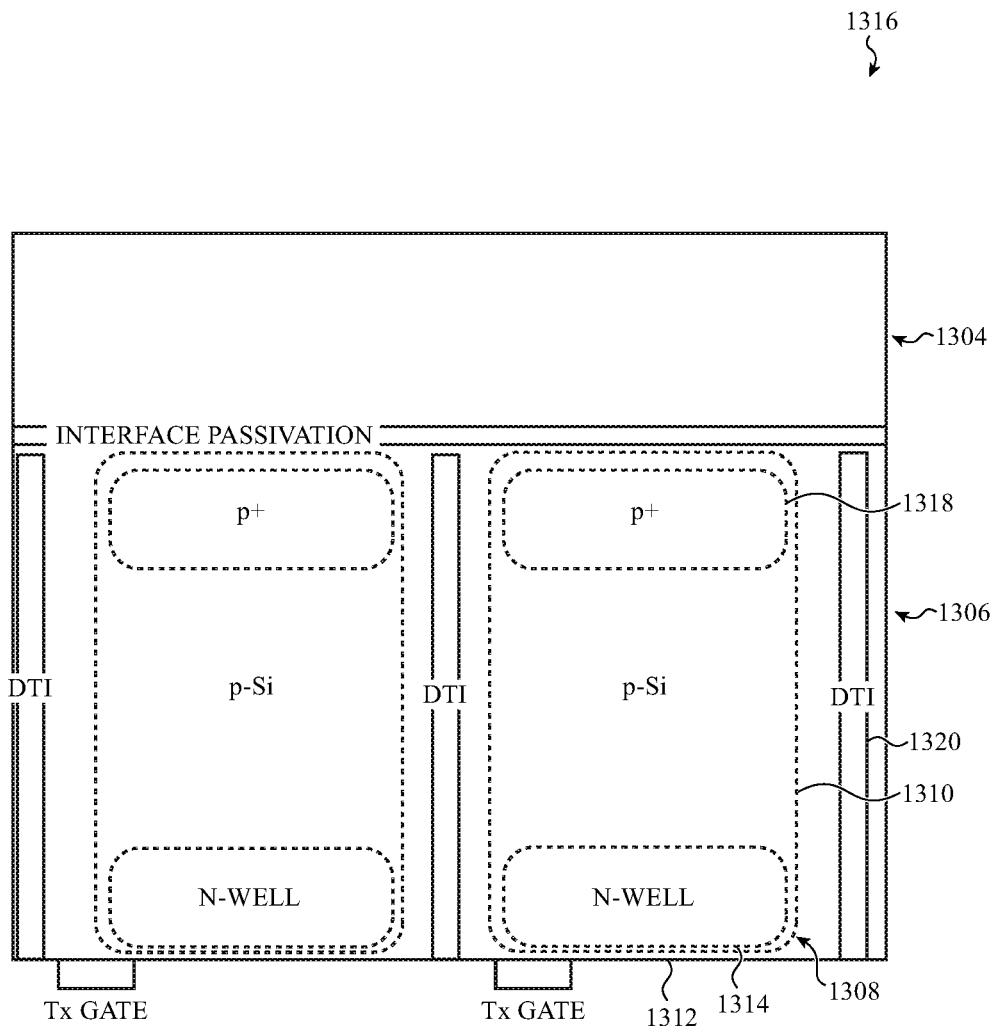
FIG. 13B shows a variation of the interconnection shown in FIG. 13A.

FIG. 13B shows a variation 1316 of the interconnection shown in FIG. 13A, in which a heavily doped p-type (p+) implant 1318 is provided at the interface of the photosensitive material y 1304 and the lightly doped and depleted p-type silicon region 1310. The purpose of the p-type implant 1318 is to make a pinning implant for the p-type silicon region 1310, which pinning implant avoids depletion of the p-type silicon region 1310 all the way to the panchromatic-silicon interface, where the dangling bond density is high. This can reduce the dark current of the panchromatic-silicon heterojunction photodiode. The p-type implant 1318 can also help to deplete the lightly doped n-type photosensitive material 1304.

Figure 13C:
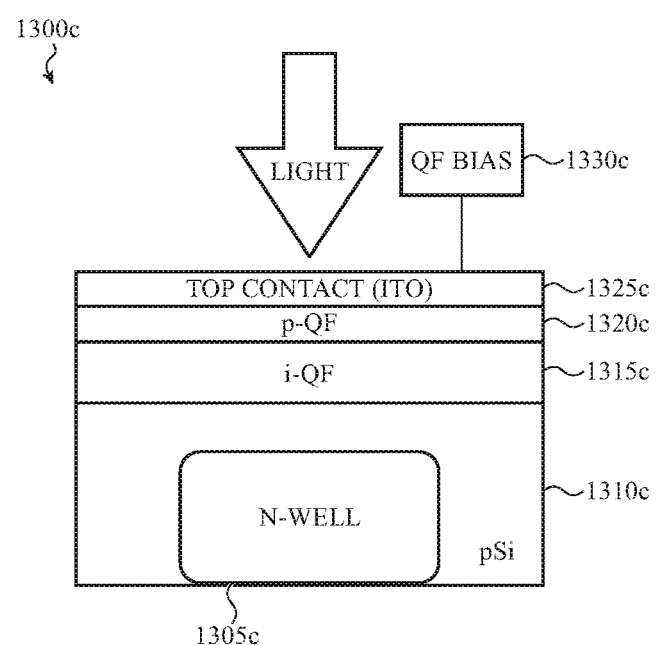
FIGS. 13C-13L illustrate examples of further design features that can be combined with the structure shown in FIG. 13A or 13B.

FIGS. 13C-13L illustrate examples of further design features that can be combined with the structure shown in FIG. 13A or 13B. FIG. 13C illustrates one example of a heterojunction 1300c which may be implemented in the QF/silicon heterojunction devices described herein. FIG. 13C depicts a lightly doped or n-doped silicon region (or n-well) 1305c and a p-doped silicon region (or layer) 1310c. Generally, silicon may be implanted with impurities or dopants to alter and/or control the conductivity of the material. As illustrated in FIG. 13C, the p-doped silicon region 1310c may form a heterojunction with the intrinsic QF 1315c. The intrinsic QF 1315c may be adjacent to a p-doped QF 1320c, which may be in contact with the top contact 1325c. The intrinsic QF and p-doped QF, together, may form the QFs described with reference to FIGS. 3A-3B, 4A-4C, and 5A-5B. In some examples, the QF 1315c may not be intrinsic. Instead, the doping, for example n-type or p-type, may be low enough that the material may be fully depleted under the bias applied to the top contact 1325c, such that an electric field may be uniform through the QF layer. Additionally, the intrinsic QF 1315c may, in some examples, be lightly doped QFs.

As illustrated in FIG. 13C, electromagnetic radiation may enter the device from the direction of the top contact 1325c.

Additionally, in FIG. 13C, the QF bias 1330*c* may be applied to the top contact 1325*c*. Further, the device may be a component of a pixel described herein in various image sensor configurations.

The heterojunction of FIG. 13C, may be combined with one or more transistors to implement a complete pixel. The individual configurations of the pixel may be varied and may depend on the intended operating applications such as iToF, dToF, rolling shutter, global shutter, and so forth. Additionally, although the various implementations discussed herein may be discussed assuming electron transport from the QF to the silicon and electron collection in the silicon, other analogous designs may be implemented so that holes may be transported to the silicon and the hole collection may occur in a p-doped node of the silicon.

As shown in FIG. 13C, the heterojunction 1300*c* may not include an isolating layer of silicon dioxide. Even without the isolation layer, electron collection at the collection node may still occur. This may be achieved due to an electric field which may be created at the p/n junction of the silicon after a bias is applied to the heterojunction device.

In the example of FIG. 13C, the p-doped silicon region (or layer) 1310*c* may be utilized between the n-well 1305*c* collection node and the intrinsic QF 1315*c* to minimize and/or prevent depletion of the silicon at the QF/silicon interface. Additionally, the energy levels of the materials used in the heterojunction 1300*c* may be chosen so that the energy levels "cascade." Cascading energy levels may allow electrons to be transported and/or travel across the QF/silicon interface without barriers. Further, the electrons may travel, without barriers, from the QF to the n-well 1305*c*. Even though each of the heterojunctions do not include a p+ doped region in the n-well, in some embodiments, a p+ region may be included within the n-well.

As discussed herein, even though the p-doped silicon may be used to prevent depletion at the QF/silicon interface, in some embodiments, dangling bonds may still exist at the interface. In this example, the Fermi level may be close enough to the band edge that any dark current resulting from the dangling bonds may be generated slowly. Accordingly, the heterojunction may be considered well passivated.

Figure 13D:
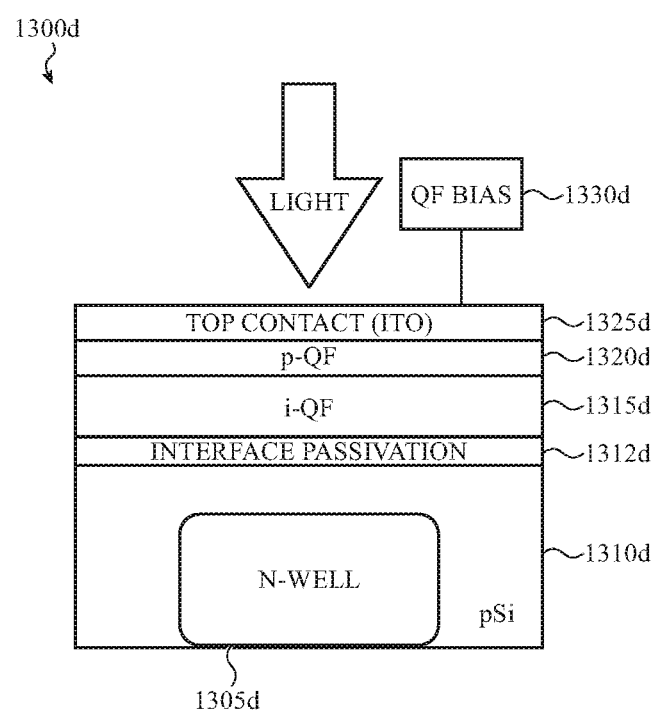

FIG. 13D illustrates another example of a heterojunction 1300*d* which may be implemented in the QF/silicon heterojunction devices described herein. Similar to FIG. 13C, FIG. 13D depicts a lightly n-doped silicon region or an n-well 1305*d* and a p-doped silicon region 1310*d*. As illustrated in FIG. 13D, the p-doped silicon region (or layer) 1310*d* may form a heterojunction with the intrinsic QF 1315*d*, but may also include an intermediate interface passivation layer 1312*d*. The intrinsic QF 1315*d* may be in contact with the top contact 1325*d*. Similar to the example of FIG. 13C, light may enter the device from the direction of the top contact 1325*d*. Further, the device may be a component of a pixel described herein in various image sensor configurations.

In FIG. 13D, the interface of the p-doped silicon layer and intrinsic QF 1315*d* may have dangling bonds. Although as previously discussed with respect to FIG. 13C, the heterojunction may be considered as well passivated, alternative passivation methods are discussed herein. In some examples, the interface passivation layer 1312*d* may be used to reduce the density of dangling bonds at the QF/silicon interface. In one example, the interface passivation layer 1312*d* may be a dipole which may include oxides such as, but not limited to, Al2O3 or HFO2, both of which may be used for passivation. In this example, the dipole containing oxide may have an oxide which may be thin enough for electrons to tunnel through, such as approximately at, around or less than 3 nm.

As described herein, a dipole inducing layer may be inserted at the QF/silicon interface to at least partially passivate the dangling bonds. In one example, when the QF has a smaller bandgap, for example, 0.9 eV, there may be a barrier to electron collection (Φb) due at least partially to an offset between the conduction band edge of the intrinsic QF with the n-doped silicon. This offset may be addressed by inserting the dipole inducing layer at or around the QF/silicon interface which may shift the vacuum level.

Another approach for passivating the interface at the QF/silicon interface may include employing amorphous silicon. In this example, the amorphous silicon may be thicker than the dipole containing oxide passivation method. For example, the amorphous silicon may be in the approximate range of 3-100 nm due to the favorable electron transport properties of amorphous silicon.

Yet another approach for passivating the QF/silicon interface may utilize silicon passivation by molecular treatment. This method may include the alkylation of H-terminated silicon by reaction with alkyl halides such as iodide and bromide). This method may further be achieved by a reaction of H-terminated silicon with alkenes and alkynes, HF hydrogenation, or NH4F hydrogenation.

Employing another method of silicon passivation may include using different crystalline silicon orientations. Different crystal growth orientations of silicon may alter the densities of the dangling bonds at the QF/silicon interface. The Miller Indices of Si(111) may have one H bond per silicon atom whereas Si(100) may have two H bonds. Altering the silicon crystal growth orientations may affect and/or alter the effectiveness of other passivation strategies.

Figure 13E:
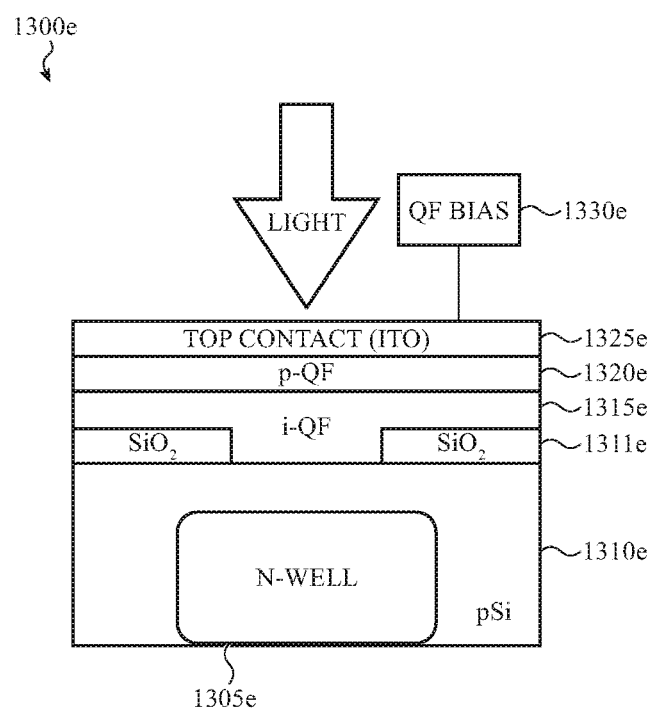

FIG. 13E illustrates one example of a heterojunction 1300*e* which may be implemented in the QF/silicon heterojunction devices described herein. Similar to FIG. 13C, FIG. 13E depicts a lightly n-doped silicon region or an n-well 1305*e* and a p-doped silicon region (or layer) 1310*e*. As illustrated in FIG. 13E, the p-doped silicon region 1310*e*, the p-doped silicon may form a heterojunction with the intrinsic QF 1315*e*. In FIG. 13E, an electrical isolation layer 1311*e* may be a partial layer located between the p-doped silicon region 1310*e* and the intrinsic QF 1315*e*. The other aspects of FIG. 13E may be similar to the elements described with respect to FIGS. 13C-13D.

In FIG. 13E, the electrical isolation layer 1311*e* may be any material which may electrically isolate the intrinsic QF 1315*e* from the p-doped silicon region 1310*e* in the areas in which the electrical isolation layer is located. In some examples, the material may be an oxide such as silicon dioxide, SiO2. As depicted, the electrical isolation layer partially separates the intrinsic QF 1315*e* from the p-doped silicon region 1310*e*. This electrical isolation layer may be used to electrically isolate the pixel to QF interface and to better define the collection node area in the silicon. In some examples, the electrical isolation layer may be part of the interface passivation layer of FIG. 12D.

Figure 13F:
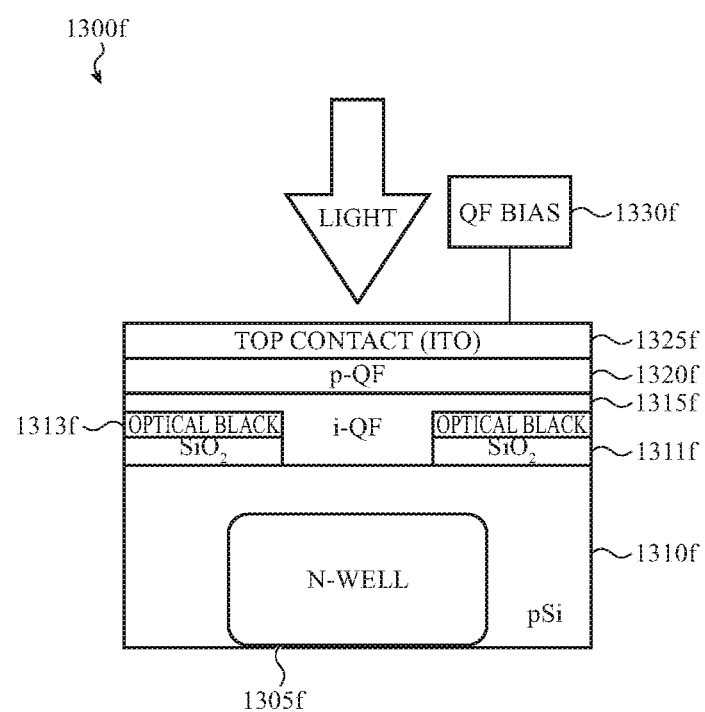

FIG. 13F illustrates one example of a heterojunction 1300*f* which may be implemented in the QF/silicon heterojunction devices described herein. Similar to FIGS. 13C-13E, FIG. 13F depicts a lightly n-doped silicon region or an n-well 1305*f* and a p-doped silicon region (or layer) 1310*f*. As illustrated in FIG. 13F, the p-doped silicon region 1310*f*, the p-doped silicon may form a heterojunction with the intrinsic QF 1315*f*. In FIG. 13F, an electrical isolation layer 1311*f* may be a partial layer located between the p-doped silicon region 1310*f* and the intrinsic QF 1315*f*. In FIG. 13F, the electrical isolation layer 1311*f* may have similar properties to the electrical isolation layer 1311*e* of FIG. 13E. Additionally in FIG. 13F, an electromagnetic radiation shielding layer 1313*f* may be located between the electrical isolation layer 1311*f* and the intrinsic QF 1315*f*. The other aspects of FIG. 13F may be similar to the elements described with respect to FIGS. 13C-13E.

In FIG. 13F, the electromagnetic radiation shielding layer 1313*f* may be an optically black material (i.e., a material that substantially absorbs a range of wavelengths, wherein substantial absorption is defined to be at least 50% absorption, and preferably at least 70%, 80%, or 90% absorption). This layer may be added to the heterojunction 1300*f* to at least partially shield the readout circuitry from electromagnetic radiation and/or light. The shielding layer 1313*f* may be effective in shielding the readout circuitry when the incident light may be a wavelength that is capable of being absorbed by silicon such as a wavelength approximately at, around, or less than 1100 nm. The shielding layer 1313*f* may be any material that is optically black including, but not limited to a metal or a photosensitive polymer.

Figure 13G:
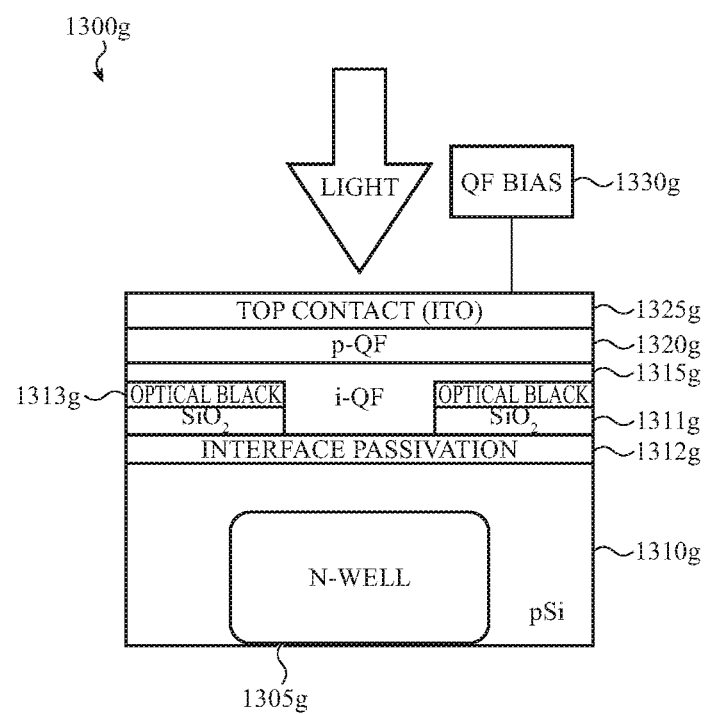

FIG. 13G illustrates one example of a heterojunction 1300*g* which may be implemented in the QF/silicon heterojunction devices described herein. Similar to FIGS. 13C-13F, FIG. 13G depicts a lightly n-doped silicon region or an n-well 1305*g* and a p-doped silicon region (or layer) 1310*g*. As illustrated in FIG. 13G, the p-doped silicon region 1310*g*, the p-doped silicon may form a heterojunction with the intrinsic QF 1315*g*, but may also include an intermediate interface passivation layer 1312*g*. In FIG. 13G, an electrical isolation layer 1311*g* may be a partial layer located adjacent to the interface passivation layer 1312*g*. In FIG. 13G, the electrical isolation layer 1311*g* may have similar properties to the electrical isolation layer 1311E of FIG. 13E. Additionally in FIG. 13G, an electromagnetic radiation shielding layer 1313*g* may be located adjacent to the electrical isolation layer 1311*g*. The configuration illustrated in FIG. 13G is one example and the layers may be located in any other appropriate order. The other aspects of FIG. 13G may be similar to the elements described with respect to FIGS. 13C-13F.

Similar to FIG. 13D, in FIG. 13G, the interface of the p-doped silicon layer and intrinsic QF 1315*g* may have dangling bonds. Although as previously discussed with respect to FIG. 13C, the heterojunction may be considered as well passivated, alternative passivation methods are discussed herein. In some examples, the interface passivation layer 1312*g* may be used to reduce the density of dangling bonds at the QF/silicon interface. In one example, the interface passivation layer 1312*g* may be a dipole which may include oxides such as, but not limited to, Al2O3 or HFO2, both of which may be used for passivation. In this example, the dipole containing oxide may have an oxide which may be thin enough for electrons to tunnel through, such as approximately at, around or less than 3 nm.

Figure 13H:
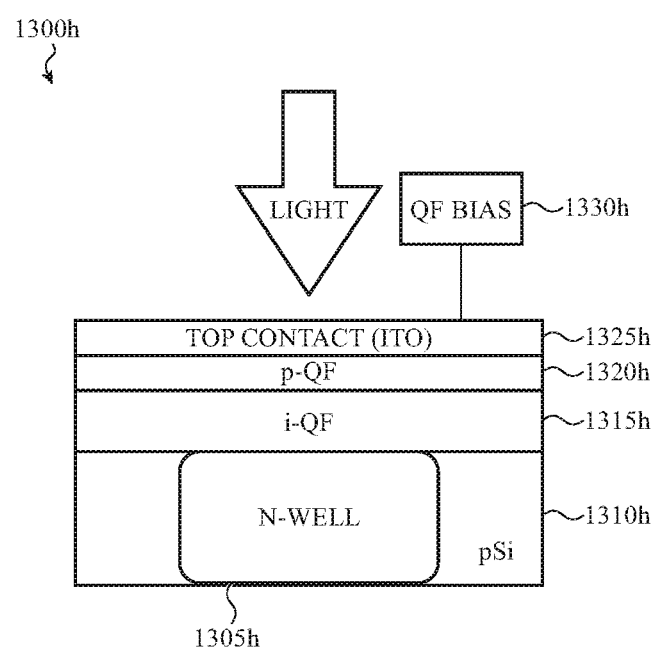

FIG. 13H illustrates one example of a heterojunction 1300*h* which may be implemented in the QF/silicon heterojunction devices described herein. FIG. 13H depicts a lightly n-doped silicon region or an n-well 1305*h* and a p-doped silicon region (or layer) 1310*h*. As illustrated in FIG. 13H, the n-doped silicon may form a heterojunction with the intrinsic QF 1315*h*. The other aspects of FIG. 13H may be similar to the elements described with respect to FIGS. 13C-13G.

As shown in FIG. 13H, the heterojunction 1300*h* may not include an isolating layer of silicon dioxide. As such, at the QF/silicon interface depicted in FIG. 13H, numerous interface states may be present due to the unpassivated silicon dangling bonds. In the example, the silicon may be fully depleted at the interface, and the dangling bonds may be generation centers for dark current. Additionally, and as discussed in FIG. 13D, the heterojunction 1300*h* may include a passivation layer between the QF and the silicon to mitigate the effects of the interface states at the QF/silicon interface.

Figure 13I:
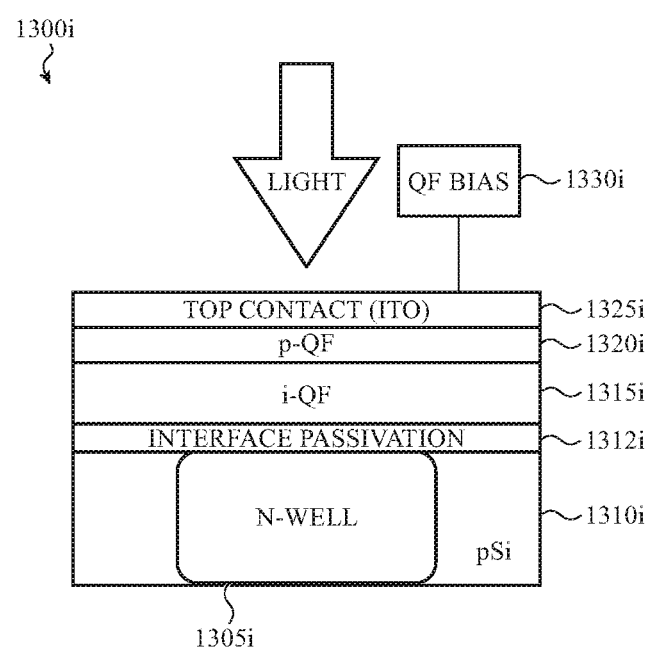

FIG. 13I illustrates another example of a heterojunction 1300*i* which may be implemented in the QF/silicon heterojunction devices described herein. Similar to FIG. 13D, FIG. 13I depicts a lightly n-doped silicon region or an n-well 1305*i* and a p-doped silicon region 1310*i*. As illustrated in FIG. 13I, the n-well 1305*i* may form a heterojunction with the intrinsic QF 1315*i*, but may also include an intermediate interface passivation layer 1312*i*. The intrinsic QF 1315*i* may be in contact with the top contact 1325*i*. Similar to the example of FIG. 13D, light may enter the device from the direction of the top contact 1325*i*. Further, the device may be a component of a pixel described herein in various image sensor configurations.

Similar to FIG. 13D, in FIG. 13I, the interface of the n-well layer and intrinsic QF 1315*i* may have dangling bonds. In some examples, the interface passivation layer 1312*i* may be thin enough that electrons may tunnel through the layer, thus creating an effective interface between the n-well layer and the intrinsic QF. Although as previously discussed with respect to FIG. 13C, the heterojunction may be considered as well passivated, alternative passivation methods are discussed herein. In some examples, the interface passivation layer 1312*i* may be used to reduce the density of dangling bonds at the QF/silicon interface. In one example, the interface passivation layer 1312*i* may be a dipole which may include oxides such as, but not limited to, Al2O3 or HFO2, both of which may be used for passivation. In this example, the dipole containing oxide may have an oxide which may be thin enough for electrons to tunnel through, such as approximately at, around or less than 3 nm.

Figure 13J:
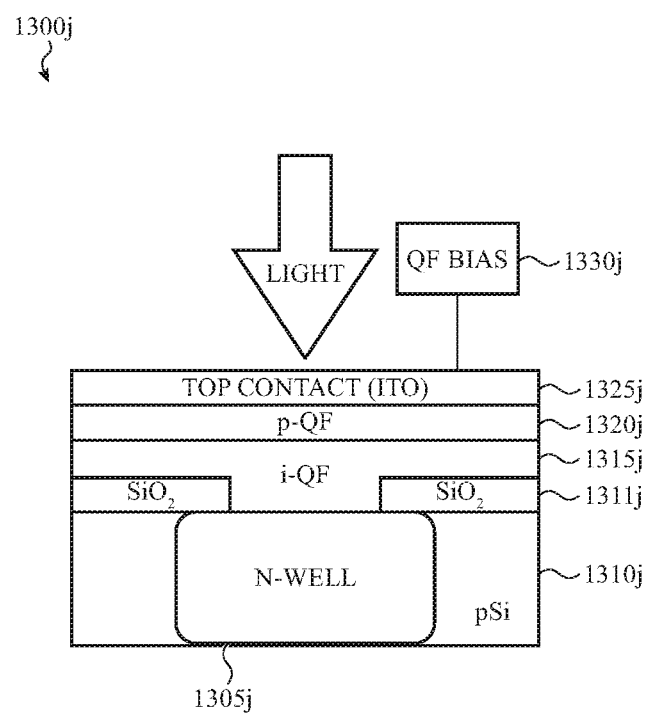

FIG. 13J illustrates one example of a heterojunction 1300*j* which may be implemented in the QF/silicon heterojunction devices described herein. Similar to FIG. 13H, FIG. 13J depicts a lightly n-doped silicon region or an n-well 1305*j* and a p-doped silicon region (or layer) 1310*j*. As illustrated in FIG. 13J, the n-doped silicon (n-well) may form a heterojunction with the intrinsic QF 1315*j*. The other aspects of FIG. 13J may be similar to the elements described with respect to FIGS. 13C-13I.

In FIG. 13J, the electrical isolation layer 1311*j* may be any material which may electrically isolate the intrinsic QF 1315*j* from the p-doped silicon region 1310*j* in the areas in which the electrical isolation layer is located. In some examples, the electrically isolating material may be an oxide such as silicon dioxide, SiO2. As depicted in FIG. 13J, the electrical isolation layer partially separates the intrinsic QF 1315*j* from the n-well 1305*j* and the p-doped silicon region 1310*j*. This electrical isolation layer may be used to electrically isolate the pixel to QF interface and to better define the collection node area in the silicon.

Figure 13K:
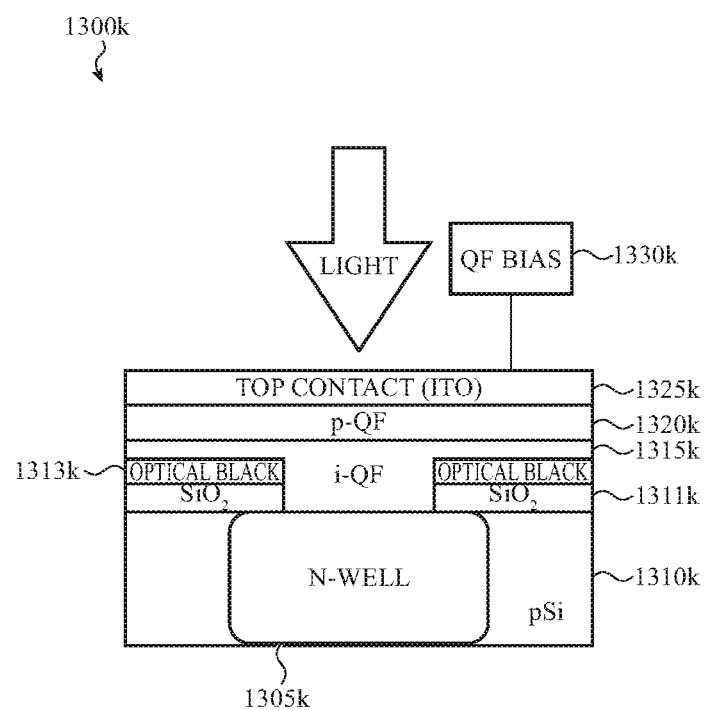

FIG. 13K illustrates one example of a heterojunction 1300*k* which may be implemented in the QF/silicon heterojunction devices described herein. Similar to FIGS. 13C-13J, FIG. 13K depicts a lightly n-doped silicon region or an n-well 1305*k* and a p-doped silicon region (or layer) 1310*k*. As illustrated in FIG. 13K, the n-doped silicon may form a heterojunction with the intrinsic QF 1315*k*. In FIG. 13K, an electrical isolation layer 1311*k* may be a partial layer located between the layer that includes the n-well 1305k and p-doped silicon region 1310k, and the intrinsic QF 1315k. In FIG. 13K, the electrical isolation layer 1311k may have similar properties to the electrical isolation layer 1311e of FIG. 13E. Additionally in FIG. 13K, an electromagnetic radiation shielding layer 1313k may be located between the electrical isolation layer 1311k and the intrinsic QF 1315k. The other aspects of FIG. 13K may be similar to the elements described with respect to FIGS. 13C-13J.

In FIG. 13K, the electromagnetic radiation shielding layer 1313k may be an optically black material. This layer may be added to the heterojunction 1300k to at least partially shield the readout circuitry from electromagnetic radiation and/or light. The shielding layer 1313k may be effective in shielding the readout circuitry when the incident light may be a wavelength that is capable of being absorbed by silicon such as a wavelength approximately at, around, or less than 1100 nm. The shielding layer 1313k may be any material that is optically black including, but not limited to a metal or an absorbing polymer.

Figure 13L:
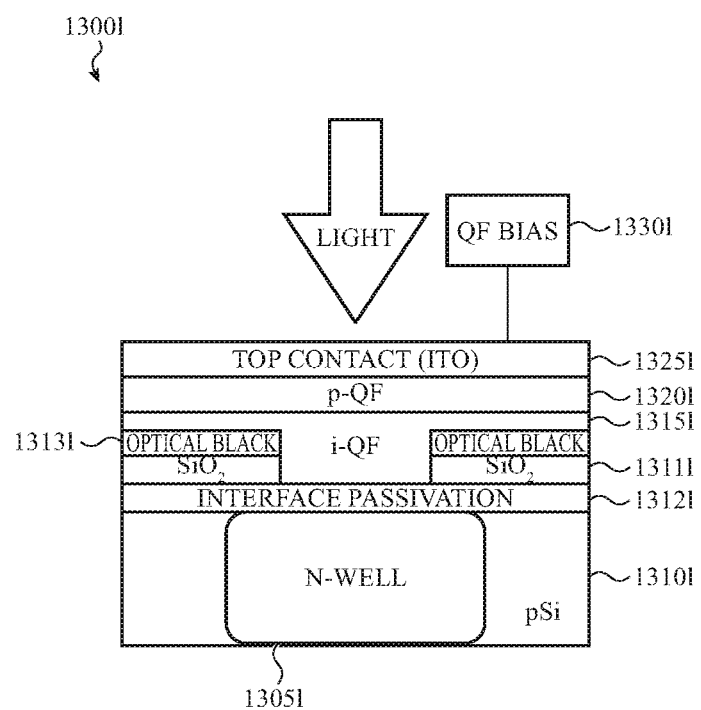

FIG. 13L illustrates one example of a heterojunction 1300l which may be implemented in the QF/silicon heterojunction devices described herein. Similar to FIGS. 13C-13K, FIG. 13L depicts a lightly n-doped silicon region or an n-well 1305l and a p-doped silicon region (or layer) 1310l. As illustrated in FIG. 13L, the n-well 1305l may form a heterojunction with the intrinsic QF 1315l, but may also include an intermediate interface passivation layer 1312l. In FIG. 13L, an electrical isolation layer 1311l may be a partial layer located adjacent to the intermediate interface passivation layer 1312l. In FIG. 13L, the electrical isolation layer 1311l may have similar properties to the electrical isolation layer 1311E of FIG. 13E. Additionally in FIG. 13L, an electromagnetic radiation shielding layer 1313l may be located between the electrical isolation layer 1311l and the interface passivation layer 1312l. The other aspects of FIG. 13L may be similar to the elements described with respect to FIGS. 13C-13K.

Similar to FIG. 13D, in FIG. 13L, the interface of the n-well layer and intrinsic QF 1315l may have dangling bonds. In some examples, even though the interface passivation layer 1312l is between the n-well layer and the intrinsic QF layer, the passivation layer may be thin enough that electrons may tunnel through the passivation layer, such that the n-well layer and the intrinsic QF layer are effectively adjacent. Although as previously discussed with respect to FIG. 13C, the heterojunction may be considered as well passivated, alternative passivation methods are discussed herein. In some examples, the interface passivation layer 1312l may be used to reduce the density of dangling bonds at the QF/silicon interface. In one example, the interface passivation layer 1312l may be a dipole which may include oxides such as, but not limited to, $Al_2O_3$ or $HFO_2$, both of which may be used for passivation. In this example, the dipole containing oxide may have an oxide which may be thin enough for electrons to tunnel through, such as approximately at, around or less than 3 nm.

Figure 14A:
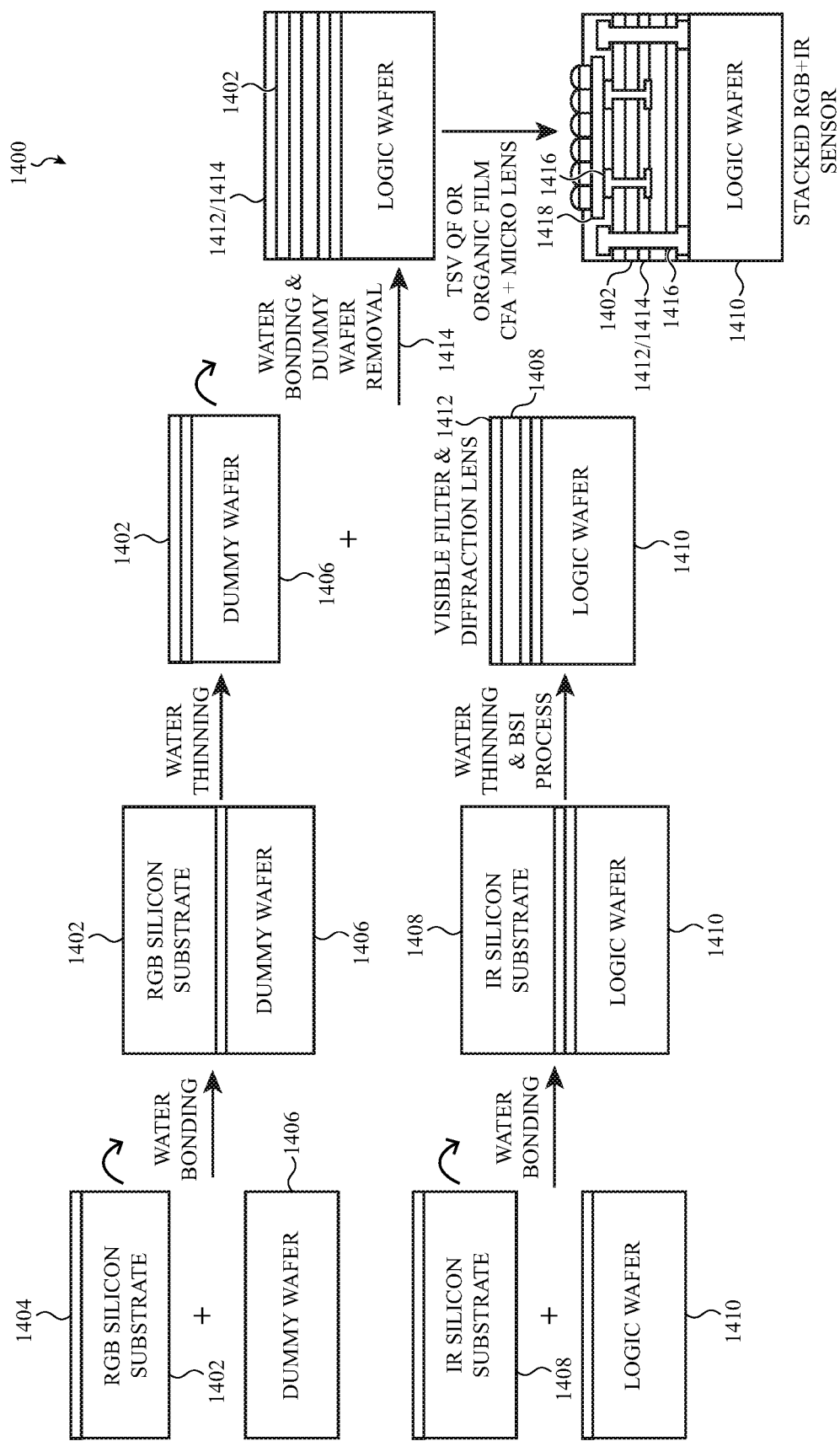
FIG. 14A shows an example process for making a stacked electromagnetic radiation sensor.

An example process 1400 for making a stacked electromagnetic radiation sensor is shown in FIG. 14A. By way of example, the process 1400 is described with reference to an RGB light sensor stacked on an IR sensor, in which the RGB light sensor includes a photosensitive material deposited on a semiconductor substrate, and the IR sensor is a silicon-based sensor.

At one step in the process 1400, the semiconductor substrate (e.g., a silicon substrate) 1402 for the RGB light sensor may be formed in accordance with an FSI process, with its front side 1404 stacked facing a dummy wafer 1406. The semiconductor substrate 1402 and dummy wafer 1406 may be joined using a temporary wafer bonding process. After bonding, the semiconductor substrate 1402 may be thinned to a few microns. A semiconductor substrate (e.g., a silicon substrate) 1408 for the IR sensor may be formed in accordance with a BSI process, with its front side stacked with the front side of a pixel processing chip (e.g., a logic wafer 1410). The semiconductor substrate 1408 and logic wafer 1410 may be joined using a wafer bonding process. After bonding, the semiconductor substrate 1408 may be thinned to a few microns, and in some cases, TSVs may be formed in the semiconductor substrate 1408. A visible light blocking filter 1412 and diffraction lens structures 1414 may then be deposited and patterned on the backside of the IR sensor. Next, the IR sensor with pixel processing chip and other structures may be stacked with the RGB light sensor, by flipping the RGB light sensor and wafer bonding it to the IR sensor with pixel processing chip and other structures. The dummy wafer 1406 may then be removed. TSVs 1416 may be formed through the semiconductor substrate 1402 of the RGB light sensor, the semiconductor substrate 1408 of the IR sensor, and other structures to connect the metal of the semiconductor substrate 1402 to the metal of the logic wafer 1410. Thereafter, a photosensitive material 1418 (e.g., a QF or organic material) may be deposited on the semiconductor substrate 1402 of the RGB light sensor, and color filters and microlenses may be deposited on the photosensitive material 1418.

Figure 14B:
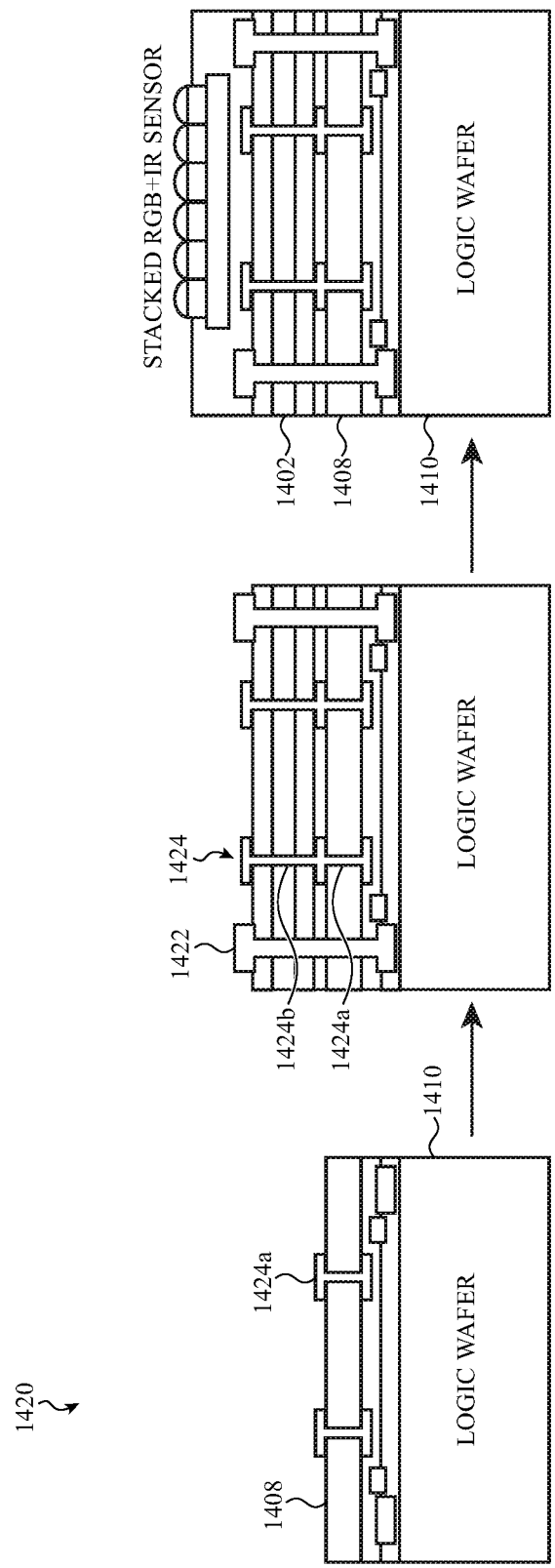
FIGS. 14B and 14C show example processes for forming interconnections between different circuit (e.g., pixel circuitry) and photosensitive layers of the structures shown in FIG. 14A.
Figure 14C:
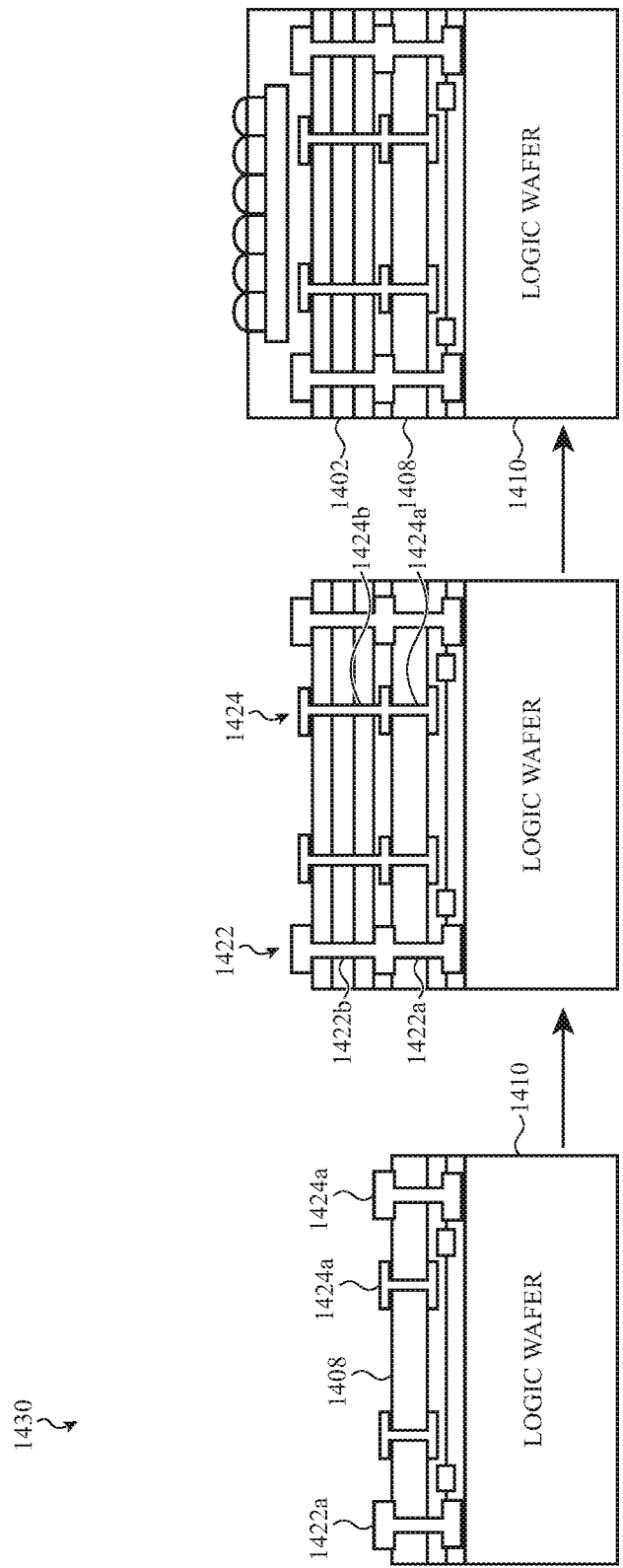

FIGS. 14B and 14C show example processes 1420, 1430 for forming interconnections between different circuit (e.g., pixel circuitry) and photosensitive layers of the structures shown in FIG. 14A. In particular, FIGS. 14B and 14C show example processes 1420, 1430 for forming global TSVs (i.e., TSVs outside the RGB/IR pixel arrays) and local TSVs (i.e., TSVs within the RGB/IR pixel arrays). Global TSVs may have a larger size than local TSVs, if needed, but local TSVs may be smaller, for better IR transmissivity and pixel performance. As an alternative to TSVs, interconnections between different circuit and photosensitive layers can be Cu—Cu connections formed as part of the wafer bonding process, or Cu—Cu connections may be used to join TSVs and/or TSVs to other electrical contacts.

In FIG. 14B, global TSVs 1422 are formed as one-stage TSVs (in which the TSVs 1422 are etched and filled through two layers of silicon) to connect pixel circuitry of the RGB light sensor to the logic wafer 1410, while local TSVs 1424 are formed as two-stage TSVs, with one stage 1424a of the local TSV 1424 being formed through the semiconductor substrate 1408 of the IR sensor before the RGB light sensor is stacked on the semiconductor substrate 1408, and with another stage 1424b of the local TSV 1424 being formed through the semiconductor substrate 1402 of the RGB light sensor after the RGB light sensor has been stacked on the IR sensor. In FIG. 14C, both global TSVs 1422 and local TSVs 1424 are formed as two-stage TSVs.

Figure 15A:
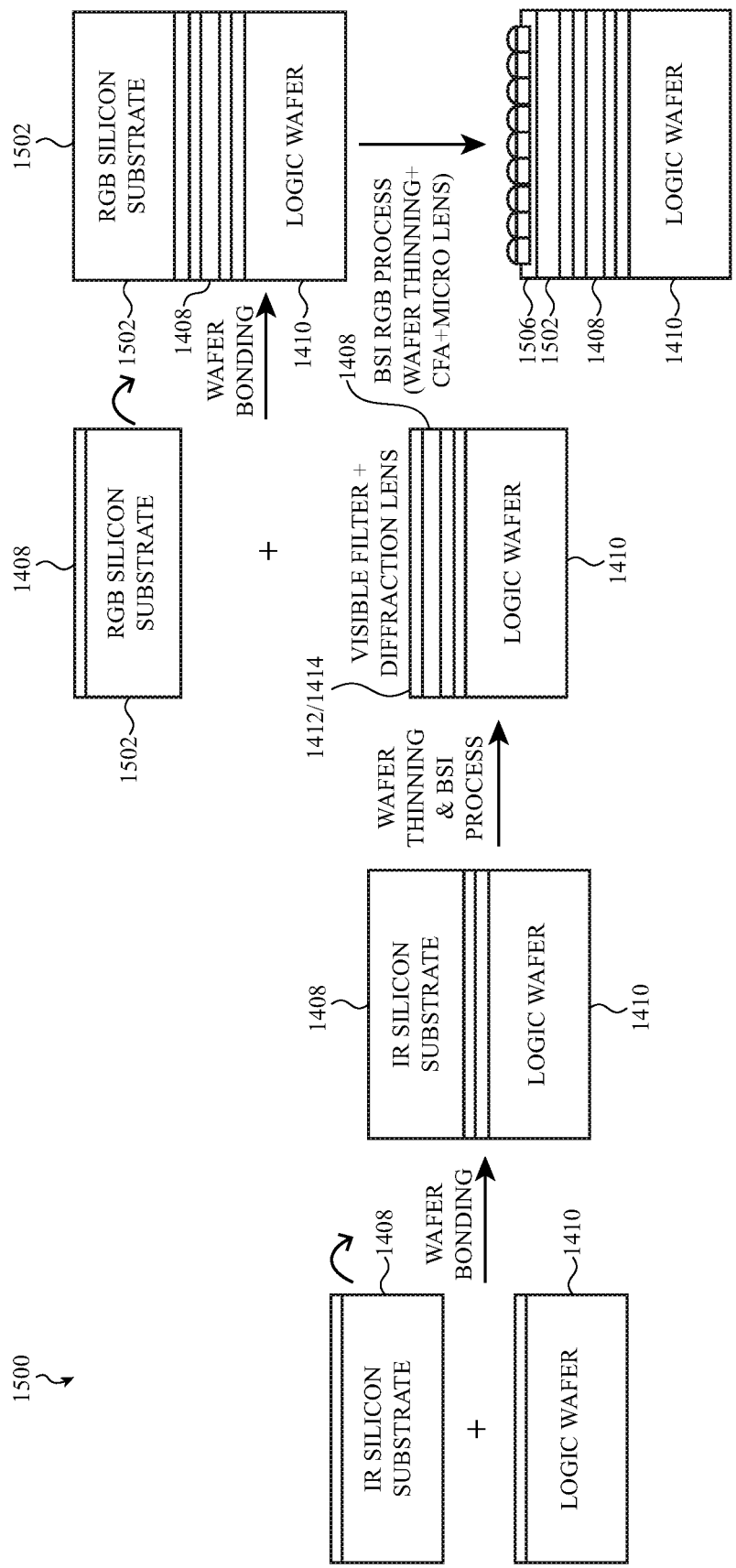
FIG. 15A shows a modification (and simplification) of the process described with reference to FIG. 14A.

FIG. 15A shows a modification (and simplification) of the process described with reference to FIG. 14A. By way of example, the process 1500 may be used to stack an RGB light sensor on an IR sensor when the RGB light sensor employs a silicon-based photodetector array.

As shown, a semiconductor substrate 1408 of an IR sensor may be stacked on a logic wafer as described with reference to FIG. 14A. However, the semiconductor substrate 1502 for the RGB light sensor may be formed in accordance with a BSI process. The semiconductor substrate 1502 may be stacked on the IR sensor with its front side 1504 facing the IR sensor, and without the use of a dummy wafer. The semiconductor substrate 1502 of the RGB light sensor may then be thinned, and a BSI photodetector array 1506 may be formed on the semiconductor substrate 1502. TSVs may be formed in the stack as described with reference to FIG. 15B, for example.

Figure 15B:
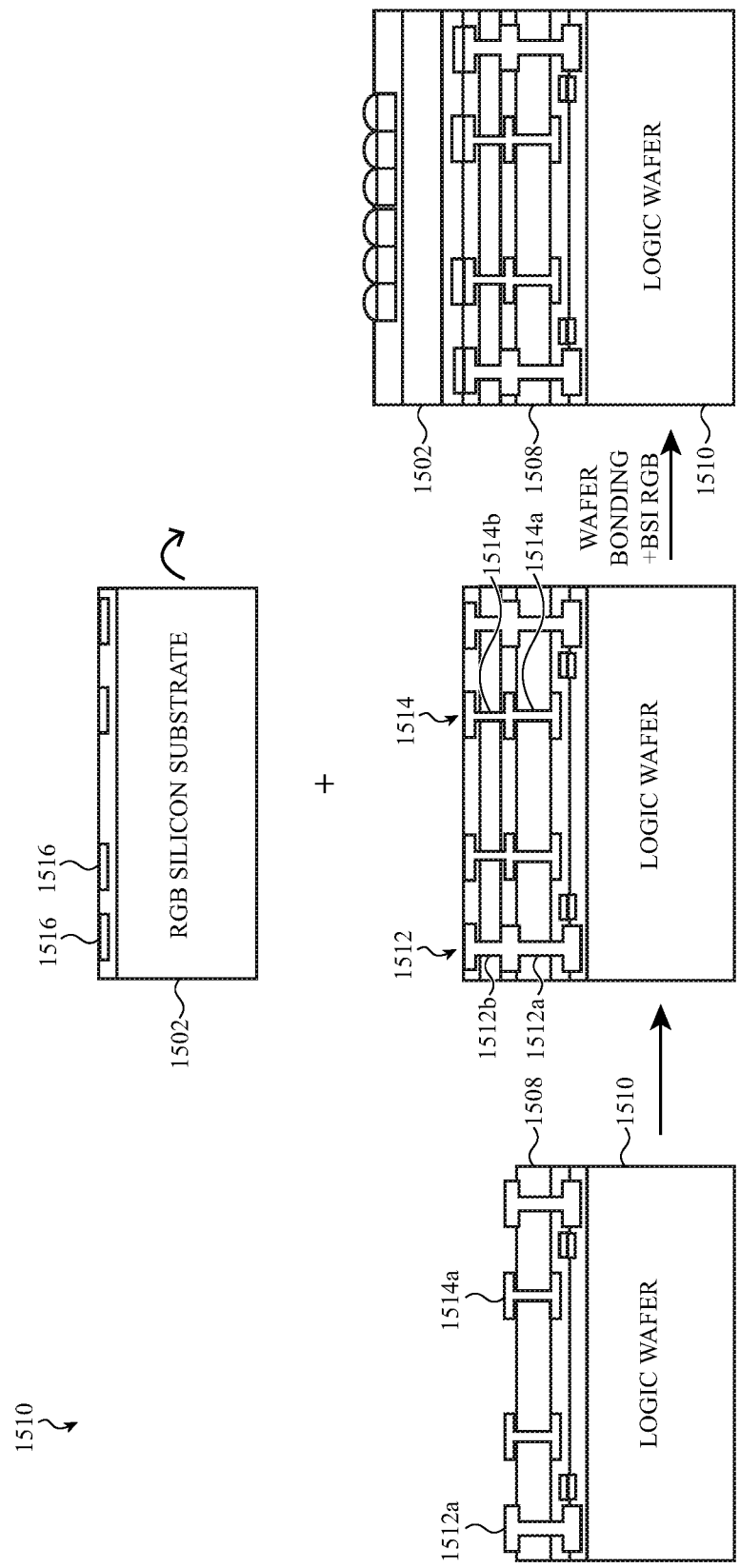
FIG. 15B shows an example process for forming interconnections between different circuit (e.g., pixel circuitry) and photosensitive elements of the structures shown in FIG. 15A.

FIG. 15B shows an example process 1510 for forming interconnections between different circuit (e.g., pixel circuitry) and photosensitive elements of the structures shown in FIG. 15A. By way of example, FIG. 15B shows an example process 1510 for forming a combination of global TSVs 1512 and local TSVs 1514. The global and local TSVs 1512, 1514 may be formed as two-stage TSVs, as described with reference to FIG. 14C. After the semiconductor substrate 1408 of the IR sensor has been stacked with the logic wafer 1410 and thinned, first stages 1512a, 1514a of global and local TSVs 1512, 1514 may be formed to connect the backside metals of the semiconductor substrate 1408 to the front side metals of the semiconductor substrate 1408, and to metals of the logic wafer 1410. After depositing and patterning the visible light blocking filter 1412 and diffraction lens structures 1414 on the backside of the IR sensor, second stages 1512b, 1514b of the global and local TSVs 1512, 1514 may be formed to extend the TSVs 1512, 1514 to the new top surface of the stack. The semiconductor substrate 1402 of the RGB light sensor may then be stacked on the stack containing the IR sensor, with electrical contacts 1516 on the semiconductor substrate being electrically coupled to the TSVs 1512, 1514.

Figure 16A:
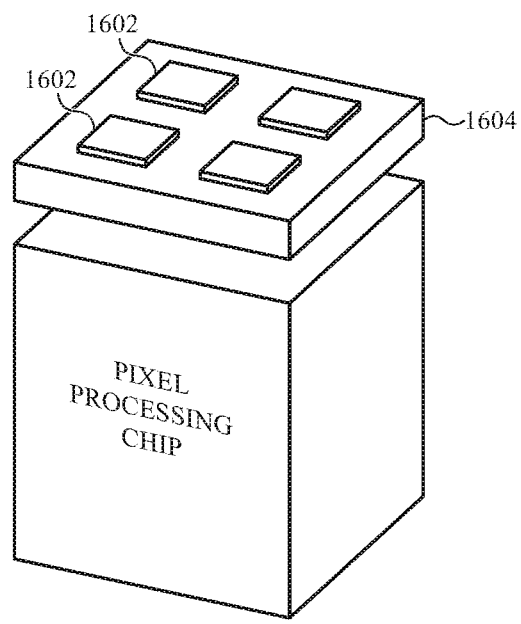
FIGS. 16A and 16B show examples of how longer wavelength photosensitive materials may be deposited on a semiconductor substrate of an IR sensor.
Figure 16B:
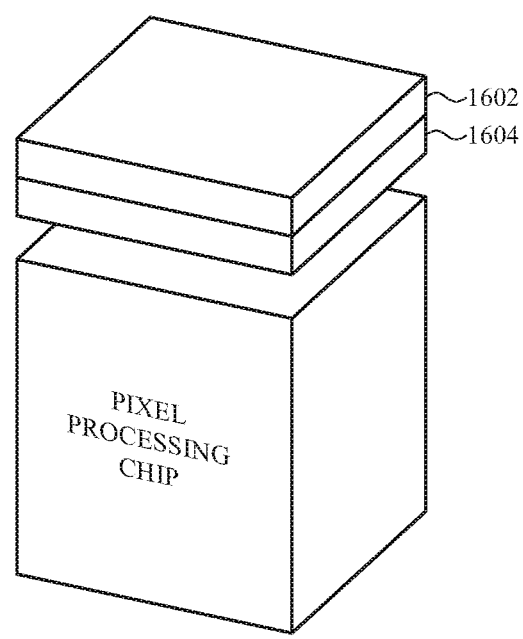

FIGS. 16A and 16B show examples of how longer wavelength photosensitive materials 1602 may be deposited on a semiconductor substrate 1604 of an IR sensor. Such a construction of an IR sensor may be especially useful when a visible light sensor at the top of a stacked electromagnetic radiation sensor uses a silicon-based photodetector array. For example, because of silicon's sensitivity to a wide range of electromagnetic radiation wavelengths, the sensitivity of an IR sensor may be adjusted to be outside the sensitivity range of silicon by depositing a photosensitive material 1602 on the IR sensor, which photosensitive material 1602 absorbs a range of longer electromagnetic radiation wavelengths that are outside the sensitivity range of silicon (and thus, outside the sensitivity range of a visible light sensor having a silicon-based photodetector array).

In some examples, the photosensitive material 1602 shown in FIGS. 16A and 16B may be a QF or organic material, as described with reference to FIGS. 4A-5B. In other examples, other materials may be used. For example, an IR sensor may be configured to detect electromagnetic radiation wavelengths in the short-wave infrared (SWIR) band (i.e., 1.1 μm to 3 μm electromagnetic radiation wavelengths) when the photosensitive material 1602 is a direct bandgap semiconductor material with high absorption coefficient, including but not limited to group IV materials like Si/SiGe; group III-V materials including InGaAs/InP, AlGaAs/GaAs; or group II-VI materials including CdTe/HgTe. Integration of these materials with CMOS pixel circuitry in the semiconductor substrate 1604 can be provided by various methods, including but not limited to epitaxy-on-silicon, pixel-wise hybrid-bonding, regrowth on CMOS, and solution-deposition of compound semiconductors. The photosensitive material 1602 may also or alternatively be a material with high alpha, good mobility, and low temperature integration with silicon, such as $Sb_2Se_{(3-x)}Te_{(x)}$, where x=0 has a direct bandgap of ~1.2 eV and x>0 tunes the bandgap to lower energies.

The afore-mentioned photosensitive material 1602 may be deposited on the semiconductor substrate 1604 (e.g., a BSI wafer) pixel-wise (e.g., by coating individual pixels) or as a blanket (i.e., by coating all pixels), as shown in FIG. 16A (pixel-wise) or FIG. 16B (as a blanket).

Extending the spectral sensitivity of an IR sensor to longer wavelengths, and positioning the IR notch spectral band for an IR sensor beyond the sensitivity of silicon-based photodetectors, allows silicon-based photodetectors (e.g., a standard BSI silicon pixel array) to be used for a visible light sensor. This can simplify the visible light sensor design due to the inherent capabilities of silicon-based pixel circuitry to perform CDS readout (and mitigate or cancel kTC noise). Also, a visible light sensor can benefit from the low dark current of pinned silicon-based photodiodes, and the well-developed art of BSI silicon sensor manufacture.

Figure 17A:
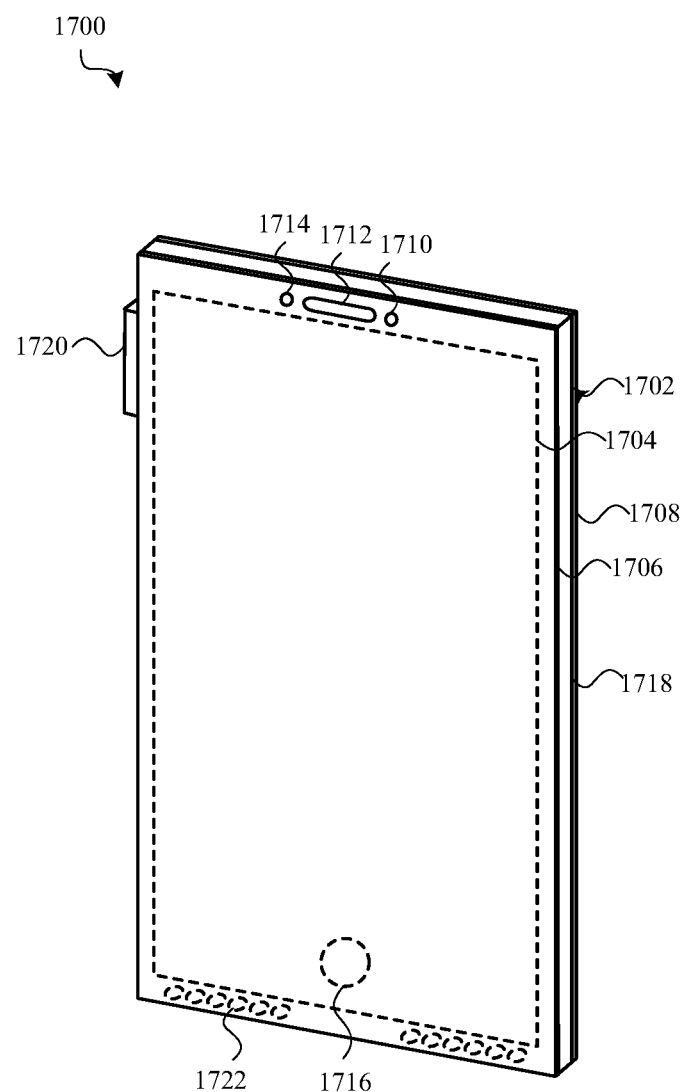
FIGS. 17A and 17B show an example device that may include any one or more of the stacked or non-stacked electromagnetic radiation sensors described herein.
Figure 17B:
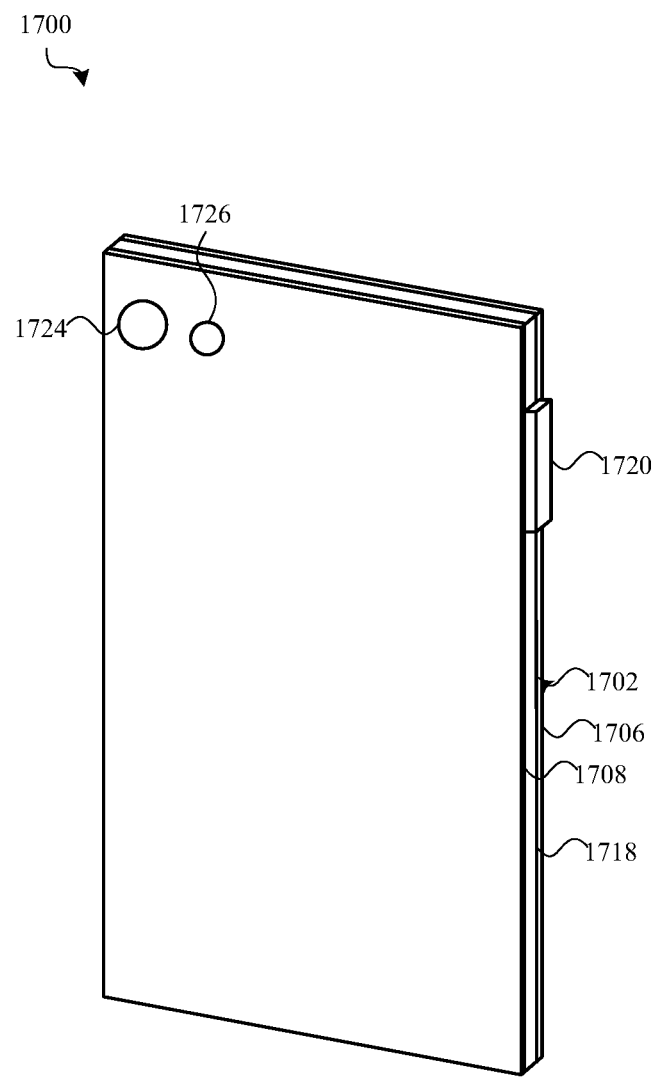

FIGS. 17A and 17B show an example device 1700 that may include any one or more of the stacked or non-stacked electromagnetic radiation sensors described herein. The device's dimensions and form factor, including the ratio of the length of its long sides to the length of its short sides, suggest that the device 1700 is a mobile phone (e.g., a smartphone). However, the device's dimensions and form factor are arbitrarily chosen, and the device 1700 could alternatively be any portable electronic device including, for example a mobile phone, tablet computer, portable computer, portable music player, electronic watch, health monitor device, portable terminal, vehicle navigation system, robot navigation system, or other portable or mobile device. The device 1700 could also be a device that is semi-permanently located (or installed) at a single location. FIG. 17A shows a front isometric view of the device 1700, and FIG. 17B shows a rear isometric view of the device 1700. The device 1700 may include a housing 1702 that at least partially surrounds a display 1704. The housing 1702 may include or support a front cover 1706 or a rear cover 1708. The front cover 1706 may be positioned over the display 1704, and may provide a window through which the display 1704 may be viewed. In some embodiments, the display 1704 may be attached to (or abut) the housing 1702 and/or the front cover 1706. In alternative embodiments of the device 1700, the display 1704 may not be included and/or the housing 1702 may have an alternative configuration.

The display 1704 may include one or more light-emitting elements including, for example, light-emitting diodes (LEDs), organic LEDs (OLEDs), a liquid crystal display (LCD), an electroluminescent (EL) display, or other types of display elements. In some embodiments, the display 1704 may include, or be associated with, one or more touch and/or force sensors that are configured to detect a touch and/or a force applied to a surface of the front cover 1706.

The various components of the housing 1702 may be formed from the same or different materials. For example, the sidewall 1718 may be formed using one or more metals (e.g., stainless steel), polymers (e.g., plastics), ceramics, or composites (e.g., carbon fiber). In some cases, the sidewall 1718 may be a multi-segment sidewall including a set of antennas. The antennas may form structural components of the sidewall 1718. The antennas may be structurally coupled (to one another or to other components) and electrically isolated (from each other or from other components) by one or more non-conductive segments of the sidewall 1718. The front cover 1706 may be formed, for example, using one or more of glass, a crystal (e.g., sapphire), or a transparent polymer (e.g., plastic) that enables a user to view the display 1704 through the front cover 1706. In some cases, a portion of the front cover 1706 (e.g., a perimeter portion of the front cover 1706) may be coated with an opaque ink to obscure components included within the housing 1702. The rear cover 1708 may be formed using the same material(s) that are used to form the sidewall 1718 or the front cover 1706. In some cases, the rear cover 1708 may be part of a monolithic element that also forms the sidewall 1718 (or in cases where the sidewall 1718 is a multi-segment sidewall, those portions of the sidewall 1718 that are non-conductive). In still other embodiments, all of the exterior components of the housing 1702 may be formed from a transparent material, and components within the device 1700 may or may not be obscured by an opaque ink or opaque structure within the housing 1702.

The front cover 1706 may be mounted to the sidewall 1718 to cover an opening defined by the sidewall 1718 (i.e., an opening into an interior volume in which various electronic components of the device 1700, including the display 1704, may be positioned). The front cover 1706 may be mounted to the sidewall 1718 using fasteners, adhesives, seals, gaskets, or other components.

A display stack or device stack (hereafter referred to as a "stack") including the display 1704 may be attached (or abutted) to an interior surface of the front cover 1706 and extend into the interior volume of the device 1700. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 1706 (e.g., to a display surface of the device 1700).

In some cases, a force sensor (or part of a force sensor system) may be positioned within the interior volume below and/or to the side of the display 1704 (and in some cases within the device stack). The force sensor (or force sensor system) may be triggered in response to the touch sensor detecting one or more touches on the front cover 1706 (or a location or locations of one or more touches on the front cover 1706), and may determine an amount of force associated with each touch, or an amount of force associated with the collection of touches as a whole.

As shown primarily in FIG. 17A, the device 1700 may include various other components. For example, the front of the device 1700 may include one or more front-facing cameras 1710 (including one or more image sensors), speakers 1712, microphones, or other components 1714 (e.g., audio, imaging, and/or sensing components) that are configured to transmit or receive signals to/from the device 1700. In some cases, a front-facing camera 1710, alone or in combination with other sensors, may be configured to operate as a bio-authentication or facial recognition sensor. The device 1700 may also include various input devices, including a mechanical or virtual button 1716, which may be accessible from the front surface (or display surface) of the device 1700.

The device 1700 may also include buttons or other input devices positioned along the sidewall 1718 and/or on a rear surface of the device 1700. For example, a volume button or multipurpose button 1720 may be positioned along the sidewall 1718, and in some cases may extend through an aperture in the sidewall 1718. The sidewall 1718 may include one or more ports 1722 that allow air, but not liquids, to flow into and out of the device 1700. In some embodiments, one or more sensors may be positioned in or near the port(s) 1722. For example, an ambient pressure sensor, ambient temperature sensor, internal/external differential pressure sensor, gas sensor, particulate matter concentration sensor, or air quality sensor may be positioned in or near one of the ports 1722.

In some embodiments, the rear surface of the device 1700 may include a rear-facing camera 1724 (including one or more image sensors; see FIG. 1B). A flash or light source 1726 (and in some cases an IR illuminator) may also be positioned along the rear of the device 1700 (e.g., near the rear-facing camera). In some embodiments, an IR illuminator may also or alternatively be positioned adjacent the front-facing camera 1710. In some cases, the rear surface of the device 1700 may include multiple rear-facing cameras.

One or more of the front-facing or rear-facing cameras 1710, 1724 may include a stacked or non-stacked electromagnetic radiation sensor as described herein. If the device 1700 is alternatively configured as a vehicle navigation system or some other type of device (and possibly as a device without a display), the device 1700 may nonetheless have at least one camera including a stacked or non-stacked electromagnetic radiation sensor as described herein.

Figure 18:
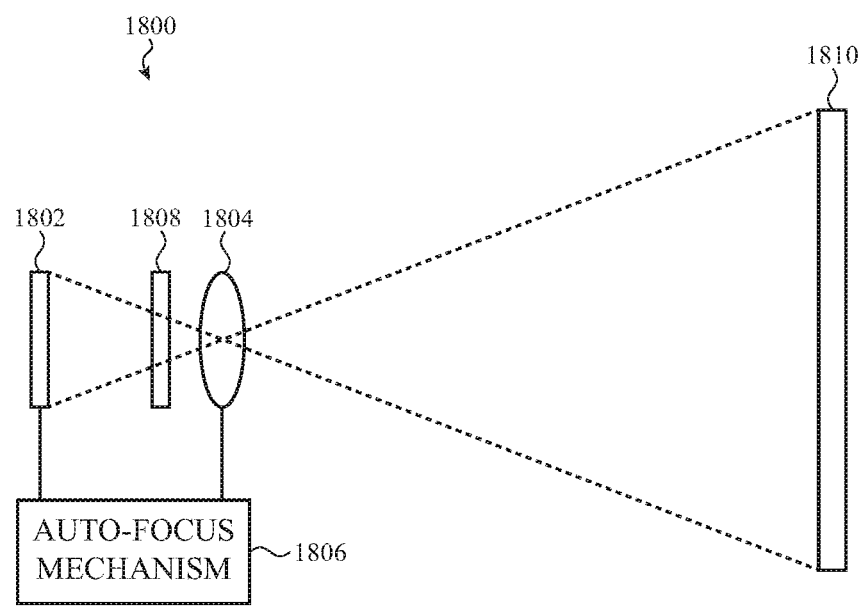
FIG. 18 shows an example embodiment of an image capture device.

FIG. 18 shows an example embodiment of an image capture device (e.g., a camera 1800), including an image sensor 1802, an optional dual-band spectral filter 1808, a lens (or lens stack) 1804, and an AF mechanism 1806. In some embodiments, the components shown in FIG. 18 may be associated with the front or rear-facing camera described with reference to FIGS. 17A and 17B, or with any of the stacked or non-stacked electromagnetic radiation sensors described herein.

The image sensor 1802 may in some cases include a non-stacked electromagnetic radiation sensor having a plurality of pixels, such as a plurality of pixels arranged in a two-dimensional array. In some cases, multiple ones (or all) of the pixels may each include a two-dimensional array of sub-pixels (e.g., a 2×2 array of sub-pixels), with each sub-pixel including a photodetector. Having a majority (or more significantly at least 80%, and preferably all) of the pixels configured to include a 2×2 array of sub-pixels can help improve phase detect auto-focus (PDAF) performance and/or reduce or eliminate the need to correct the outputs of PDAF-capable pixels in relation to the outputs of other pixels. The sub-pixels (or photodetectors) associated with a pixel may be electrically isolated from each other, but disposed under a shared microlens for the pixel.

The image sensor 1802 may alternatively include a stacked electromagnetic radiation sensor, in which each electromagnetic radiation sensor of the stack has an array of pixels. The different pixel arrays may have equal or non-equal numbers of pixels. For example, an IR sensor portion of the image sensor 1802 may have pixels that span multiple pixels of a visible light sensor portion of the image sensor 1802, which visible light sensor portion is stacked above the IR sensor portion.

The dual-band spectral filter 1808, when present, may pass only a range of visible light wavelengths and a range of IR wavelengths, which ranges precisely or substantially correspond to the ranges of electromagnetic radiation wavelengths sensed by the sensors of the image sensor 1802.

The lens 1804 may be adjustable with respect to the image sensor 1802, to focus an image of a scene 1810 on the image sensor 1802. In some embodiments, the lens 1804 may be moved with respect to the image sensor 1802 (e.g., moved to change a distance between the lens 1804 and the image sensor 1802, moved to change an angle between a plane of the lens 1804 and a plane of the image sensor 1802, and so on). In other embodiments, the image sensor 1802 may be moved with respect to the lens 1804.

In some embodiments, the AF mechanism 1806 may include (or the functions of the AF mechanism 1806 may be provided by) a processor. The AF mechanism 1806 may receive signals from the image sensor 1802 and, in response to the signals, adjust a focus setting of the camera 1800. In some embodiments, the signals may include PDAF information. The PDAF information may include horizontal phase detection signals and/or vertical phase detection signals. In response to the PDAF information (e.g., in response to an out-of-focus condition identified from the PDAF information), the AF mechanism 1806 may adjust a focus setting of the camera 1800 by, for example, adjusting a relationship between the image sensor 1802 and the lens 1804 (e.g., by adjusting a physical position of the lens 1804 or the image sensor 1802).

Figure 19:
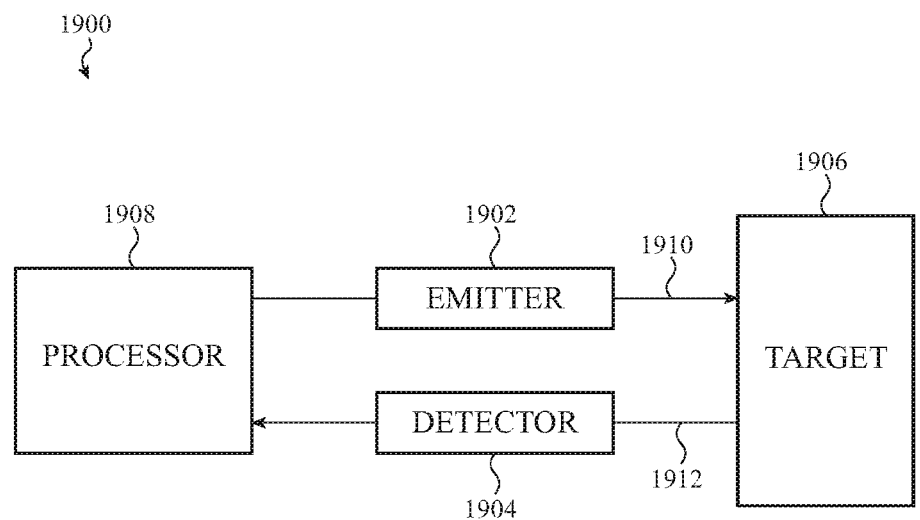
FIG. 19 shows an example system including a detector that uses avalanche diodes.

FIG. 19 shows an example system 1900 including a detector 1904 that uses avalanche diodes (e.g., SPADs). The system 1900 may include an emitter 1902 and a detector 1904 positioned in close proximity to one another, and relatively far (compared to the distance between the emitter 1902 and detector 1904) from a target 1906. In some embodiments, the emitter 1902 and detector 1904 may be provided as a single module. The emitter 1902 may be positioned to emit photons towards the target 1906, or into a FoV, and the detector 1904 may be positioned to detect reflections of the photons from the target 1906. In some embodiments, the emitter 1902 may include an IR illuminator, and the detector 1904 may include any of the stacked or non-stacked electromagnetic radiation sensors described herein.

A processor 1908 may be operably connected to the emitter 1902 and the detector 1904, and may cause the emitter 1092 to emit photons towards the target 1906 (with the emitted photons being represented by the arrow 1910). Photons that are reflected from the target 1906 toward the detector 1904 (represented by the arrow 1912) may be detected by the detector 1904. In particular, the reflected photons may cause avalanche events in various pixels of the detector 1904, and the timing(s) of such avalanche events may be recorded and compared to the time(s) when photons were emitted. The processor 1908 may receive signals (e.g., times of avalanche events) output by the detector 1904, and in some cases may receive photon emission times from the emitter 1902, and may determine ToFs of photons emitted by the emitter 1902 and received by pixels of the detector 1904. The ToFs may be used to determine distances between individual pixels of the detector 1904 and the target 1906. The distances can be used to generate a depth map (e.g., a three-dimensional (3D) image of the target 1906).

The described components and operation of the system 1900 are exemplary. In alternative embodiments, the system 1900 may include a different combination or configuration of components, or may perform additional or alternative functions.

The system 1900 may be used as part of an electronic device, such as, in an image sensor within a smartphone (e.g., in an image sensor within a camera or biometric sensor (e.g., a facial recognition sensor) of the smartphone); in a vehicle navigation system; or in other devices.

Figure 20:
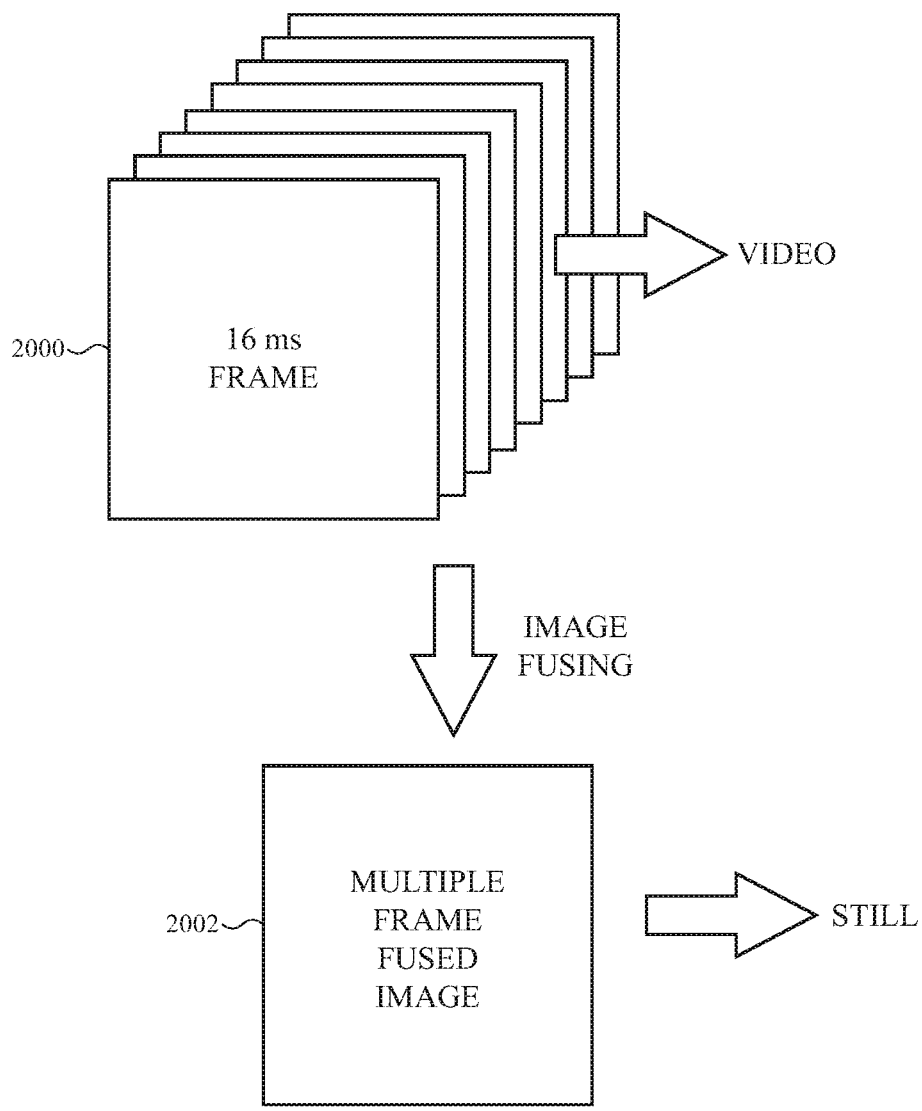
FIG. 20 illustrates how multiple images (or image frames) acquired by an electromagnetic radiation sensor (e.g., a visible light sensor or an IR sensor) may be fused to form a single still image.

FIG. 20 illustrates how multiple images (or image frames 2000) acquired by an electromagnetic radiation sensor (e.g., a visible light sensor or an IR sensor) may be fused to form a single still image 2002. In some embodiments, image frames within a video stream may be fused for the purpose of mitigating higher dark current of a panchromatic photosensitive layer of a visible light sensor.

Figure 21:
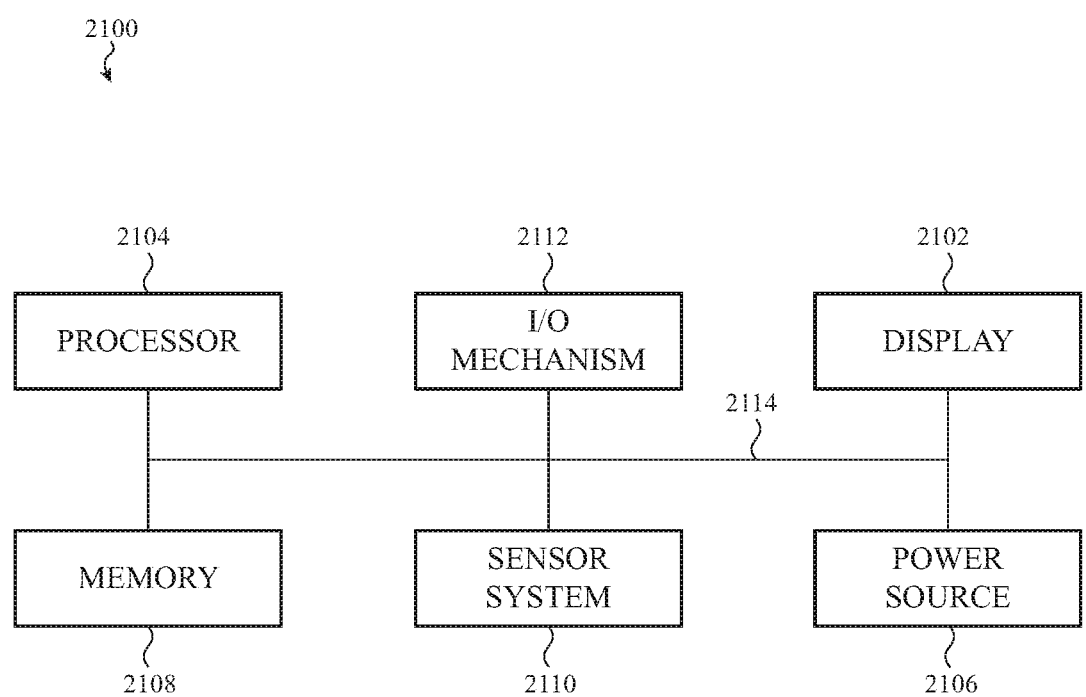
FIG. 21 shows a sample electrical block diagram of an electronic device.

FIG. 21 shows a sample electrical block diagram of an electronic device 2100, which may be the electronic device described with reference to FIG. 17A-17B, 18 or 19. The electronic device 2100 may include a display 2102 (e.g., a light-emitting display), a processor 2104, a power source 2106, a memory 2108 or storage device, a sensor system 2110, and an input/output (I/O) mechanism 2112 (e.g., an input/output device and/or input/output port). The processor 2104 may control some or all of the operations of the electronic device 2100. The processor 2104 may communicate, either directly or indirectly, with substantially all of the components of the electronic device 2100. For example, a system bus or other communication mechanism 2114 may provide communication between the processor 2104, the power source 2106, the memory 2108, the sensor system 2110, and/or the I/O mechanism 2112.

The processor 2104 may be implemented as any electronic device capable of processing, receiving, or transmitting data or instructions. For example, the processor 2104 may be a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

It should be noted that the components of the electronic device 2100 may be controlled by multiple processors. For example, select components of the electronic device 2100 may be controlled by a first processor and other components of the electronic device 2100 may be controlled by a second processor, where the first and second processors may or may not be in communication with each other. In some embodiments, the processor 2104 may include any of the pixel processing chips or image processors described herein.

The power source 2106 may be implemented with any device capable of providing energy to the electronic device 2100. For example, the power source 2106 may be one or more batteries or rechargeable batteries. Additionally or alternatively, the power source 2106 may be a power connector or power cord that connects the electronic device 2100 to another power source, such as a wall outlet.

The memory 2108 may store electronic data that may be used by the electronic device 2100. For example, memory 2108 may store electrical data or content such as, for example, audio and video files, documents and applications, device settings and user preferences, timing signals, control signals, data structures or databases, image data, or focus settings. The memory 2108 may be configured as any type of memory. By way of example only, the memory 2108 may be implemented as random access memory, read-only memory, Flash memory, removable memory, other types of storage elements, or combinations of such devices.

The electronic device 2100 may also include a sensor system 2110, which in turn includes one or more sensors positioned substantially anywhere on the electronic device 2100. The sensor(s) may be configured to sense substantially any type of characteristic, such as but not limited to, pressure, light, touch, heat, movement, relative motion, biometric data, and so on. For example, the sensor(s) may include a heat sensor, a position sensor, a light or optical sensor, an accelerometer, a pressure transducer, a gyroscope, a magnetometer, a health monitoring sensor, and so on. Additionally, the one or more sensors may utilize any suitable sensing technology, including, but not limited to, capacitive, ultrasonic, resistive, optical, ultrasound, piezoelectric, and thermal sensing technology.

The I/O mechanism 2112 may transmit and/or receive data from a user or another electronic device. An I/O device may include a display, a touch sensing input surface such as a track pad, one or more buttons (e.g., a graphical user interface "home" button), one or more cameras (e.g., the cameras described with reference to FIG. 17A-17B, 18, or 19, or a camera including one or more of the stacked or non-stacked electromagnetic radiations sensors described herein), one or more microphones or speakers, one or more ports such as a microphone port, and/or a keyboard. Additionally or alternatively, an I/O device or port may transmit electronic signals via a communications network, such as a wireless and/or wired network connection. Examples of wireless and wired network connections include, but are not limited to, cellular, Wi-Fi, Bluetooth, IR, and Ethernet connections.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A sensor stack, comprising:
  a first electromagnetic radiation sensor having a high quantum efficiency for converting a first range of electromagnetic radiation wavelengths into a first set of electrical signals and comprising a first semiconductor substrate and a first array of pixels; and
  a second electromagnetic radiation sensor, positioned in a field of view of the first electromagnetic radiation sensor, comprising a second semiconductor substrate and a second array of pixels, and having,
    a high quantum efficiency for converting a second range of electromagnetic radiation wavelengths into a second set of electrical signals; and
    a low quantum efficiency for converting the first range of electromagnetic radiation wavelengths into the second set of electrical signals;
  a filter positioned between the first electromagnetic radiation sensor and the second electromagnetic radiation sensor,
  a pixel processing chip positioned below the first electromagnetic radiation sensor;
  a set of electrical connections between the first electromagnetic radiation sensor and the pixel processing chip;
  a set of through silicon vias (TSVs) extending through the first electromagnetic radiation sensor and the filter outside an entirety of a first imaging area defined by the first array of pixels and outside an entirety of a second imaging area defined by the second array of pixels, the set of TSVs being electrically coupled to the pixel processing chip;
  a first set of buses comprising one or more non-transparent, low-resistance buses located outside an entirety of the first and second imaging areas and electrically connected to the TSVs;
  a second set of buses comprising one or more IR-transparent, high-resistance buses electrically connected between the first set of buses and one or more pixels of the second array of pixels, wherein:
    the first range of electromagnetic radiation wavelengths does not overlap the second range of electromagnetic radiation wavelengths;
    the filter blocks light of the second range of electromagnetic radiation wavelengths;
    the second electromagnetic radiation sensor is at least partially transmissive to the first range of electromagnetic radiation wavelengths; and
    at least one bus of the second set of buses extends past a first pixel in the second array of pixels and is electrically connected to a second pixel in the second array of pixels.

2. The sensor stack of claim 1, wherein the set of TSVs is at least partially transmissive to the first range of electromagnetic radiation wavelengths.

3. The sensor stack of claim 1, wherein the set of TSVs extend at least partially through the second electromagnetic radiation sensor.

4. The sensor stack of claim 1, wherein:
  at least one of the first electromagnetic radiation sensor or the second electromagnetic radiation sensor comprises:
    a semiconductor substrate comprising pixel circuitry for an array of pixels;
    a photosensitive material deposited on the semiconductor substrate; and
    an array of electrical connections between the pixel circuitry for the array of pixels and the photosensitive material.

5. The sensor stack of claim 4, wherein the photosensitive material comprises a quantum dot film.

6. The sensor stack of claim 4, wherein the photosensitive material comprises an organic material.

7. The sensor stack of claim 4, wherein the photosensitive material comprises $Sb_2Se_{(3-x)}Te_{(x)}$, where $x \geq 0$.

8. The sensor stack of claim 4, wherein the semiconductor substrate is a silicon substrate.

9. The sensor stack of claim 4, wherein an electrical connection in the array of electrical connections comprises:
  a heterojunction photodiode formed between the semiconductor substrate and the photosensitive material.

10. The sensor stack of claim 4, wherein the semiconductor substrate, the photosensitive material, and the array of electrical connections are part of the first electromagnetic radiation sensor.

11. The sensor stack of claim 10, wherein the first electromagnetic radiation sensor is an infrared (IR) sensor.

12. The sensor stack of claim 11, wherein the IR sensor is an IR image sensor.

13. The sensor stack of claim 11, wherein the IR sensor is an IR depth sensor.

14. The sensor stack of claim 11, wherein the second electromagnetic radiation sensor is a visible light sensor.

15. The sensor stack of claim 14, wherein:
  the semiconductor substrate is the first semiconductor substrate;
  the pixel circuitry for the array of pixels is first pixel circuitry for a first array of IR pixels;
  the photosensitive material comprises a first photosensitive material;
  the array of electrical connections is a first array of electrical connections; and
  the visible light sensor comprises:
    second pixel circuitry for a second array of visible light pixels;

a second photosensitive material deposited on the second semiconductor substrate; and
a second array of electrical connections between the second pixel circuitry for the second array of visible light pixels and the second photosensitive material.

16. The sensor stack of claim 15, wherein:
the first photosensitive material comprises a first quantum dot film that has a high quantum efficiency for converting the first range of electromagnetic radiation wavelengths into the first set of electrical signals; and
the second photosensitive material comprises a second quantum dot film that has a high quantum efficiency for converting the second range of electromagnetic radiation wavelengths into the second set of electrical signals.

17. The sensor stack of claim 15, wherein an electrical connection in the second array of electrical connections comprises:
a second heterojunction photodiode formed between the second semiconductor substrate and the second photosensitive material.

18. The sensor stack of claim 14, wherein:
the semiconductor substrate is the first semiconductor substrate;
the pixel circuitry for the array of pixels is first pixel circuitry for a first array of IR pixels; and
the second semiconductor substrate comprises:
second pixel circuitry for a second array of visible light pixels; and
an array of photodiodes corresponding to the array of visible light pixels.

19. The sensor stack of claim 4, wherein:
the semiconductor substrate is the second semiconductor substrate, and
the photosensitive material and the array of electrical connections are part of the second electromagnetic radiation sensor.

20. The sensor stack of claim 4, wherein the second electromagnetic radiation sensor is a visible light sensor.

21. The sensor stack of claim 20, wherein the first electromagnetic radiation sensor is an infrared (IR) sensor.

22. The sensor stack of claim 21, wherein:
the semiconductor substrate is the first semiconductor substrate;
the pixel circuitry for the array of pixels is first pixel circuitry for a first array of visible light pixels; and
the second semiconductor substrate comprises:
second pixel circuitry for a second array of IR pixels; and
an array of photodiodes corresponding to the second array of IR pixels.

23. The sensor stack of claim 22, wherein the photosensitive material comprises a quantum dot film that has a high quantum efficiency for converting the second range of electromagnetic radiation wavelengths into the second set of electrical signals.

24. The sensor stack of claim 21, wherein:
the filter comprises a visible light blocking filter.

25. The sensor stack of claim 21, the array of electrical connections is at least partially transmissive to the first range of electromagnetic radiation wavelengths.

26. The sensor stack of claim 21, wherein the first semiconductor substrate is on the order of one micron.

27. The sensor stack of claim 21, wherein the IR sensor is an IR image sensor.

28. The sensor stack of claim 21, wherein the IR sensor is an IR depth sensor.

29. The sensor stack of claim 4, wherein the pixel circuitry comprises:
an in-pixel noise reduction circuit including a p-channel metal-oxide semiconductor (PMOS) transistor.

30. The sensor stack of claim 4, wherein the pixel circuitry comprises:
a pixel-column noise reduction circuit.

31. The sensor stack of claim 4, wherein the pixel circuitry comprises:
an in-column noise reduction circuit.

32. The sensor stack of claim 4, wherein:
the photosensitive material comprises a quantum dot film; and
the semiconductor substrate is a p-doped silicon substrate.

33. The sensor stack of claim 32, wherein the p-doped silicon substrate comprises an n-well.

34. The sensor stack of claim 33, further comprising:
a heterojunction formed between the p-doped silicon substrate and the quantum dot film.

35. The sensor stack of claim 34, further comprising:
a passivation layer between the p-doped silicon substrate and the quantum dot film.

36. The sensor stack of claim 34, further comprising:
an electrical isolation layer located in select locations between the p-doped silicon substrate and the quantum dot film, wherein the electrical isolation layer is configured to create a collection node area in the p-doped silicon substrate.

37. The sensor stack of claim 36, wherein the electrical isolation layer comprises a silicon dioxide layer.

38. The sensor stack of claim 36, further comprising:
an optically black material located in select locations below the electrical isolation layer, wherein the optically black material is configured to substantially absorb a range of predetermined wavelengths; and
a passivation layer located above the electrical isolation layer.

39. The sensor stack of claim 34, further comprising:
an optically black material located in select locations between the p-doped silicon substrate and the quantum dot film, wherein the optically black material is configured to substantially absorb a range of predetermined wavelengths.

40. The sensor stack of claim 39, wherein the optically black material comprises an absorbing polymer.

41. The sensor stack of claim 34, further comprising:
a heterojunction formed between the n-well and the quantum dot film.

42. The sensor stack of claim 41, wherein the quantum dot film is an intrinsic quantum dot film or lightly doped, and is configured to be fully depleted under bias.

43. The sensor stack of claim 41, further comprising:
a passivation layer between the n-well and the quantum dot film.

44. The sensor stack of claim 41, further comprising:
an electrical isolation layer located between the n-well and the quantum dot film, wherein the electrical isolation layer is configured to create a collection node area in the p-doped silicon substrate.

45. The sensor stack of claim 44, wherein the electrical isolation layer comprises a silicon dioxide layer.

46. The sensor stack of claim 44, further comprising:
an optically black material located in select locations between the n-well and the quantum dot film, wherein the optically black material is configured to substantially absorb a range of predetermined wavelengths.

47. The sensor stack of claim 46, wherein the optically black material comprises an absorbing polymer.

48. The sensor stack of claim 44, further comprising:
an optically black material located in select locations below the electrical isolation layer, wherein the optically black material is configured to substantially absorb a range of predetermined wavelengths; and
a passivation layer located above the electrical isolation layer.

49. The sensor stack of claim 33, wherein the quantum dot film is an intrinsic quantum dot film.

50. The sensor stack of claim 33, wherein the quantum dot film is a lightly doped quantum dot film, wherein the lightly doped quantum dot film is fully depleted when a bias is applied.

51. A sensor stack, comprising:
a first electromagnetic radiation sensor having a high quantum efficiency for converting a first range of electromagnetic radiation wavelengths into a first set of electrical signals and comprising a first semiconductor substrate; and
a second electromagnetic radiation sensor, positioned in a field of view of the first electromagnetic radiation sensor, comprising:
a second semiconductor substrate;
an array of pixels that comprises a set of pixel groups;
a set of transparent, high-resistance buses connecting individual pixels of the sets of pixel groups to a set of non-transparent, low-resistance buses; and
the set of non-transparent, low-resistance buses connecting the set of transparent, high-resistance buses to a set of through silicon vias (TSVs), the set of TSVs extending through the first electromagnetic radiation sensor outside an entirety of a first imaging area defined by the first electromagnetic radiation sensor and outside an entirety of a projection of a second imaging area defined by the second electromagnetic radiation sensor; wherein the second electromagnetic radiation sensor has:
a high quantum efficiency for converting a second range of electromagnetic radiation wavelengths into a second set of electrical signals; and
a low quantum efficiency for converting the first range of electromagnetic radiation wavelengths into the second set of electrical signals; and
a filter positioned between the first electromagnetic radiation sensor and the second electromagnetic radiation sensor,
wherein:
the first range of electromagnetic radiation wavelengths does not overlap the second range of electromagnetic radiation wavelengths;
the filter blocks light of the second range of electromagnetic radiation wavelengths;
the second electromagnetic radiation sensor is at least partially transmissive to the first range of electromagnetic radiation wavelengths; and
at least one bus in the set of non-transparent transparent, high-resistance buses extends past a first pixel in the array of pixels and is electrically connected to a second pixel in the array of pixels.

52. The sensor stack of claim 51, wherein the first electromagnetic radiation sensor is an infrared (IR) sensor.

53. The sensor stack of claim 52, wherein the second electromagnetic radiation sensor is a visible light sensor.

* * * * *